United States Patent
Starovoitov et al.

(10) Patent No.: US 7,924,590 B1
(45) Date of Patent: Apr. 12, 2011

(54) COMPILING REGULAR EXPRESSIONS FOR PROGRAMMABLE CONTENT ADDRESSABLE MEMORY DEVICES

(75) Inventors: Alexei Starovoitov, Los Gatos, CA (US); Maheshwaran Srinivasan, Sunnyvale, CA (US); Varadarajan Srinivasan, Los Altos Hills, CA (US); Sandeep Khanna, Los Altos, CA (US); Sachin Joshi, Fremont, CA (US); Mark Birman, Los Altos, CA (US)

(73) Assignee: NetLogic Microsystems, Inc., Santa Clara, CA (US)

( * ) Notice: Subject to any disclaimer, the term of this patent is extended or adjusted under 35 U.S.C. 154(b) by 0 days.

(21) Appl. No.: 12/844,235

(22) Filed: Jul. 27, 2010

Related U.S. Application Data

(63) Continuation-in-part of application No. 12/538,852, filed on Aug. 10, 2009, now Pat. No. 7,872,890.

(51) Int. Cl.
*G11C 15/00* (2006.01)

(52) U.S. Cl. ................... 365/49.17; 365/49.16

(58) Field of Classification Search ................ 365/49.1, 365/49.17, 49.18
See application file for complete search history.

(56) References Cited

U.S. PATENT DOCUMENTS

| | | |
|---|---|---|
| 5,278,981 A | 1/1994 | Kawaguchi et al. |
| 5,440,715 A | 8/1995 | Wyland |
| 5,452,451 A | 9/1995 | Akizawa et al. |
| 5,497,488 A | 3/1996 | Akizawa et al. |
| 5,712,971 A | 1/1998 | Stanfill et al. |
| 6,246,601 B1 | 6/2001 | Pereira |
| 6,249,467 B1 | 6/2001 | Pereira et al. |
| 6,252,789 B1 | 6/2001 | Pereira et al. |
| 6,275,426 B1 | 8/2001 | Srinivasan et al. |
| 6,521,994 B1 | 2/2003 | Huse et al. |
| 6,560,670 B1 | 5/2003 | Ichiriu |
| 6,751,755 B1 | 6/2004 | Sywyk et al. |
| 6,785,677 B1 | 8/2004 | Fritchman |
| 6,865,098 B1 | 3/2005 | Ichiriu et al. |
| 6,892,237 B1 | 5/2005 | Gai et al. |
| 6,901,000 B1 * | 5/2005 | Ichiriu et al. ............... 365/49.17 |
| 7,069,386 B2 | 6/2006 | Stefan et al. |
| 7,134,143 B2 | 11/2006 | Stellenberg et al. |
| 7,225,188 B1 | 5/2007 | Gai et al. |
| 7,353,332 B2 | 4/2008 | Miller et al. |
| 7,529,746 B2 | 5/2009 | Ichiriu et al. ...................... 707/5 |
| 7,539,031 B2 | 5/2009 | Ninan et al. .................. 365/49.1 |
| 7,539,032 B2 | 5/2009 | Ichiriu et al. ................. 365/49.1 |
| 7,624,105 B2 | 11/2009 | Ichiriu et al. ...................... 707/4 |

(Continued)

OTHER PUBLICATIONS

A versatile Data String-Search VLSI; Hirata et al.; IEEE Journal of Solid-State Circuits, vol. 23, No. 2, Apr. 1988, 7 pgs.

(Continued)

*Primary Examiner* — Huan Hoang
*Assistant Examiner* — Jason Lappas
(74) *Attorney, Agent, or Firm* — Mahamedi Paradice Kreisman LLP; William L. Paradice, III

(57) ABSTRACT

A content search system includes CAM device, a compiler, and an image loader. The CAM device, which includes a plurality of rows of CAM cells and a number of counter circuits selectively interconnected by a programmable interconnect structure (PRS), performs regular expression search operations. The compiler selectively converts the regular expression into a number of various bit groups, and the image loader loads corresponding bit groups into the CAM cells, into a number of memory elements that control configuration of the PRS, and into the counter circuits.

30 Claims, 33 Drawing Sheets

U.S. PATENT DOCUMENTS

| | | | |
|---|---|---|---|
| 7,643,353 | B1 | 1/2010 | Srinivasan et al. |
| 7,644,080 | B2 | 1/2010 | Mammen et al. .............. 707/6 |
| 7,656,716 | B1 | 2/2010 | Srinivasan et al. |
| 7,660,140 | B1 | 2/2010 | Joshi et al. |
| 7,787,275 | B1 | 8/2010 | Birman et al. .............. 365/49.1 |
| 7,826,242 | B2 | 11/2010 | Joshi et al. .............. 365/49.17 |
| 2004/0177319 | A1 | 9/2004 | Horn |
| 2006/0215432 | A1 | 9/2006 | Wickeraad et al. |
| 2008/0212581 | A1 | 9/2008 | Miller et al. .............. 370/389 |

OTHER PUBLICATIONS

Efficient String Matching: An Aid to Bibliographic Search; Programming Techniques; A. Aho and M. Corasick; Bell Laboratories; 1975, 8 pgs.

Fast Routing Table Lookup Using CAMs; McAuley et al.; Morristown, NJ, USA; 1993; 10 pgs.

Gigabit Rate Packet Pattern-Matching Using TCAM; Fang Yu, Randy Katcz EEEC Dept. UC Berkeley, T.V. Lakshman, Bell Laboratories; date at least earlier than Jun. 3, 2008; 10 pgs.

High Speed Pattern Matching for Network IDS/IPS; Alicherry et al.; Lucent Bell Laboratories; IEEE, 2006, 10 pgs.

Non-Final Office Action Sep. 10, 2010 for U.S. Appl. No. 12/352,528, 17 pages.

Notice of Allowance Sep. 8, 2010 for U.S. Appl. No. 12/619,607, 14 pages.

Notice of Allowance Sep. 7, 2010 for U.S. Appl. No. 12/617,607, 13 pages.

Notice of Allowance Nov. 19, 2009 for U.S. Appl. No. 12/341,754, 15 pages.

Notice of Allowance Nov. 3, 2009 for U.S. Appl. No. 12/131,992, 12 pages.

Small Forwarding Tables for Fast Routing Lookups; Degermark et al.; Lulea University of Technology; Lulea, Sweden; 1997; 12 pgs.

\* cited by examiner $R_A = a(bc|de)\{50\}f$ $R_B = ab\{n\}c$ $R_C = a.\{0,n\}b$ $R_D = a.\{n,\}b$ $R_E = a.\{n,\}?b$ $R_H = a.+b$    MML=10

$R_l = (b|k)[a]\{3\}c$

REG1 = "ab(c|d)" = "abc|abd"

Row 1 →
Row 2 →
Row 3 →
Row 4 →

REG1 = "ab(c|d)" = "abc|abd"

Row 1 →
Row 2 →
Row 3 →
Row 4 →
Row 5 →
Row 6 →

| Parser Optimization Pass | Original regex | Optimized regex |
|---|---|---|
| jnpr normalization | \x616263\xd\[ef\] | ^abcd[Ee][Ff]$ |
| mid-level alternation split | ab(cd\|efg)h | abcdh\|abefgh |
| reroll | abbbbbcd | ab{5}cd |
| cleanup | a(b(c(de{1}))) | abcde |
| propagate '*' | (...\|R+\|...)* | (...\|R*\|...)* |
| propagate '*' | (...\|R{0,.}\|...)* | (...\|R*\|...)* |
| simplify quantifiers | (R{a,b}){c,d} | R{ac,bd} |
| simplify quantifiers | (...\|R*\|...){0,N} | (...\|R+\|...){0,N} |
| simplify quantifiers | (...\|R?\|...)* | (...\|R\|...)* |
| propagate '*' + simplify + cleanup | a(((b\|c?){5,6}\|d){3,4}\|e+\|f)+g | a(b\|c\|d\|e\|f)*g |

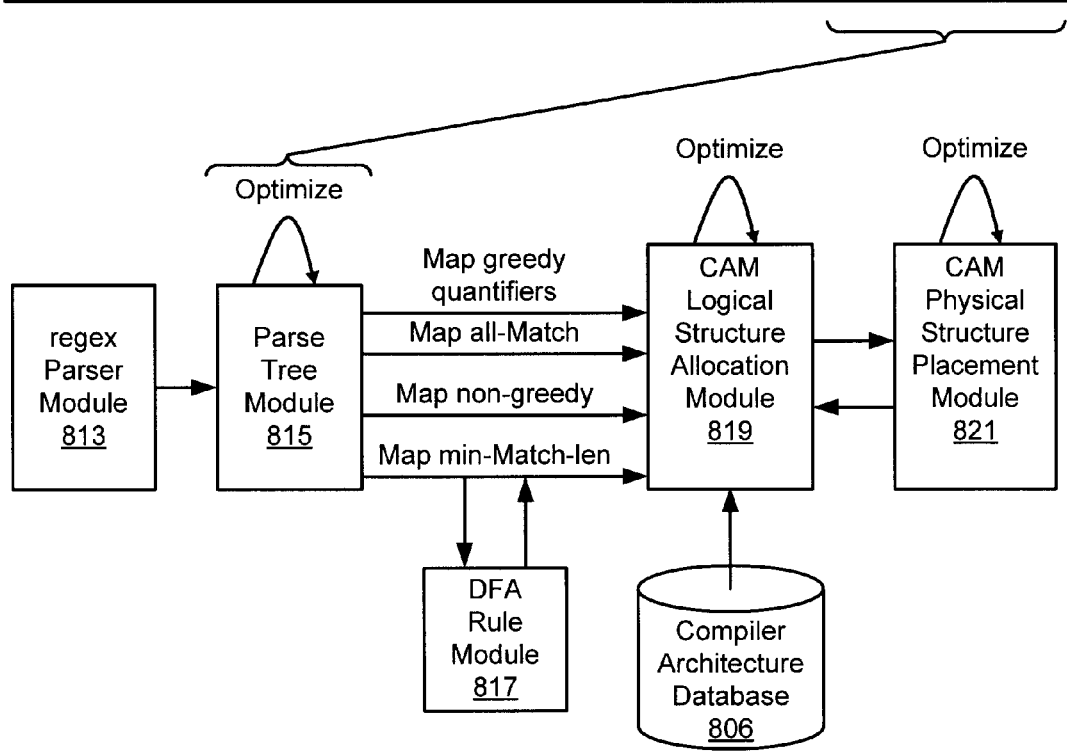

FIG. 9A

| Graph Pass | Graph Transformation |
| --- | --- |
| remove epsilon transitions | convert e NFA to e-free NFA |
| estimate Match length | determine the range (min, max) of a Match, Let HW report Match length when min=max |
| unroll | a{0,5} into (\|a\|a(a\|a(a\|a(a\|aa))) |
| top- level alternation split | single rule: abcdh\|abefgh into rule1: abcdh  rule2: abefgh |
| hub merge | merge hubs that we have the same set of Output TCAMs |
| split counter hubs | split hub that driver reset line of some counter and activates a tcam that drives another reset line |
| min Match length mapping for 2 killer tracks | a.*bc* into a.*(b\|bc*c) |
| non-greedy mapping | remove regex suffix that Matches 'optionally' Ex: abcd?e*(fg)? into abc |
| detect simple overlap | allows abcd{50} to use counter |

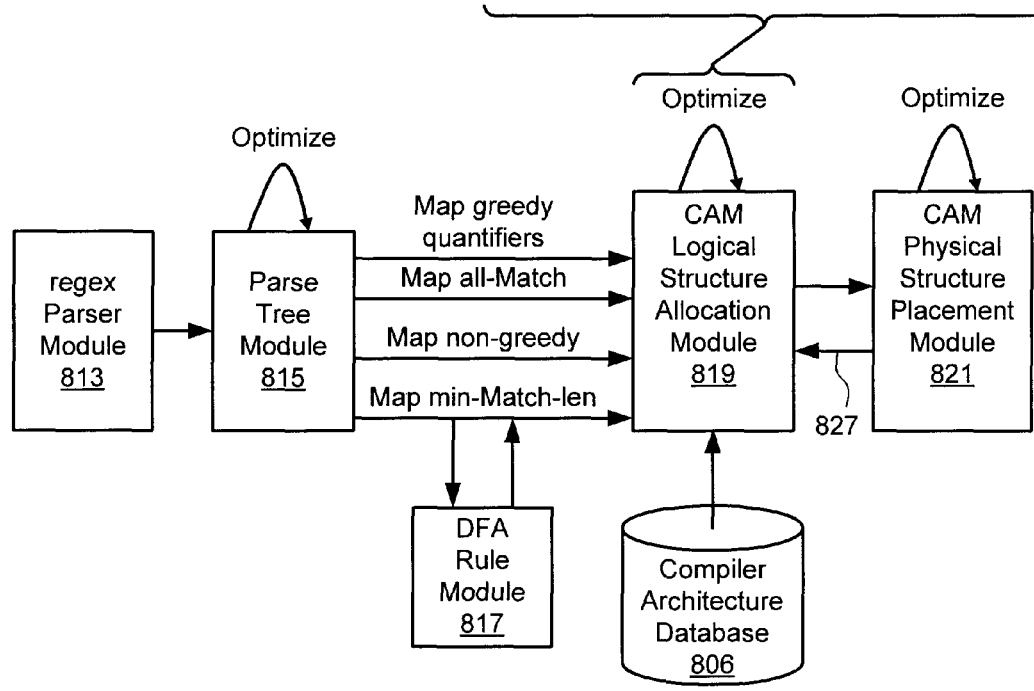

COMPILING REGULAR EXPRESSIONS FOR PROGRAMMABLE CONTENT ADDRESSABLE MEMORY DEVICES

CROSS-REFERENCE TO RELATED APPLICATIONS

This application is a continuation-in-part of and claims the benefit under 35 USC 120 of the co-pending and commonly owned U.S. application Ser. No. 12/538,852 entitled "Counter Circuit For Regular Expression Search Engines" filed on Aug. 10, 2009, which in turn claims the benefit under 35 USC 119(e) of the commonly owned U.S. Provisional Application No. 61/087,581 entitled "Counter Circuit For Regular Expression Search Engines" filed on Aug. 8, 2008, both of which are incorporated by reference herein.

This application is also a continuation-in-part of and claims the benefit under 35 USC 120 of the co-pending and commonly owned U.S. application Ser. No. 12/617,369 entitled "Content Addressable Memory Having Programmable Interconnect Structure" filed on Nov. 12, 2009, which is a divisional of commonly owned U.S. application Ser. No. 12/131,992 entitled "Content Addressable Memory Having Programmable Interconnect Structure" filed on Jun. 3, 2008 (now issued as U.S. Pat. No. 7,643,353), which in turn claims the benefit under 35 USC 119(e) of the commonly owned U.S. Provisional Application No. 60/982,677 entitled "Content Addressable Memory Having Programmable Interconnect Structure" filed on Oct. 25, 2007, all of which are incorporated by reference herein.

TECHNICAL FIELD

The present invention relates generally to content addressable memory (CAM) devices, and more particularly to techniques for programming CAM devices having programmable counter circuits and programmable interconnect structures to implement regular expression search operations.

BACKGROUND OF RELATED ART

Regular expression search operations are employed in various applications including, for example, intrusion detection systems (IDS), virus protections, policy-based routing functions, internet and text search operations, document comparisons, and so on. A regular expression can simply be a word, a phrase or a string of characters. For example, a regular expression including the string "gauss" would match data containing gauss, gaussian, degauss, etc. More complex regular expressions include metacharacters that provide certain rules for performing the match. Some common metacharacters are the wildcard ".", the alternation symbol "|', and the character class symbol "[ ]." Regular expressions can also include quantifiers such as "*" to match 0 or more times, "+" to match 1 or more times, "?" to match 0 or 1 times, {n} to match exactly n times, {n,} to match at least n times, and {n,m} to match at least n times but no more than m times. For example, the regular expression "a.{2}b" will match any input string that includes the character "a" followed exactly 2 instances of any character followed by the character "b" including, for example, the input strings "abbb," adgb," "a7yb," "aaab," and so on.

Traditionally, regular expression searches have been performed using software programs executed by one or more processors, for example, associated with a network search engine. However, as both the number and complexity of regular expressions increase for applications such as intrusion detection systems, software solutions are less able to achieve desired search speeds and throughput. As a result, hardware solutions such as ternary content addressable memory (TCAM) based search engines are being developed that can implement and perform regular expression search operations at faster speeds than software solutions typically allow.

To program a hardware-based search engine to implement regular expression search operations, a compiler is needed to translate the regular expression into bit groups that can be loaded into various programmable circuits of the search engine. Indeed, there is a need for compiling a human-readable architecture-independent regular expression into computer-readable architecture-dependent bit groups for controlling CAM-based regular expression search engines.

BRIEF DESCRIPTION OF THE DRAWINGS

The present embodiments are illustrated by way of example and not intended to be limited by the figures of the accompanying drawings, where:

FIG. 9A depicts several regular expressions and possible compiler-implemented optimizations in accordance with present embodiments;

FIG. 9B depicts several compiler-implemented optimizations for regular expression characteristics, including optimizations embodied as compiler passes, in accordance with present embodiments;

Like reference numerals refer to corresponding parts throughout the drawing figures.

DETAILED DESCRIPTION

Figure 1:
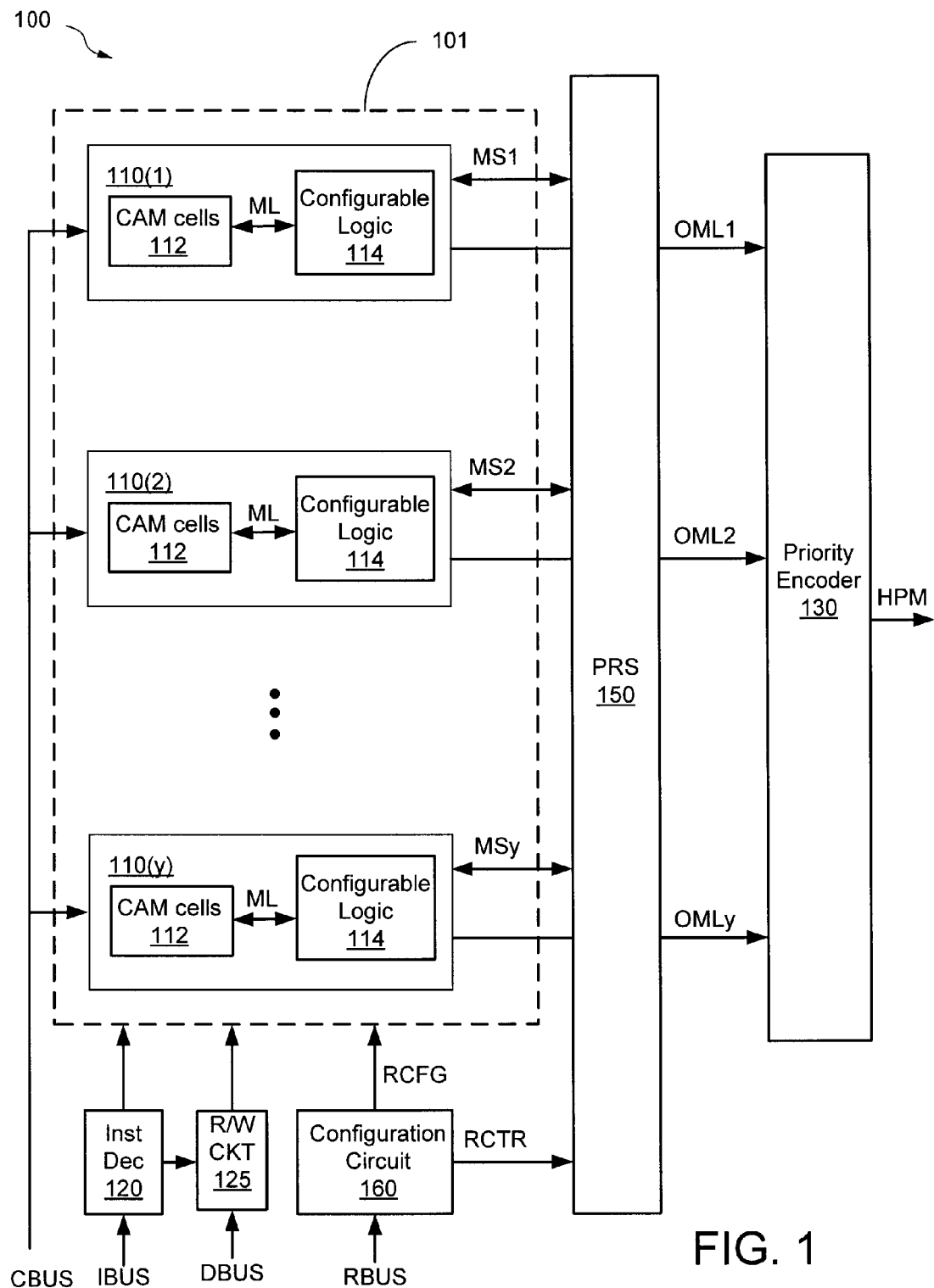
FIG. 1 shows a simplified block diagram of a content addressable memory (CAM) device having a programmable interconnect structure (PRS) connected to CAM rows in accordance with some embodiments.

In the following description, numerous specific details are set forth such as examples of specific components, circuits, software and processes to provide a thorough understanding of the present invention. In the following description, for purposes of explanation, specific nomenclature is set forth to provide a thorough understanding of the present invention. However, it will be apparent to one skilled in the art that these specific details may not be required to practice the present invention. In other instances, well-known compiler processes, and well-known circuits and devices are shown in block diagram form to avoid obscuring the present invention unnecessarily. It should be noted that the steps and operations (whether hardware-oriented operations or software-oriented operations) discussed herein (e.g., the loading of registers) can be performed either synchronously or asynchronously. The term "coupled" as used herein means connected directly to or connected through one or more intervening components or circuits. Any of the signals provided over various buses described herein may be time multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of myriad physical or logical mechanisms for communication between components. Additionally, the prefix symbol "/" or the suffix "B" attached to signal names indicates that the signal is an active low signal. Each of the active low signals may be changed to active high signals as generally known in the art.

A search engine and an associated compiler are disclosed herein. For simplicity, compiling circuits and techniques are described below in the context of various exemplary CAM-based search engines. However, it is to be understood that the present embodiments are equally applicable to CAM devices having other configurations and architectures, as well as to other types of search engines (e.g., SRAM-based search engines, FPGA-based search engines, and processors executing software modules) that operate according to various search techniques (e.g., binary tree searches, DFA-based searches, and NFA-based searches). In accordance with present embodiments, compilers are configured to translate regular expressions to be used in search operations into a format that is optimized for the specific architectural characteristics of the associated search engine, thereby improving the efficiency with which the search engine can store data embodying the regular expression and maximizing search speeds.

For some embodiments, the search engine includes one or more counter circuits embedded in a content addressable memory (CAM) device having a programmable interconnect structure (PRS) that can be configured to selectively connect any number of the counter circuits and rows of the CAM device together to implement search operations for most regular expressions. The PRS allows data words spanning multiple CAM rows to be stored in any available CAM rows in the array, without regard to their physical locations relative to one another. The PRS also allows the match signal from any CAM row to be simultaneously routed as an input signal to any number of the CAM rows and/or to the counter circuits, and allows the output signals of any counter circuit to be simultaneously routed as input signals to any number of the CAM rows and/or counter circuits. In this manner, the CAM device can store most regular expressions in their unrolled form, thereby minimizing the number of CAM rows required to store the regular expressions.

For such embodiments, the compiler circuits and techniques disclosed herein efficiently translate a regular expression into a plurality of bit groups that, in turn, can be stored in various programmable elements (e.g., the CAM cells, the counter circuits, the PRS) of the associated CAM-based search engine. More specifically, various techniques for compiling regular expressions having logical operators in their unrolled form and for compiling regular expressions having logical operators in other syntactical forms are discussed in detail below. For some embodiments, the compiler circuits can be programmed to re-formulate the regular expressions into a plurality of bit groups in a manner that optimizes the physically available resources of the associated search engine. Indeed, the compiler circuits disclosed herein can translate regular expressions into architecture-specific bit groups (e.g., including architecture-specific bit groups representing quantifiers) for loading into the various programmable elements of an associated CAM-based search engine.

FIG. 1 is a functional block diagram of a CAM device 100 according to some embodiments. CAM device 100 includes a CAM array 101, an instruction decoder 120, a read/write circuit 125, a priority encoder 130, a programmable interconnect structure (PRS) 150, and a configuration circuit 160. Other well-known components and control signals, for example, such as an address decoder, comparand register, and clock signals, are not shown for simplicity.

CAM array 101 includes a plurality of rows 110(1)-110(y), each having a number of CAM cells 112 and a configurable logic circuit 114. Each CAM row 110 is coupled to a comparand bus CBUS via a well-known comparand register (not shown for simplicity), and is coupled to the PRS 150 via match signal (MS) lines and to the priority encoder 130 via output match lines (OML). CAM cells 112 can be any suitable type of CAM cells including, for example, binary CAM cells, ternary CAM cells, and/or quaternary CAM cells. For each CAM row 110, the CAM cells 112 are coupled to the configurable logic circuit 114 via match lines, which can provide match signals from CAM cells 112 to configurable logic circuit 114, and for some embodiments can also provide match signals from configurable logic circuit 114 as enable signals to CAM cells 112. The configurable logic circuits 114 can be programmed or configured using row configuration data (RCFG) to selectively route match signals to priority encoder 130 via the output match lines (OML), to route the match signals to the PRS 150 via the MS lines, and/or to selectively combine the row match signals with match signals from one or more other CAM rows provided on the MS lines by the PRS 150. For some embodiments, configurable logic circuits 114 can be selectively configured to perform other logical functions on the match signals provided from the current row and on the match signals provided from other rows via the PRS 150 and the IMS lines such as, for example, logical OR, exclusive OR (XOR), and logical inversion (NOT) functions.

Priority encoder 130, which is well-known, has inputs coupled to the output match lines (OML) from the CAM rows 110, and has an output to generate the index of the highest priority matching CAM row 110 (e.g., the HPM index). Although not shown for simplicity, each row of CAM cells 112 can include a validity bit (V-bit) that indicates whether valid data is stored in the CAM row, and the V-bits can be provided to the priority encoder 130 to determine the next free address in the CAM array for storing new data.

Instruction decoder 120 decodes instructions provided on the instruction bus IBUS, and provides control signals to CAM cells 112 and to read/write circuit 125 that control read, write, and compare operations in CAM array 101. For other embodiments, instruction decoder 120 can decode the instructions and provide configuration information to configurable logic circuits 114.

Read/write circuit 125, which is well-known, controls read and write operations for CAM array 101. For example, during write operations, data is provided to read/write circuit 125 via a data bus (DBUS), or alternately from CBUS, and in response to control signals provided by instruction decoder 120, read/write circuit 125 writes the data into the CAM cells 112 of the row or rows selected for the write operation. During read operations, data is output in a well-known manner from one or more selected CAM rows 110 to read/write circuit 125, which in turn provides the data onto DBUS.

The PRS 150 includes a plurality of signal routing lines (not shown individually in FIG. 1 for simplicity) extending across the rows 110 of CAM cells 112 and programmably connected to the match signal (MS) lines in each CAM row 110 in response to routing control signals (RCTR). As explained in more detail below, the RCTR signals control the configuration of a plurality of programmable switch matrixes (not shown in FIG. 1 for simplicity) that selectively connect the MS lines of the various CAM rows 110 to the signal routing lines within the PRS 150. The PRS 150 can be implemented using any suitable circuits and/or logic (e.g., switch matrixes, crossbar circuits, programmable switches, and so on) that selectively routes the row match signals from each CAM row to any number of arbitrarily selected CAM rows (e.g., regardless of whether the selected CAM rows are adjacent to one another) at the same time.

Configuration circuit 160 includes an input coupled to a regular expression bus (RBUS), first outputs coupled to CAM array 101, and second outputs coupled to the PRS 150. For some embodiments, configuration information (e.g., which can embody one or more regular expressions) can be provided to configuration circuit 160 via RBUS, and in response thereto configuration circuit 160 provides the row configuration information (RCFG) to configurable logic circuits 114 and provides the routing control signals (RCTR) to the PRS 150. For one embodiment, configuration circuit 160 includes a configuration memory (not shown for simplicity in FIG. 1) for storing RCFG and RCTR information received from RBUS. Together, the RCFG and RCTR information form configuration data that can be used to program the CAM device 100 to implement search operations for one or more regular expressions, as described below.

For other embodiments, RCFG can be provided to row configurable logic circuits 114 using other techniques. For example, for another embodiment, RCFG can be provided to configurable logic circuits 114 using the instruction decoder 120 and/or stored in memory elements (not shown for simplicity) within the CAM rows 110. Similarly, for other embodiments, the RCTR signals can be provided to the PRS 150 using other techniques. For example, for another embodiment, the RCTR signals can be provided to the PRS using the instruction decoder 120 and/or stored in memory elements (not shown for simplicity) within the PRS 150.

In accordance with present embodiments, the PRS 150 can be selectively configured to route the match signals from any CAM row 110 as an input match signal to any number of other arbitrarily selected or located CAM rows 110 at the same time, regardless of whether the other selected CAM rows are contiguous with one another. Further, for some embodiments, the PRS 150 can be configured to route match signals from one CAM row as the input match signal to the same row. The input match signals can be used as row enable or trigger signals to selectively enable the CAM rows for subsequent compare operations, and can therefore be used to logically connect a number of arbitrarily selected CAM rows together.

As described below, CAM devices employing CAM arrays configured in accordance with present embodiments provide numerous functional and performance advantages over conventional CAM devices.

First, because the PRS 150 can route the match signals from any CAM row 110 in CAM array 101 to any number of arbitrarily selected CAM rows 110 in the array 101, a data word chain spanning a multiple number N of CAM rows can be stored in any available N CAM rows 110 of CAM array 101, even if none of the available CAM rows are contiguous or adjacent to each other, by configuring the PRS 150 to logically connect the available CAM rows together to form a data word chain. Thus, for example, if CAM array 101 of FIG. 1 includes 5 available but non-contiguous CAM rows 110, then the PRS 150 can be programmed to logically connect the 5 available CAM rows 110 into a chain that can store a data word chain spanning 5 CAM rows. In contrast, to store a new 5 data word chain in a prior CAM device such as disclosed in U.S. Pat. No. 6,252,789, a block of 5 available and contiguous CAM rows are needed. Thus, if there are 5 available but non-contiguous CAM rows in the CAM device of the '789 Patent, the new 5 data word chain can be stored therein only if the existing contents of the CAM array are re-arranged to create a block of 5 available contiguous CAM rows, which undesirably requires burdensome and time-consuming table management tools.

Second, by allowing match signals from one CAM row to be routed to any number of selected CAM rows (e.g., including the same CAM row) as input match signals at the same time, embodiments of the present invention can store many regular expressions using significantly fewer numbers of CAM rows than conventional CAM devices. More specifically, because the PRS 150 can simultaneously and independently route the match signals from any CAM row 110 to any number of other CAM rows 110 at the same time, embodiments of CAM device 100 can store a regular expression in its rolled format (e.g., its original form), for example, because each common portion of all the different strings that can match the regular expression can be stored in a corresponding single location (e.g., in one CAM row or one group of CAM rows), and their match signals can be simultaneously routed to multiple other locations that store other non-common portions of the possible matching strings. In contrast, storing a regular expression in CAM devices such as those disclosed in U.S. Pat. No. 6,252,789 requires unrolling the regular expression to generate all possible matching strings of the regular expression, and then storing each of the possible matching strings in a corresponding group of contiguous CAM rows.

Figure 7B:
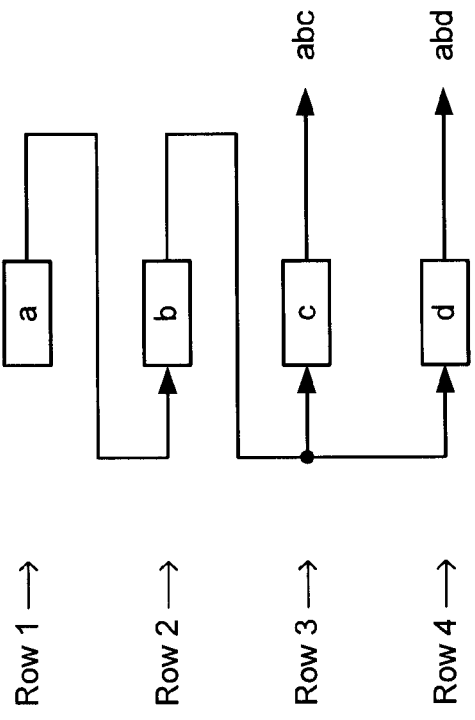
FIG. 7B depicts an exemplary CAM device configured in accordance with present embodiments to store REG1="ab(c|d)" using only 4 CAM rows.
Figure 7A:
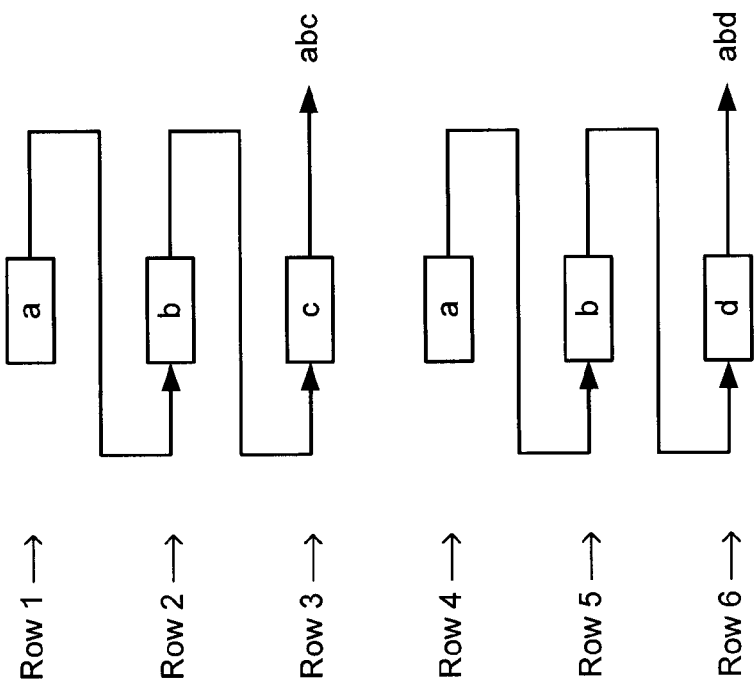
FIG. 7A depicts a prior art CAM device requiring 6 CAM rows to store the regular expression REG1="ab(c|d)"

For example, assuming each CAM row stores one 8-bit ASCII encoded character, the CAM device of the '789 Patent requires 6 CAM rows to store the regular expression REG1="ab(c|d)." More specifically, to store REG1="ab(c|d)" in the CAM device of the '789 Patent, REG1 is unrolled to generate the 2 possible matching strings "abs" and "abd," which are then stored as 2 separate data word chains each spanning 3 contiguous CAM rows, as depicted in FIG. 7A, where contiguous CAM rows 1-3 are cascade connected to form a first data word chain that stores the string "abs," and contiguous CAM rows 4-6 are cascade connected to form a second data chain that stores the string "abd."

In contrast, the dynamic configurability of PRS 150 allows CAM device 100 to store REG1="ab(c|d)" in its rolled format using only 4 CAM rows because the common portion "ab" of the two possible matching strings "abs" and "abd" can be stored in only one group of CAM rows and their match signals can be simultaneously routed to other CAM rows that store "c" and "d". For example, referring to FIG. 7B, the characters "a," "b," "c," and "d" can be stored in CAM rows 1-4, respectively, of CAM device 100, and the match signal of the common data word chain "ab" ending at row 2 can be simultaneously routed as input match signals to both CAM rows 3 and 4 so that CAM row 3 can detect a match with "abs" concurrently and independently of CAM row 4 detecting a match with "abd."

Figure 7D:
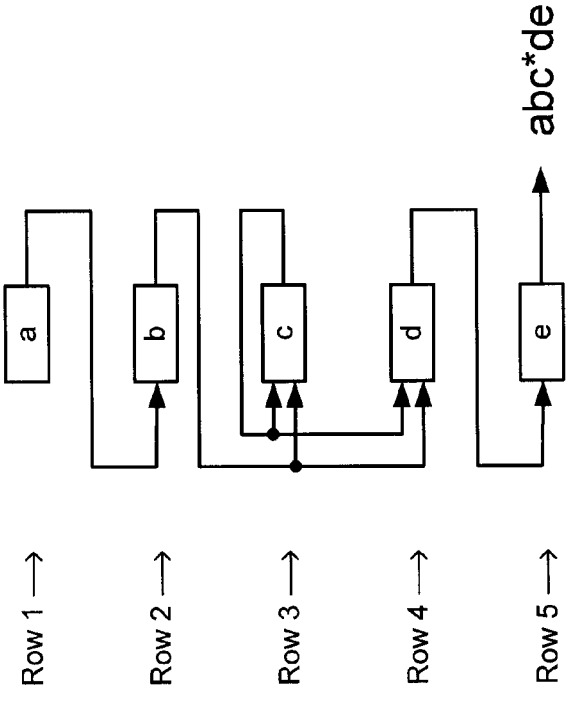
FIG. 7D depicts an exemplary CAM device configured in accordance with present embodiments to store the regular expression REG3="abs*de" using only 5 CAM rows.
Figure 7C:
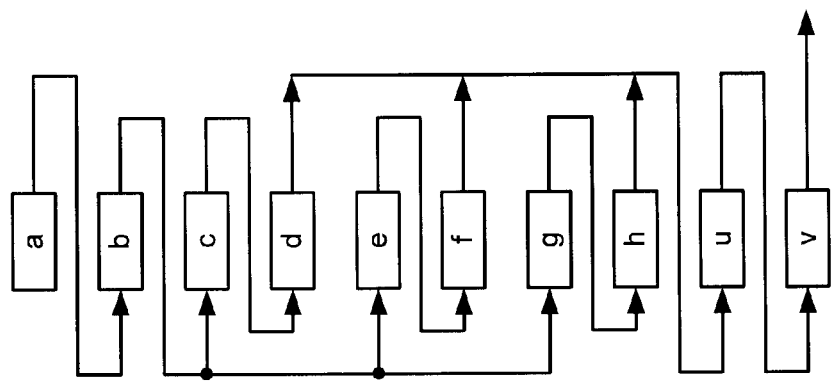
FIG. 7C depicts an exemplary CAM device configured in accordance with present embodiments to store the regular expression REG2="ab(cd|ef|gh)up" using only 10 CAM rows.

Note that as the number of possible matching strings of a regular expression increases, the reduction in memory area (e.g., the number of CAM rows) achieved by present embodiments also increases (e.g., as compared to the '789 patent). For example, the CAM device of the '789 Patent requires 18 CAM rows to store the regular expression REG2="ab(cd|ef|gh)up" because REG2 needs to be unrolled to generate all possible matching strings (i.e., S1="abcduv," S2="abefuv," and S3="abghuv"), which are then stored separately in 3 groups of 6 contiguous and sequentially connected CAM rows. However, because embodiments of CAM device 100 can selectively, simultaneously, and independently route the match signals from any CAM row to any number of other arbitrarily located CAM rows, REG2 does not need to be unrolled for storage in CAM device 100. Rather, each common portion of the possible matching strings of REG2 can be stored in only one location in the CAM array 101, and the PRS 150 can be programmed to route the match signals of the common portion to the other non-common portions at the same time according to the logical operators specified in REG2. In other words, the strings appearing between logical operators as expressed using the unrolled form of the regular expression can be stored in corresponding groups of CAM rows of the CAM device, and the PRS can be programmed to logically connect the groups of CAM rows according to the logical operators. In this manner, embodiments of CAM device 100 require only 10 CAM rows to store REG2="ab(cd|ef|gh)up," as depicted in FIG. 7C.

Further, the ability of the PRS 150 to selectively route the match signal from each CAM row 110 in CAM array 101 to itself and/or to any number of other arbitrarily selected CAM rows 110 at the same time allows embodiments of CAM device 100 to implement search operations for regular expressions that include quantifiers such as the Kleene star "*." The Kleene star denotes zero or more instances of the preceding character in the regular expression. For example, to match the regular expression REG3="abc*de," an input string must include zero or more instances of the character "c" appearing between the prefix string "ab" and the suffix string "de." Thus, while the input strings "abde," abcde," and "abccde" all match REG3="abc*de," an input string including thousands, millions, or even an infinite number of instances of "c" between the prefix "ab" and the suffix "de" will also match REG3="abc*de."

Regular expressions that include the Kleene star "*" can be efficiently stored in embodiments of CAM device 100 by configuring the PRS 150 to form a match signal loop for the Kleene character and to route the match signals of the prefix string and the Kleene character as an enable or trigger signal for matching the suffix string. For example, FIG. 7D depicts an embodiment of CAM device 100 configured to store and implement search operations for REG3="abc*de." The characters "a," "b," "c," "d," and "e" are stored in CAM rows 1-5, respectively, of CAM device 100. The PRS 150 is configured to route the match signal from "a" in row 1 as an input match or enable signal to "b" in row 2 to form the prefix string "ab," and to route the match signal from "d" in row 4 as an input match or enable signal to "e" in row 5 to form the suffix string "de." Further, the PRS 150 is configured to route the match signal from the prefix string "ab" as an input match or enable signal to both "c" and the suffix string "de" so that a matching prefix "ab" in the input string triggers a search for both the Kleene character "c" and the suffix string "de," and to route the match signal from "c" as an input match or enable signal to both itself and to the suffix string "de" so that a matching character "c" in the input string triggers a search for another occurrence of "c" and for the suffix string "de" at the same time. In this manner, after the embodiment of CAM device 100 depicted in FIG. 7D detects the prefix string "ab" in the input string, if the next input characters are "de" or any number of the character "c" followed by the characters "de," a match condition can be indicated. Thus, as depicted in FIG. 7D, embodiments of CAM device 100 can be configured to store and implement search operations for REG3="abc*de" using only 5 CAM rows 110 (e.g., where each CAM row 110 stores one character) by using the PRS 150 to simultaneously trigger multiple sub-searches in response to a prefix match (e.g., routing the "ab" match signal to "c" and "d") and to implement a search loop of infinite repetitions (e.g., routing the "c" match signal back to "c").

In contrast, conventional CAM devices (e.g., such as those disclosed in U.S. Pat. No. 6,252,789) cannot implement search operations for regular expressions that include the Kleene star "*" because of the infinite number of different input patterns that can generate a match condition. As discussed above, to store a regular expression in the '789 CAM device, the regular expression is unrolled to generate all possible matching strings, which are then stored in corresponding groups of rows in the CAM device. Thus, to store and implement search operations for REG3="abc*de" in the '789 CAM device, every pattern that includes zero or more instances of "c" between the prefix "ab" and the suffix "de" must be stored therein, which is impossible because there are an infinite number of different input strings that can match REG3="abc*de."

Figure 2:
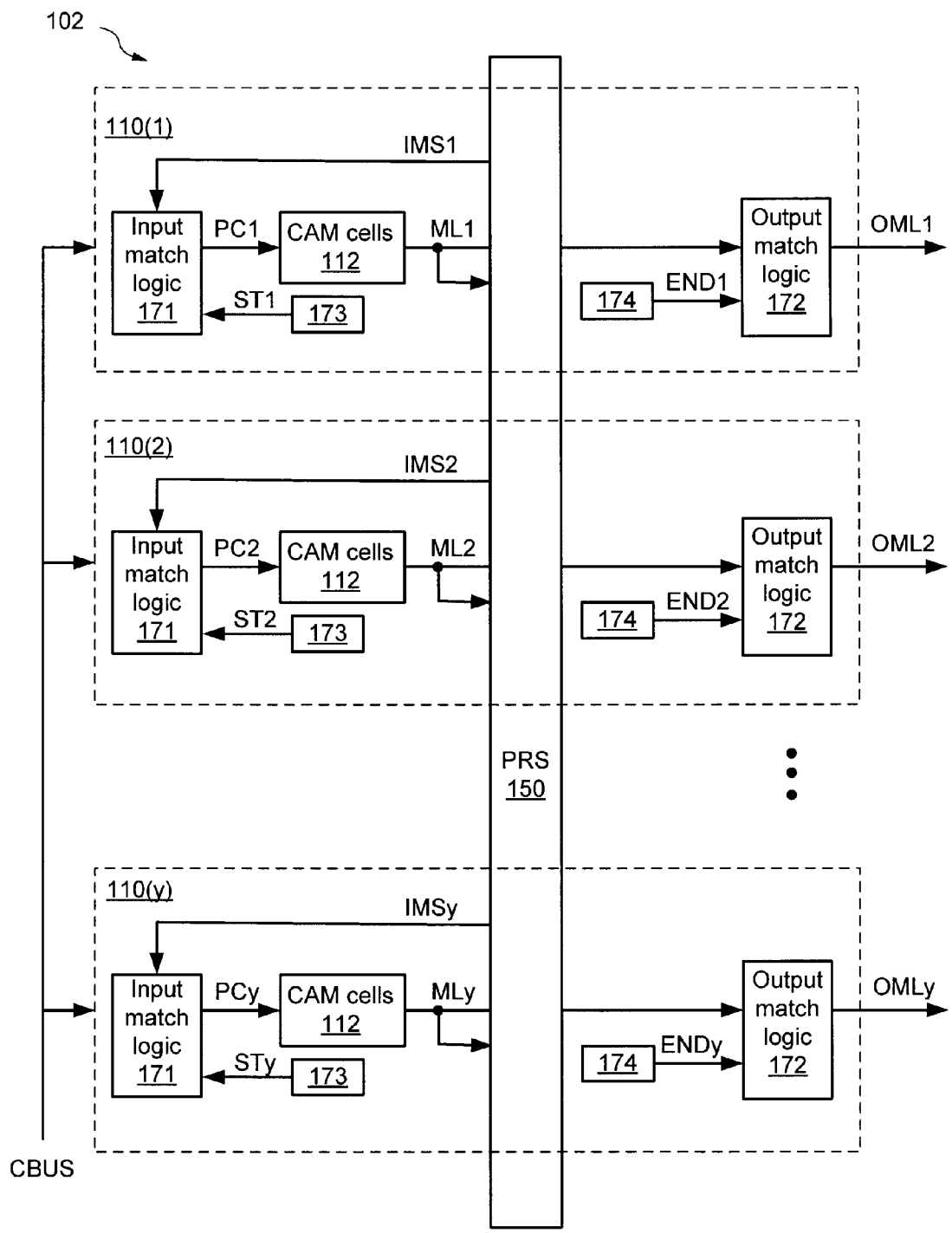
FIG. 2 shows a simplified block diagram of one embodiment of the CAM array of FIG. 1.

FIG. 2 shows a CAM array 102 that is one embodiment of CAM array 101 of FIG. 1. For the exemplary embodiment of FIG. 2, each CAM row 110 includes a number of CAM cells 112, input match logic 171, output match logic 172, and configuration memory cells 173-174. Each CAM row is selectively connected to the PRS 150, which as described above can route match signals from any CAM row to one or more arbitrarily selected CAM rows at the same time. Within each CAM row 110, the input match logic 171 includes a data input to receive match signals from the same or a number of other CAM rows 110 via the input match signal (IMS) lines, a control input to receive a start bit (ST) from configuration memory cell 173, and an output to provide a pre-charge signal PC to the CAM cells 112. Output match logic 172 includes a data input to receive match signals from the CAM cells 112 via the match lines ML during compare operations with input data, a control input to receive an end bit (END) from configuration memory cell 174, and an output coupled to priority encoder 130 via the output match line OML. Together, input match logic 171 and output match logic 172 form one embodiment of the configurable logic circuit 114 of FIG. 1.

The configuration memory cells 173-174 can be any suitable type of memory cells including, for example, an SRAM or DRAM cells, EEPROM cells, flash memory cells, fuses, and so on. Further, although depicted in FIG. 2 as being separate memory elements associated with corresponding CAM rows 110, for other embodiments, the memory cells 173-174 can be formed as an addressable array of configuration memory cells.

The start (ST) and end (END) bits for each row 110 in FIG. 2, which together represent the row configuration information (RCFG) for a corresponding CAM row of FIG. 1, control the logical operations and routing functions of the input match logic 171 and the output match logic 172, respectively, of the CAM row during compare operations. More specifically, the start bit (ST) indicates whether the data word stored in the corresponding CAM row is the first data word of a data word chain, and the end bit (END) indicates whether the data word stored in the corresponding CAM row is the last data word of a data word chain. The start bit and end bit can be further encoded, as shown below in Table 1, to indicate that the corresponding data word is a continuing data word or a default data word, where a continuing data word is an intermediate data word between the first and last data words in a data word chain that spans multiple CAM rows, and a default data word corresponds to a data word chain that has only one data word (and thus spans only one CAM row 110).

TABLE 1

| ST | END | Function |
| --- | --- | --- |
| 0 | 0 | continuing word |
| 0 | 1 | last word |
| 1 | 0 | first word |
| 1 | 1 | default word |

For some embodiments of CAM array 102 of FIG. 2, if the start bit ST of a row 110 is asserted, which indicates that the CAM row 110 stores the first data word in a chain, the asserted state of ST causes input match logic 171 to ignore any input match signals (e.g., received from the PRS 150 via the IMS line) and allows the match signal generated in response to a comparison between input data (e.g., an input character of the input string) and the data stored in the row's CAM cells 112 to be propagated as the output match signal for the row on the match line ML. Conversely, if ST of the row 110 is de-asserted, which indicates that the CAM row stores either an intermediate word or the last word in the data word chain, the de-asserted state of ST causes the row's input match circuit 171 to selectively enable compare operations between the input character and data stored in the row's CAM cells 112 in response to the input match signals received from the same and/or one or more other arbitrarily selected CAM rows (e.g. received from the PRS 150) to generate an output signal for the CAM row. In either case, the match signal on the row's match line is provided to both the PRS 150 and to the row's output match logic 172.

Further, if the end bit END of the CAM row 110 is asserted, which indicates that CAM row 110 stores the last data word in the chain, the asserted state of END causes the row's output match logic 172 to pass the row's match signal on its match line ML to the priority encoder 130 via its OML line. Conversely, if END for the CAM row 110 is de-asserted, which indicates that CAM row 110 does not store the last data word in the data word chain, the de-asserted state of END prevents the row's output match logic 172 from passing the row's match signal on ML to the priority encoder 130. The logic functions and output results provided by the CAM rows of FIG. 2 are summarized below in Table 2, where CMP indicates the results of a compare operation between an input character and data stored in the CAM cells 112 of the CAM row 110 and "*" indicates the logical AND function.

TABLE 2

| ST | END | ML | OML |
| --- | --- | --- | --- |
| 0 | 0 | IMS*CMP | 0 |
| 0 | 1 | IMS*CMP | IMS*CMP |

TABLE 2-continued

| ST | END | ML | OML |
|----|-----|-----|-----|
| 1  | 0   | CMP | 0   |
| 1  | 1   | CMP | CMP |

Thus, as described above, during search operations, input match logic 171 selectively enables CAM cells 112 for compare operations in response to ST and the input match signals provided on the IMS lines, and output match logic 172 selectively provides the row match signals from CAM cells 112 on ML to the priority encoder 130 via OML in response to END. As explained in more detail below, by selectively enabling the CAM row 110 in response to the IMS signals during compare operations, input match logic 171 can not only combine match signals from multiple CAM rows but can also minimize power consumption by pre-charging the match lines ML of only those CAM rows 110 that need to participate in a given compare operation while disabling all other CAM rows (e.g., that do not need to participate in the given compare operation).

Figure 3A:
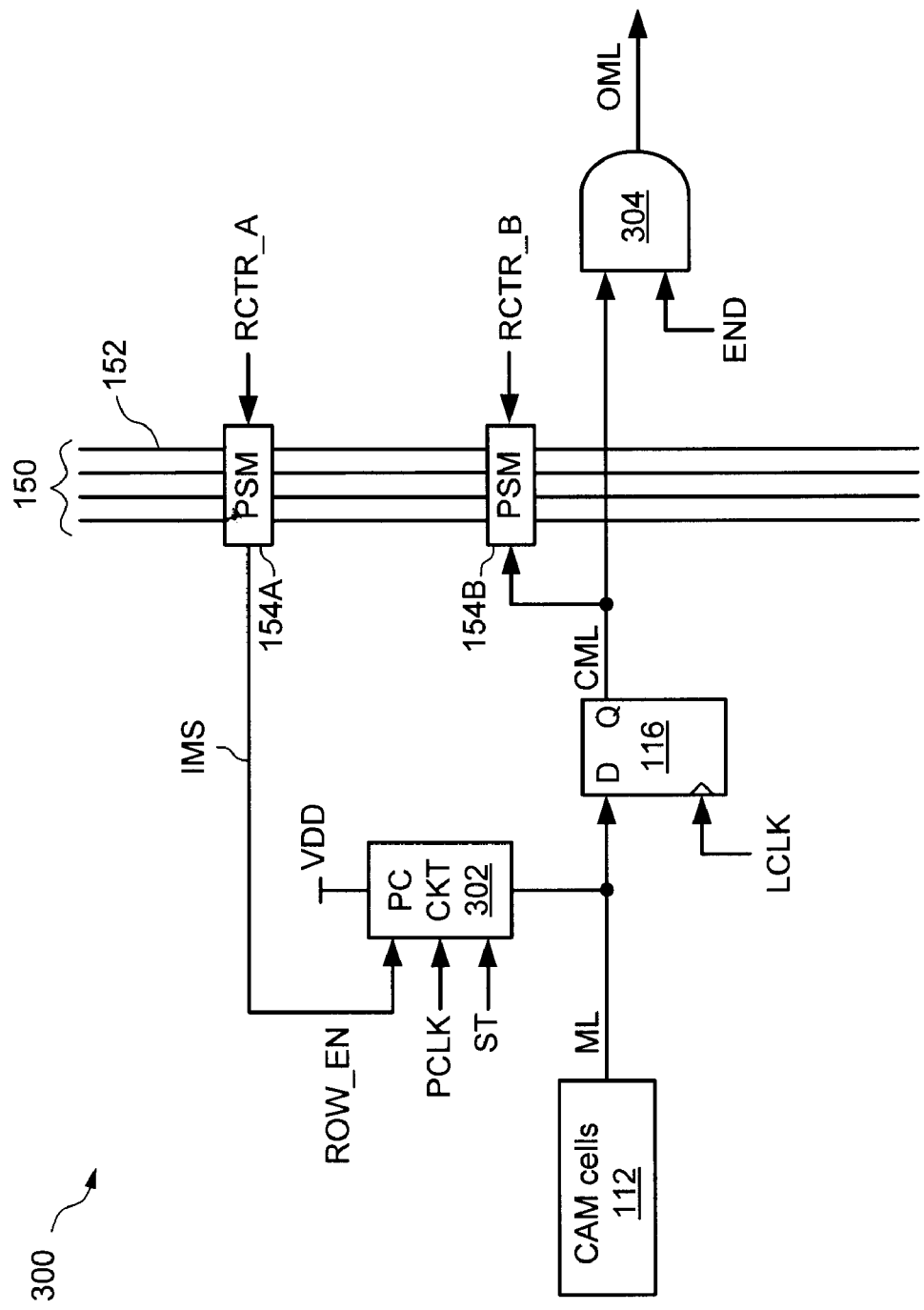
FIG. 3A shows a block diagram of one embodiment of the CAM rows of the CAM array of FIG. 2.

FIG. 3A shows a CAM row 300 that is one embodiment of CAM row 110 of CAM array 102 of FIG. 2. CAM row 300, which includes a number of CAM cells 112, a match signal latch 116, a match line pre-charge circuit (PC CKT) 302, and an AND gate 304, is selectively connected to PRS 150 via programmable switch matrixes (PSM) 154A-154B. CAM cells 112, which can be any suitable CAM cell for storing a data word and comparing the data word with a search key, can include binary CAM cells, ternary CAM cells, and/or quaternary CAM cells. CAM cells 112 receive a search key or comparand word from the comparand bus CBUS (not shown for simplicity in FIG. 3A), and are coupled to match line ML.

Latch 116 includes a data input (D) coupled to ML, a clock input "<" to receive a latch clock signal (LCLK), and an output (Q) to provide clocked match signals on the clocked match line (CML) in response to LCLK. Latch 116, which can be any suitable latch or register circuit, latches the current match signals from CAM cells 112 onto CML. Although not shown for simplicity in FIG. 3A, latch 116 also includes a terminal coupled to ground potential (VSS). The CML line is coupled to AND gate 304, and is also selectively connected to the signal routing lines 152 of PRS 150 via PSM 154B. AND gate 304 also includes a second input to receive the END bit for the row, and includes an output to provide the row output match signals to priority encoder 130 via the OML line. Thus, AND gate 304, which selectively forwards the match signal on CML to priority encoder 130 in response to END, is one embodiment of output match logic 172 of FIG. 2. Accordingly, if END is asserted (e.g., to logic high), AND gate 304 forwards to the match signals on CML to the priority encoder 130 via OML. Conversely, if END is de-asserted (e.g., to logic low), then AND gate 304 does not forward the match signals on CML to the priority encoder 130.

Match line pre-charge circuit 302 has a first power terminal coupled to VDD, a second power terminal coupled to ML, a first input to receive ST for the row, a second input to receive a pre-charge clock signal PCLK, and a third input to selectively receive match signals from another CAM row via PRS 150 on the IMS line as a row enable signal (ROW_EN). Match line pre-charge circuit 302, which is one embodiment of input match logic 171 of FIG. 2, can be any suitable circuit that selectively pre-charges ML upon assertion of PCLK in response to ROW_EN and ST, as explained in more detail below. Together, match line pre-charge circuit 302 and AND gate 304 of CAM row 300 form another embodiment of configurable logic circuit 114 of FIG. 1.

PRS 150 is shown in FIG. 3A to include four signal routing lines 152 that can be selectively connected to the row's IMS lines via PSM 154A and/or to the row's CML line via PSM 154B. PSM 154A includes a control terminal to receive RCTR_A, which controls which signal routing lines 152 of the PRS 150 are connected to which (if any) IMS lines of row 300. PSM 154B includes a control terminal to receive RCTR_B, which controls which signal routing lines 152 are connected to the CML line of row 300. Thus, the routing control signals RCTR_A and RCTR_B, which can be stored in the configuration circuit 160 (see also FIG. 1) or provided by the instruction decoder 120, control which match signals from other CAM rows are selected as IMS (e.g., as row enable signals) to ML pre-charge circuit 302 of CAM row 300, and also control whether row match signals generated on CML are provided to the PRS 150 for use as IMS signals by the same and/or one or more other arbitrarily selected CAM rows. In this manner, PRS 150 provides a programmable interconnect structure that can be dynamically configured to route match signals from any CAM row to itself and/or to one or more other arbitrarily selected CAM rows at the same time and independently of each other.

A general operation of the pre-charge circuit 302 is as follows. If ST is asserted to logic high, which indicates that row 300 of CAM cells 112 stores a first word in a data word chain, pre-charge circuit 302 turns on and, upon assertion of PCLK, pulls ML high toward VDD, thereby pre-charging ML and enabling the CAM row 300 for comparison operations, irrespective of the state of the row enable signal (ROW_EN) on the IMS line. Once ML is pre-charged, the data stored in CAM cells 112 of row 300 can be compared with input data (e.g., a search key), and the match signals are provided on ML.

If ST is de-asserted to logic low, which indicates that row 300 of CAM cells 112 stores either an intermediate word or the last word in a data word chain, then the logic state of ROW_EN on the IMS line controls the match line pre-charge operation. More specifically, if the state of ROW_EN on the IMS line received from the PRS 150 is asserted to indicate a match condition in another selected CAM row (e.g., that stores a previous word in the data word chain), the pre-charge circuit 302 turns on and pulls the match line ML high toward VDD, thereby pre-charging ML and enabling the CAM row 300 for comparison operations. Conversely, if the state of ROW_EN on the IMS line received from the PRS 150 is de-asserted to indicate a mismatch condition in the other CAM row, then pre-charge circuit 302 does not pre-charge the match line ML of the row 300, thereby disabling the CAM row 300 for the compare operation and causing a mismatch condition on the CAM row's match line ML.

Figure 3B:
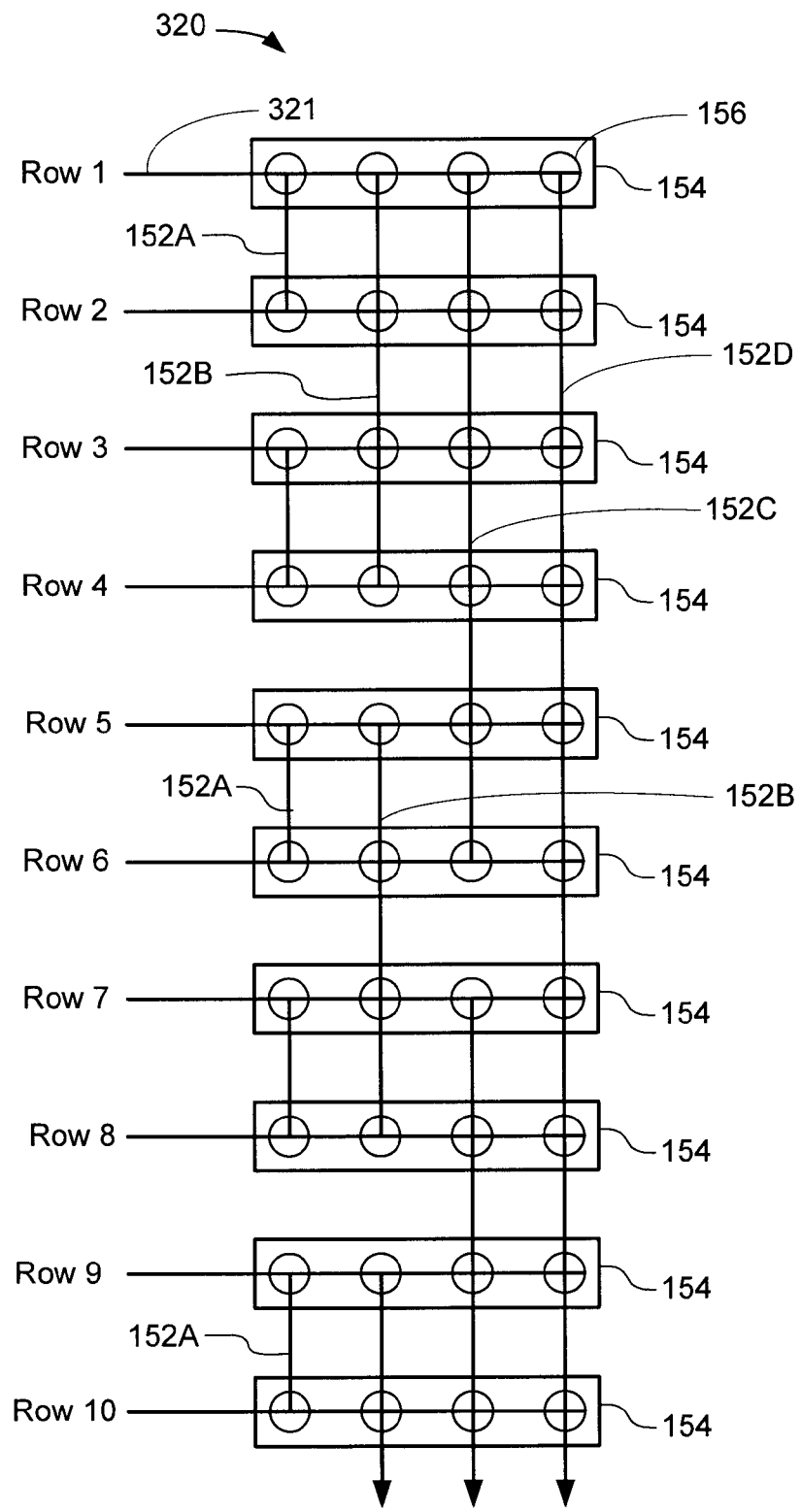
FIG. 3B shows a simplified block diagram of a programmable interconnect structure in accordance with some embodiments.

FIG. 3B shows a simplified block diagram of a PRS 320 that is one embodiment of PRS 150 of FIG. 3A. PRS 320 can be programmed (e.g., using programmable switches 156) by accepting bit groups generated by the compiler 802, and loaded into memory cells to enable the CAM array to selectively, simultaneously, and independently route match signals from any CAM row to one or more other arbitrarily selected CAM rows in the CAM array, that is, at the same time and independently of each other. PRS 320 is shown to include four sets of signal routing lines 152A-152D (i.e. the shown col-linear signal routing lines 152A-152D), each set spanning across various numbers of CAM rows 110, and to include a plurality of PSMs 154, each associated with a corresponding CAM row 110. For the simplified embodiment of FIG. 3B, each PSM 154 represents both the input PSM 154B and the output PSM 154A for a CAM row depicted in FIG. 3A, and can selectively connect the signal line of its corresponding CAM row to one or more of the signal routing lines 152A-152D of the PRS 320 via programmable switches 156 in response to loading of compiler-generated bit groups comprising routing configuration data, as explained in more detail with respect to FIGS. 8A-8C. For exemplary embodiments of FIG. 3B, the signal lines 321 in each CAM row can be the ML, IMS, and/or OMS lines.

In accordance with some embodiments, the signal routing lines 152A-152D each can be of various suitable lengths to provide a variety of different signal routing configurations for the PRS 150. For example, in the exemplary embodiment shown in FIG. 3B, each collinear set of signal routing lines 152A spans across two adjacent rows, and thus can be used to propagate the match signals from one CAM row to an adjacent CAM row. Each collinear set of signal routing lines 152B spans across four rows, and thus can be used to simultaneously route match signals from one CAM row to a selected number of three other CAM rows. Each collinear set of signal routing lines 152C spans across six rows, and thus can be used to simultaneously route match signals from one CAM row to a selected number of five other CAM rows. Finally, signal line 152D spans across the entire CAM array, thereby allowing match signals from any one row to be selectively and simultaneously propagated to all other CAM rows in the array via signal line 152D.

Although only four columns of signal routing lines 152 are shown in FIG. 3B, it is to be understood that in actual embodiments, the PRS 401 may include any number of collinear (columns) signal routing lines 152. Further, the particular length and arrangement of signal routing lines 152A-152D in FIG. 3B is merely illustrative; for actual embodiments, PRS 320 may include any combination of signal routing lines 152 of varying lengths, as may be suitable for a particular application.

Figure 3C:
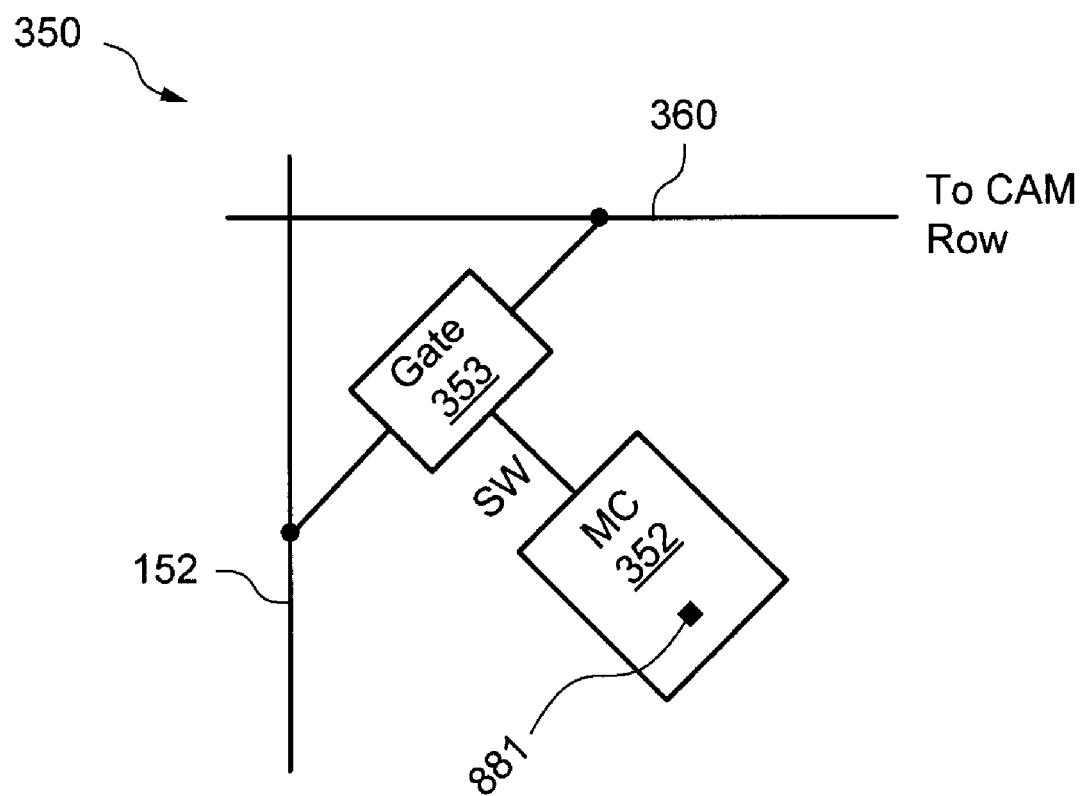
FIG. 3C shows a programmable switch that is one embodiment of a programmable switch of FIG. 3B.

FIG. 3C shows a one bit programmable switch 350 that is one embodiment of the programmable switch 156 of FIG. 3B. The one bit programmable switch 350 includes a transmission gate 353 and a memory cell 352, the memory cell being one embodiment of a programmable bit location 881. Transmission gate 353 is coupled between a PRS signal line 152 and a CAM row signal line 360, and has a gate to receive a switch signal SW from memory cell 352. As mentioned above, CAM row signal line 360 may be a match line ML, an input match signal (IMS) line, an output match signal (OMS) line, or any other signal line associated with one of CAM rows 110. Memory cell 352 can be any suitable type of memory element including, for example, a register, a latch, a DRAM cell, an SRAM cell, an EEPROM cell, a flash memory cell, and so on. For other embodiments, the memory cells 352 can be formed as a configuration memory array that can be loaded during configuration of embodiments of CAM device 100. Thus, such a configuration memory array serves for receiving a regular expression as a plurality of compiled architecture-dependent bit groups (i.e. into the plurality of programmable bit locations 881 in the configuration memory array) that in turn serves for storing bits of the architecture-dependent bit groups, which bit groups possibly include greedy quantifiers.

Transmission gate 353 can be any suitable circuit that selectively connects PRS signal line 152 and the CAM row signal line 360 in response to the switch signal (SW). For one embodiment, transmission gate 353 can be a CMOS gate including an NMOS transistor and a PMOS transistor (not shown for simplicity) connected in parallel between signal routing lines 152 and 360, with the gate of the NMOS transistor coupled to SW and the gate of the PMOS transistor coupled to receive a logical complement of SW. For another embodiment, transmission gate 353 can be an NMOS or a PMOS transistor. For other embodiments, other switching circuits or devices can be used to implement a transmission gate 353.

To store regular expressions that specify a quantified number {n} of a character or character class, the character or character class can be stored {n} times in the embodiments of the CAM device 100 described above. For example, storing the regular expression REG4="acid[w−z]{5000}rain" in embodiments of the CAM device 100 described above would involve storing the character class [w−z] 5000 times (i.e., in 5000 corresponding groups of CAM rows), thereby consuming a large portion of the CAM device 100 to store a single regular expression. As a result, it may not be feasible to store regular expressions having large quantifiers in the above-described embodiments of CAM device 100. Applicants note that a single character can be represented as a character class having only one specified character (e.g., the character "a" can be represented as the character class [a]).

Figure 4A:
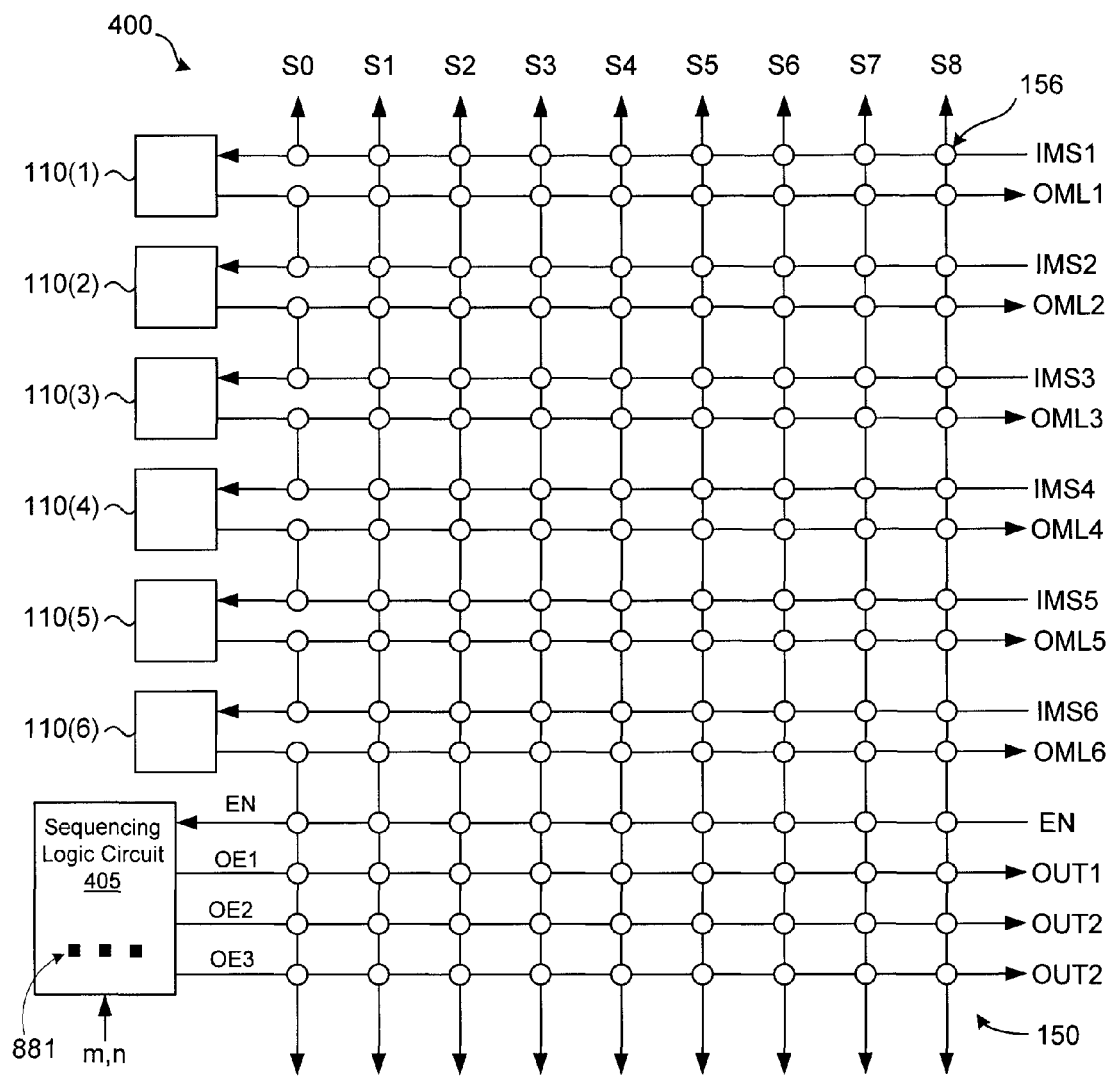
FIG. 4A shows a schematic diagram of an embodiment of the CAM array of FIG. 2 including an embedded sequencing logic circuit.

Counters can be used to count the number of characters of an input string that match a quantified character or character class of a regular expression, for example, so that the quantified character or character class does not need to be stored in multiple rows of the CAM array. Thus, in accordance with some embodiments, the CAM arrays described above with respect to FIGS. 1-3 can be modified to include a sequencing logic circuit that can implement counting functions. For example, FIG. 4A shows a CAM array 400 having an embedded sequencing logic circuit 405. More specifically, CAM array 400 is one embodiment CAM array 102 of FIG. 2, and includes a plurality of CAM rows 110(1)-110(6) and sequencing logic circuit 405 coupled to PRS 150, which is shown in FIG. 4A as including a plurality of state signal lines S0-S8 selectively coupled to the OML and IMS lines of the CAM rows by configurable switches 156. Each switch 156, which can be any suitable type of switching element (e.g., a pass transistor, a pass gate, a fuse, and so on), selectively connects a corresponding row match line (e.g., either the OML or IMS line) and a corresponding state signal line together in response to a routing configuration bit (not shown for simplicity). The routing configuration bits for all of the switches 156 within the PRS of FIG. 4A form one embodiment of the routing configuration data (RCFG) of FIG. 1. Further, sequential logic elements (e.g., flip-flops, latches, etc) within and/or associated with sequencing logic circuit 405 are one embodiment of programmable bit locations 881 that can be programmed by accepting bit groups generated by a compiler and loaded into sequential logic elements accessible by the sequencing logic circuit 405, as explained in more detail below with respect to FIGS. 8A-8C.

Exemplary embodiments of CAM array 400 may be configured using the sequencing logic circuit 405 to store and implement search operations for a regular expression having the format REG=R1R3R2, where R1 can be a prefix string having a varying number of characters, R3 is an intermediate expression defined by a sequence of {m} characters that match the specified character or character class [C], and R2 can be a suffix string having a varying number of characters.

For some exemplary embodiments described herein, the prefix string R1 is stored in first CAM rows 110(1), hereinafter referred to as the R1 CAM rows, the suffix string R2 is stored in second CAM rows 110(2), hereinafter referred to as the R2 CAM rows, and the character class is stored in third CAM rows 110(3), hereinafter referred to as the R3 or character class CAM rows. Of course, depending upon the character lengths of the R1 and R2 strings as compared to the number of CAM cells 112 provided in each CAM row 110, multiple CAM rows 110 may need to be connected together using the PRS 150 to store the R1 string, the R2 string, and the R3 expression including the quantified character class. For example, in one exemplary embodiment, each CAM row 110 includes nine CAM cells 112 to store a 9-bit binary-encoded ASCII character, and thus each CAM row stores only one ASCII-encoded character. Thus, for purposes of discussion herein, the group of one or more CAM rows connected together via PRS 150 to store the regular expression prefix string R1 is denoted as the R1 CAM rows 110(1), the group of one or more CAM rows connected together via PRS 150 to store the regular expression suffix string R2 is denoted as the R2 CAM rows 110(2), and the group of one or more CAM rows connected together via PRS 150 to store the character class is denoted as the character class or R3 CAM rows 110(3).

For the exemplary embodiment shown in FIG. 4A, sequencing logic (SL) circuit 405 includes an enable input (EN) and three outputs (OE1-OE3) selectively connected to PRS 150, which can route match signals from any CAM row 110 in CAM array 400 to the enable input of SL circuit 405, and can route counter output signals generated at OE1-OE3 to any number of arbitrarily selected CAM rows in CAM array 400. For some embodiments, SL circuit 405 receives match signals from a group of CAM rows 110 that store the character class via PRS 150 as a character class match signal (MAT_CC of FIG. 4B), and in response thereto selectively increments a count value (CNT of FIG. 4B) that indicates how many sequential characters of an input string match the character class stored in the character class CAM rows. The signals on OE1-OE3 can be used to indicate that CNT has not reached the minimum quantifier value $\{m\}$, to indicate that the input string matches the intermediate expression R3, to indicate that CNT exceeds the maximum quantifier value, and/or for other purposes, as described in more detail below.

Although only one SL circuit 405 is shown in FIG. 4A for simplicity, CAM array 400 can include any number of SL circuits 405 along with any number of CAM rows 110. Moreover, a compiler (not shown for simplicity) can read data from a compiler architecture database (not shown for simplicity) that describes the extent and usage of elements such as SL circuit 405. For some embodiments, SL circuits 405 are positioned as row elements (e.g., between two rows 110 of CAM cells 112) within the CAM array, and the ratio between the number of rows of CAM cells and the number of SL circuits 405 can be selected, for example, by the device manufacturer, depending upon customer needs. For example, although providing one SL circuit 405 for each row of CAM cells maximizes the number and types of regular expressions that can be stored in the CAM device, it undesirably increases circuit size. Thus, for many embodiments, an SL circuit 405 is inserted as a row element between every N rows of CAM cells, where N is an integer (e.g., selected by the device manufacturer). For one embodiment, N=16. For other embodiments, SL circuit 405 can be included within selected rows 110 of the CAM array 400. For still other embodiments, SL circuit 405 can be located outside the CAM array.

Figure 4B:
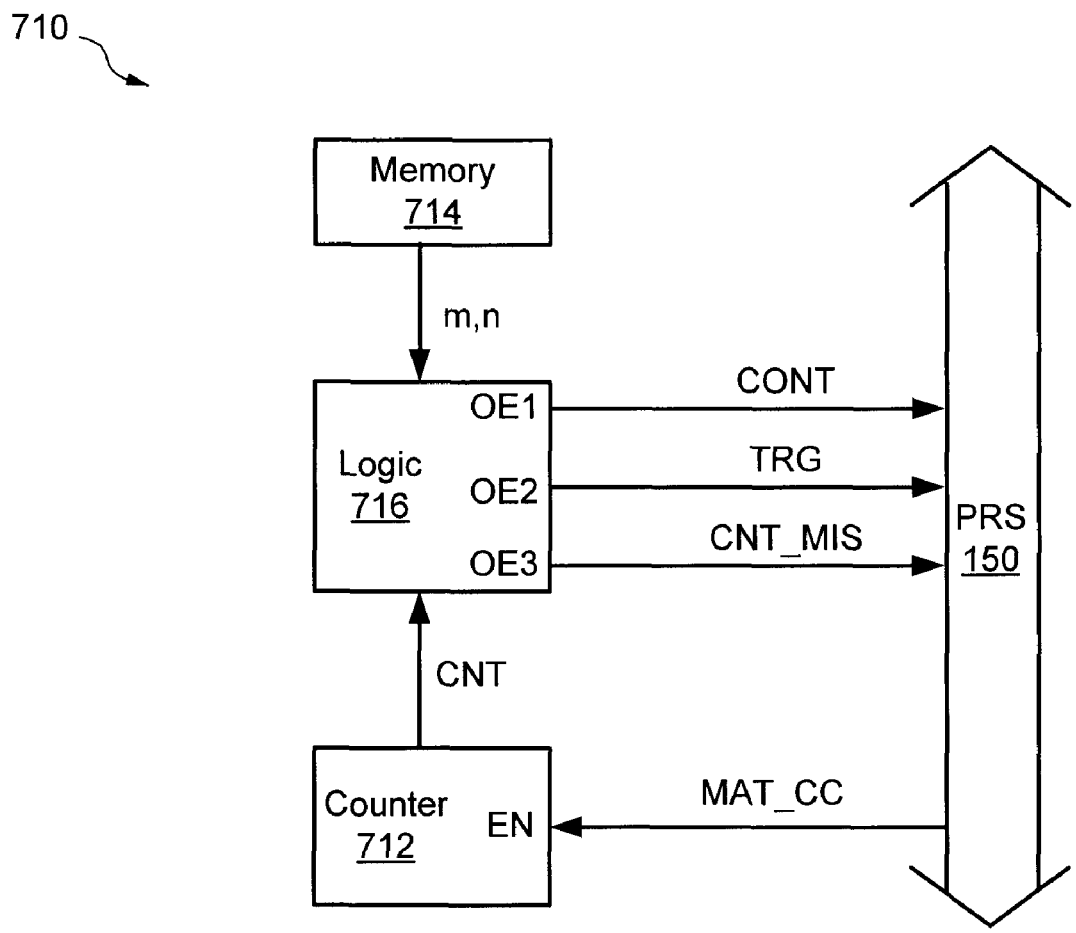
FIG. 4B shows a block diagram of a counter circuit that is one embodiment of the sequencing logic circuit of FIG. 4A.

FIG. 4B shows a counter circuit 710 that is one embodiment of SL circuit 405 of FIG. 4A. Counter circuit 710 includes a counter 712 (the sequential elements of the counter being one embodiment of programmable bit locations 881, as described in more detail below with respect to FIGS. 8A-8C), a memory 714, and compare logic 716. Counter 712, which can be any suitable binary counter, has an enable input (EN) to receive the character class match signal (MAT_CC) from the character class CAM rows via PRS 150, and has an output to provide the count value (CNT) to compare logic 716. Memory 714, which can be any suitable type of memory, stores the quantifier values $\{m, n\}$ of an associated regular expression and is coupled to compare logic 716. The quantifier values $\{m, n\}$ can be loaded into memory 714 during, for example, configuration of CAM array 401 when CAM device 100 is configured to receive compiler-generated architecture-specific bit groups for loading into programmable sequential logic elements, as described in more detail below with respect to FIGS. 8A-8C.

Compare logic 716 includes an input to receive CNT from counter 712, a control input to receive the quantifier values from memory 714, and outputs OE1-OE3 selectively connected to the signal routing lines of PRS 150. For some embodiments, the signal on OE1 may be provided as a continue signal (CONT) to the IMS lines of the character class CAM rows, the signal on OE2 may be provided as a trigger signal (TRG) to the IMS lines of the R2 CAM rows, and the signal on OE3 may be provided as a count mismatch (CNT_MIS) signal to indicate a mismatch condition between the input string and the regular expression.

More specifically, the CONT signal generated at OE1, which indicates whether CNT has reached the minimum quantifier value $\{m\}$, can be used to selectively enable the character class CAM rows (e.g., by selectively enabling its match line by pre-charge circuit 302 of FIG. 3A) to examine subsequent characters of the input string for matches with the specified character class. For one embodiment, compare logic 716 asserts CONT (e.g., to logic high) if CNT<m, and the asserted state of CONT enables the character class CAM rows to determine whether subsequent input characters match the character class. Conversely, if CNT>n, compare logic 716 de-asserts CONT (e.g., to logic low), which can be used to disable the character class CAM rows for subsequent compare operations.

The TRG signal generated at OE2, which indicates whether CNT=m for quantifiers specifying an exact number $\{m\}$ of input characters to match the character class, or whether $m \geq CNT \geq n$ for quantifiers specifying a range $\{m,n\}$ of characters, selectively triggers the R2 CAM rows for next compare operations, for example, by routing TRG as ROW_EN to the R2 CAM rows' pre-charge circuit 302 via the PRS 150. For one embodiment, compare logic 716 asserts TRG (e.g., to logic high) if CNT is within the specified quantifier range, and the asserted state of TRG enables the R2 CAM rows for compare operations with the next input character. Conversely, compare logic 716 de-asserts TRG (e.g., to logic low) if CNT is not within the specified quantifier range, and the de-asserted state of TRG disables the R2 CAM rows for subsequent compare operations.

The count mismatch signal (CNT_MIS) generated at OE3, which indicates whether CNT>m for quantifiers specifying an exact number $\{m\}$ of characters or whether CNT>n for quantifiers specifying a range $\{m,n\}$ of characters, can be used to indicate that the input string does not match the intermediate expression R3 of the regular expression, and therefore does not match the regular expression. For one embodiment, compare logic 716 asserts CNT_MIS (e.g., to logic high) if CNT has exceeded the maximum quantifier value, and the asserted state of CNT_MIS can be used to indicate a mismatch condition. For other embodiments, counter circuit 710 may not provide CNT_MIS.

Referring now to FIGS. 4A-4B, to store a regular expression having the format R1[C]{m}R2 in CAM array 401 having embedded counter circuit 710, where R3=[C]{m}, a number of first CAM rows 110(1) are programmed and logically connected together via the PRS 150 to store the prefix string R1, a number of second CAM rows 110(2) are programmed and logically connected together via the PRS 150 to store the suffix string R2, a number of third CAM rows 110(3) are programmed and logically connected together via the PRS 150 to store the character class [C], and a value of m is stored in memory 714 of counter circuit 710. Further, the match signals of the last R1 CAM row 110(1) are provided via PRS 150 to the IMS line of the first character class CAM row 110(3), and the match signals of the last character class CAM row 110(3) are provided via PRS 150 as the character class match signal (MAT_CC) to the enable input EN of counter circuit 710. The counter circuit's output signal CONT at OE1 is provided via PRS 150 to the IMS line of the first character class CAM row 110(3), the counter circuit's output signal TRG at OE2 is provided to the IMS line of the first R2 CAM row (110(2), and the counter circuit's output signal CNT_MIS is connected to the PRS 150.

For some embodiments, when searching an input string for a match with a regular expression of the form R1R3R2 stored in CAM array 401, only the first R1 CAM row 110(1) is enabled for a first compare operation with the input string, and all other CAM rows are initially disabled. Then, if there is a match condition in the R1 CAM rows 110(1), the character class CAM rows 110(3) are enabled to detect a character class match with the next input character, and the R2 CAM rows 110(2) are subsequently enabled only if there is a character class match. Conversely, if a prefix string match is not detected in the R1 CAM rows 110(1), only the R1 CAM rows 110(1) are enabled for the next compare operation.

Embodiments of CAM array 401 having embedded counter circuit 710 are able to count a specified number of instances of a designated character or character class, thereby eliminating the need to store regular expressions in their unrolled form in the CAM array. However, for regular expressions that include quantifiers (e.g., *, +, ?,{n}, {n,m}) for which multiple overlapping substrings of an input string can concurrently match the regular expression, multiple counters are required to maintain a separate count value for each potentially matching substring. Although a different counter can be assigned to each potentially matching substring to individually track the number of matching characters for overlapping input substrings, this approach requires as many counters as matching substrings, which for some regular expressions can be unlimited. Another solution is to use a counter circuit that includes a FIFO element or shift register that can store multiple counter entries corresponding to multiple overlapping substrings, for example, as disclosed in commonly-owned U.S. Pat. No. 7,643,353, which is incorporated herein by reference. However, the number of overlapping strings that can be managed by such counter circuits is limited by the number of FIFO entries or the number of register stages, and typically requires complex control circuitry.

Thus, in accordance with the present embodiments, the CAM arrays described above with respect to FIGS. 1-3 can be modified to include one or more embedded configurable counter circuits that can be programmed to count the number of sequential input characters associated with a quantified character or character class specified in a regular expression. The counter circuit can be interconnected via the PRS 150 to form a loop that counts the number of sequential occurrences of the quantified character or character class so that the quantified character or character class can be stored in only one set of CAM row(s), irrespective of the quantifier value.

More specifically, the configurable counter circuits disclosed herein are suited to implement various quantifiers in regular expressions without unrolling the regular expressions and without the use of shift registers or FIFO buffers to maintain separate count values for multiple overlapping portions of an input string that potentially match a regular expression, thereby allowing regular expression search operations to be performed using a TCAM-based search engine having minimal counter resources. In addition, some embodiments of the counter circuits disclosed herein can be selectively enabled to identify matching portions of the input string that have a specified minimum number of characters. For such embodiments, the counter circuit is responsive to a mode select signal that indicates a normal (NRML) mode of operation or a minimum match length (MML) mode of operation.

Figure 5A:
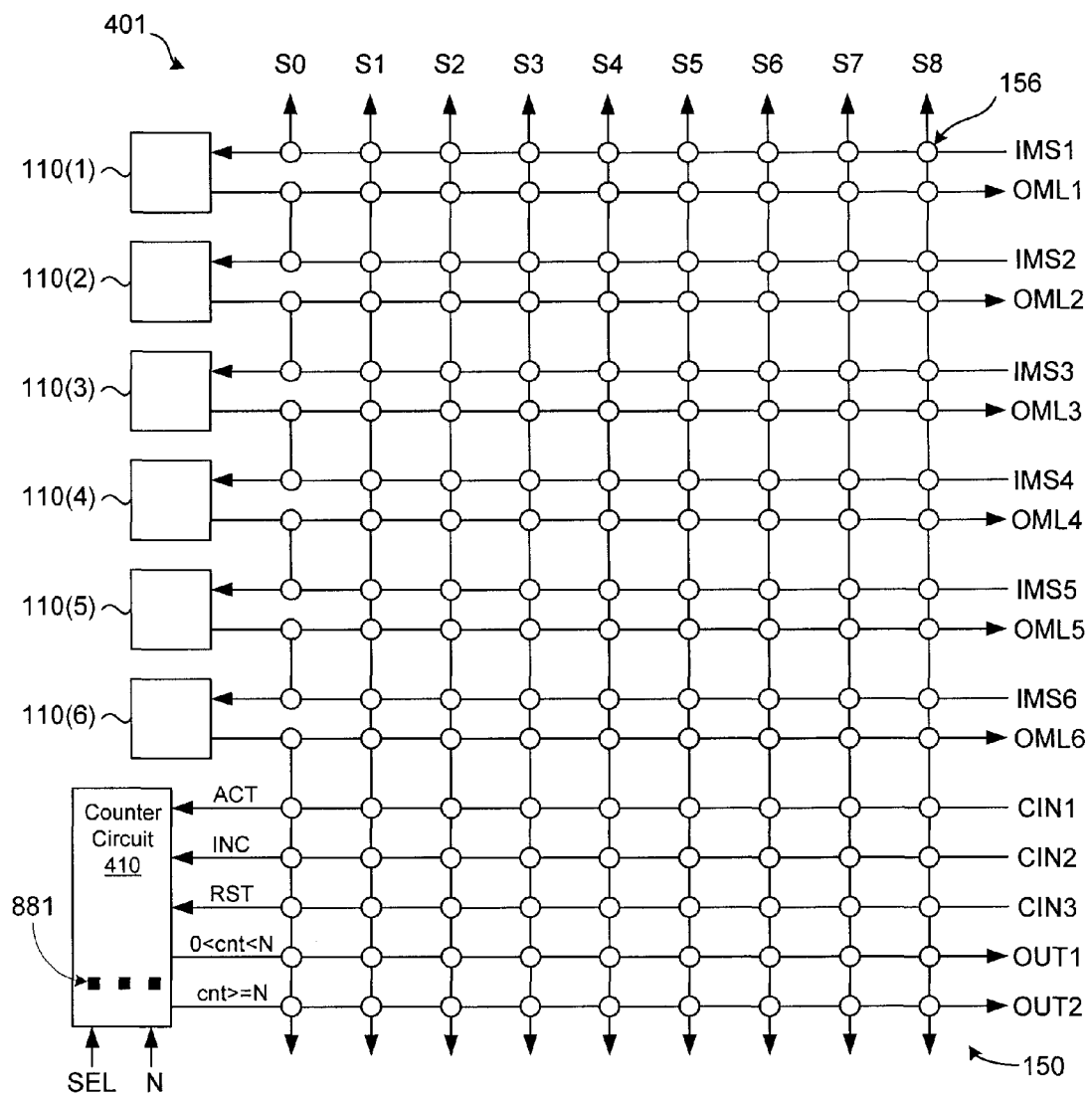
FIG. 5A shows a schematic diagram of an embodiment of the CAM array of FIG. 2 including an embedded configurable counter circuit.

FIG. 5A shows a CAM array 401 having an embedded counter circuit 410 in accordance with some embodiments. More specifically, CAM array 401 is one embodiment CAM array 102 of FIG. 2, and includes a plurality of CAM rows 110(1)-110(6) and counter circuit 410 coupled to PRS 150, which is shown in FIG. 5A as including a plurality of state signal lines S0-S8 selectively coupled to the OML and IMS lines of the CAM rows by configurable switches 156.

For exemplary embodiments described herein, configurable counter circuit 410 is configured to maintain a count value CNT, and includes 3 data inputs, 2 control inputs, and 2 data outputs. The control inputs receive a target count value N and a mode select signal SEL. The data inputs receive an active signal (ACT), an increment signal (INC), and a reset signal (RST) from the PRS 150. The data outputs provide output signals OUT1 and OUT2 to the PRS 150, where OUT1 indicates whether 0<CNT<N, and OUT2 indicates whether CNT≥N. Thus, for some embodiments, OUT1 indicates whether the count value CNT generated by counter circuit 410 is less than the target value N, and OUT2 indicates whether the count value CNT generated by counter circuit 410 is greater than or equal to the target value N. In operation, counter circuit 410 selectively increments the count value CNT in response to the 3 input signals ACT, INC, and RST, which as described below allows counter circuit 410 to be employed with CAM rows 110 and the PRS 150 to implement search operations for regular expressions having most types of metacharacters and quantifiers without using large shift registers and/or FIFO elements. The input signals ACT, INC, and RST can be generated by CAM rows 110 to indicate matches between input characters and strings, characters, character classes, and/or wildcards stored in CAM rows 110. In addition, the mode select signal SEL can be used to select a normal mode of operation (NRML) or a minimum match length mode of operation (MML) for counter circuit 410. For some embodiments, a de-asserted state (e.g., logic low) of SEL indicates the NRML operational mode, and an asserted state (e.g., logic high) of SEL indicates the MML operational mode.

In either operational mode, de-assertion of ACT (e.g., to logic low) disables counter circuit 410, and assertion of ACT (e.g., to logic high) enables counter circuit 410. When enabled and operating in the normal mode, counter circuit 410 increments its count value CNT by one in response to each assertion of INC if RST is de-asserted. If INC is not asserted, then counter circuit 410 does not increment CNT. Thus, for example, to count the number of sequential characters of an input string that match a character stored in CAM row 110(1), the output match line (OML) of CAM row 110(1) can be routed as INC to counter circuit 410 via the PRS 150 so that each match between an input character and the data stored in CAM row 110(1) results in a separate assertion of INC and thus a separate increment of CNT. If RST is asserted (e.g., to logic high), counter circuit 410 resets CNT to zero. For example, assertion of RST can be used to reset the counter circuit 410 after a match is detected. For some embodiments, counter circuit 410 continually compares CNT with N to generate the output signals OUT1 and OUT2. More specifically, OUT1 is asserted (e.g., to logic high) only if 0<CNT<N, and OUT2 is asserted (e.g., to logic high) only if CNTN.

The logic operations of counter circuit 410 for selectively incrementing the count value CNT in response to the 3 input signals for the NRML mode of operation are summarized below in Table 3, where CNT=0 indicates resetting CNT to zero, and CNT++ indicates incrementing CNT by one.

TABLE 3

| ACT | INC | RST | counter action |
|---|---|---|---|
| 0 | x | x | CNT = 0 |
| 1 | 0 | 0 | none |
| 1 | 0 | 1 | CNT = 0 |
| 1 | 1 | 0 | CNT ++ |
| 1 | 1 | 1 | CNT = 0 |

As mentioned above, counter circuit 410 can also operate in a minimum-match length mode (MML) to identify matching portions of the input string that have a specified minimum number of characters. During the MML mode, the reset signal (RST) is used as a check match length signal to check the character length of a matching string. For some embodiments, the first output signal OUT1=0<CNT<N is not used in the MML mode. In operation, when counter circuit 410 is enabled in the MML mode, counter circuit 410 increments CNT by one in response to each assertion of INC. If RST is de-asserted, counter circuit 410 does not generate the output signal CNT≧N. Conversely, if RST is asserted while CNT is incremented in response to INC, counter circuit 410 checks the match length by outputting the second output signal OUT2=CNT≧N as a match signal. If INC is not asserted, counter circuit 410 maintains the current value of CNT, regardless of RST. The logic operations of counter circuit 410 for selectively incrementing the count value CNT in response to the 3 input signals for the MML mode are summarized below in Table 4.

TABLE 4

| ACTIVE | INC | RST | counter action |
|---|---|---|---|
| 0 | x | x | CNT = 0 |
| 1 | 0 | 0 | none |
| 1 | 0 | 1 | none |
| 1 | 1 | 0 | CNT++; do not output CNT ≧ N signal |
| 1 | 1 | 1 | CNT++; output CNT ≧ N signal |

For some embodiments, counter circuit 410 stores the value N−1 as the target value so the output signals can be generated in the same clock cycle that the input signals are received. For such embodiments, the counter circuit 410 compares the value N−1 with CNT to generate the output signals OUT1 and OUT2.

By using a selectable combination of 3 input signals to control the incrementing of CNT and the generation of the output signals, counter circuit 410 can perform counting functions for regular expressions that include many different combinations of metacharacters and quantifiers. For example, present embodiments of counter circuit 410 can maintain separate character match count values for a plurality of overlapping substrings that concurrently match the same regular expression without using shift registers or FIFO memories. In addition, counter circuit 410 can implement non-greedy match operations by employing a killer track that effectively disables the counter circuit 410 after a match condition is detected, as described below. For some embodiments, a killer bit can be used to control the killer track in the PRS 150.

Figure 5B:
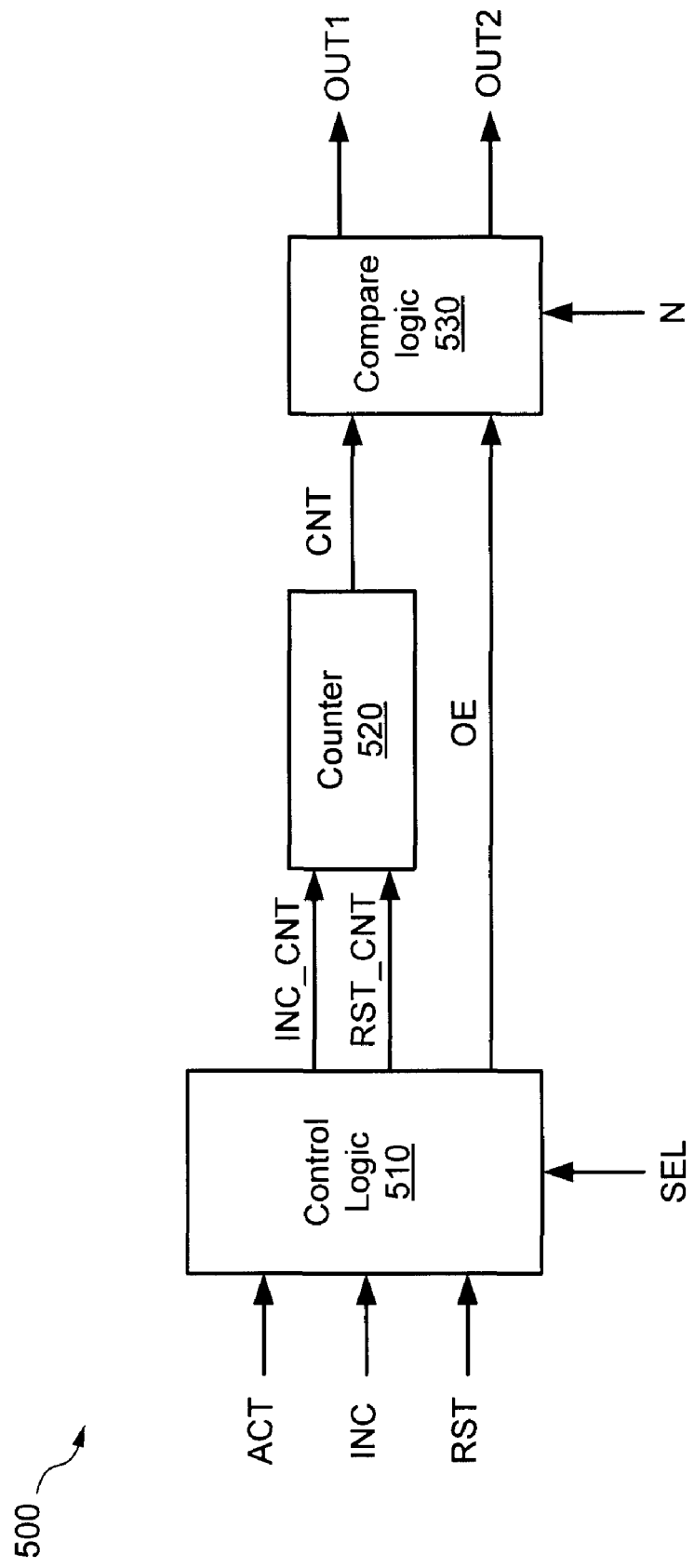
FIG. 5B shows a block diagram of one embodiment of the configurable counter circuit of FIG. 5A.

FIG. 5B shows a counter circuit 500 that is one embodiment of counter circuit 410 of FIG. 5A. Counter circuit 500 includes control logic 510, a counter 520, and compare logic 530. Control logic 510 includes inputs to receive the input signals ACT, INC, and RST, a control input to receive SEL, and outputs to provide signals INC_CNT and RST CNT to counter 520. Control logic 510 also includes an output to generate an output enable signal (OE) for compare logic 530. Counter 520, which can be any suitable binary counter, generates the count value CNT in response to INC_CNT and RST CNT. For some embodiments, counter 520 increments CNT by one only upon an assertion of INC_CNT, and resets CNT to zero only when RST CNT is asserted. Compare logic 530 includes a data input to receive CNT from counter 520, a first control input to receive the output enable signal (OE) from control logic 510, a second control input to receive the target value N, and outputs to generate output signals OUT1 and OUT2. Although not shown in FIG. 5B for simplicity, compare logic 530 includes a memory element to store the target value N (or alternatively, the target value N−1).

The components of counter circuit 500 perform the logic functions summarized above in Tables 3 and 4, depending upon the state of SEL. Thus, when SEL is in a first state (e.g., logic 0), counter circuit 500 operates in the NRML mode according to the logic states summarized in Table 3, and when SEL is in a second state (e.g., logic 1), counter circuit 500 operates in the MML mode according to the logic states summarized in Table 4.

The implementation of search operations for a variety of regular expressions using CAM devices embedded with counter circuit 410 of FIG. 5A are described below with respect to FIGS. 6A-6I, where a solid dot in the PRS 150 indicates a conductive switch 156 and an open circle in the PRS 150 indicates a non-conductive switch 156. For the exemplary embodiments described herein, the match signals generated on the CAM row output lines OML and routed to counter circuit 410 as ACT, INC, and RST via the state signal lines of PRS 150 are asserted (e.g., active) for one cycle, and similarly, the counter circuit output signals OUT1 and OUT2 routed to CAM rows 110 as row enable signals via the state signal lines of PRS 150 are asserted (e.g., active) for one cycle.

Figure 6A:
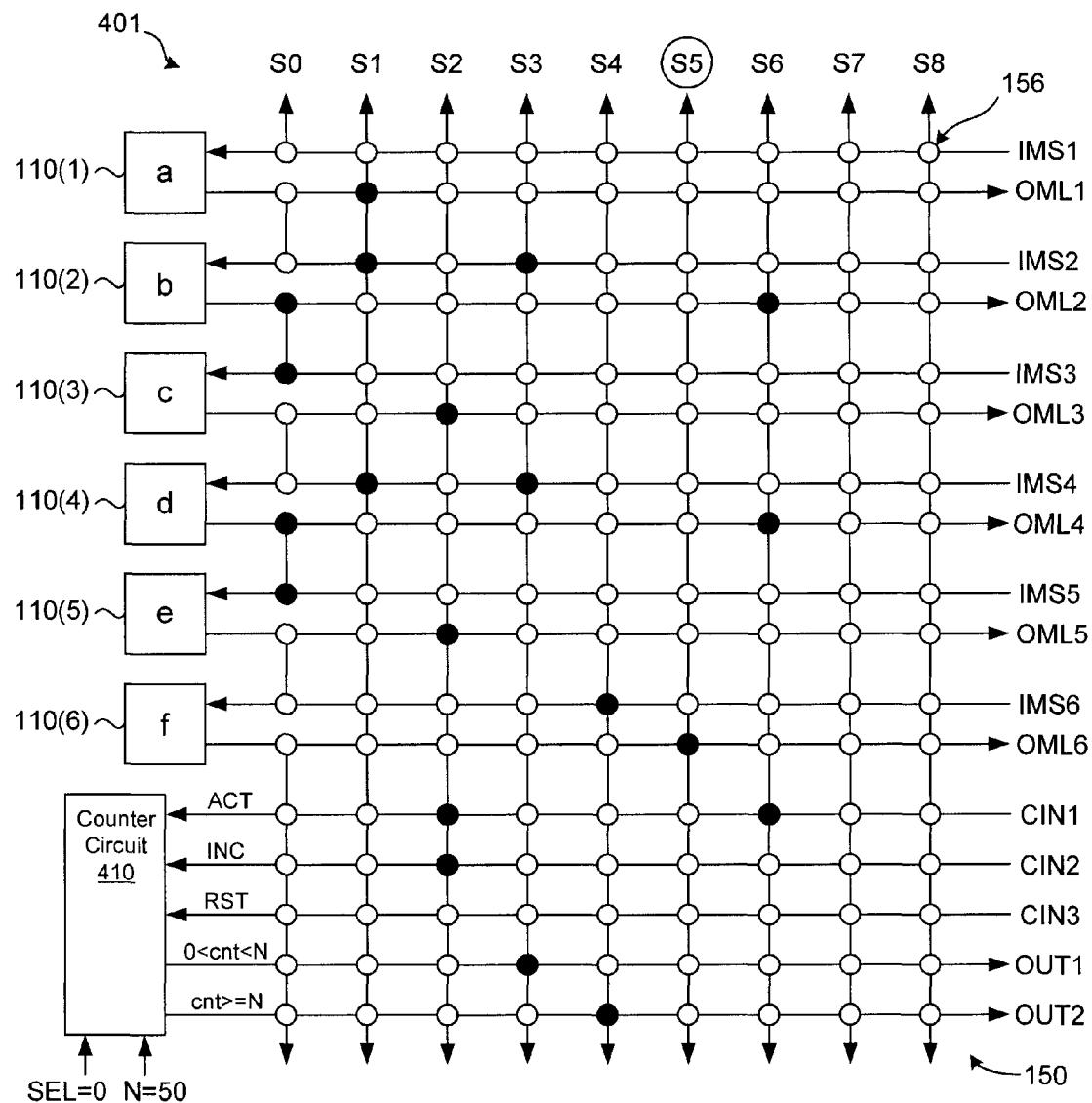
FIG. 6A shows an embodiment of the CAM array of FIG. 4B configured to implement search operations for the regular expression $R_A$=a(bc|de){50}f.

FIG. 6A shows an embodiment of CAM array 401 configured to store and implement search operations for the regular expression $R_A$=a(bc|de){50}f. For $R_A$, the characters a-f are stored in CAM rows 110(1)-110(6), respectively, of CAM array 401. The OML of CAM row 110(2) is connected to the IMS line of CAM row 110(3), thereby forming the string "bc" by enabling CAM row 110(3) for a compare operation if there is a match in CAM row 110(2) in a previous compare operation. Similarly, the OML of CAM row 110(4) is connected to the IMS line of CAM row 110(5), thereby forming the string "de" by enabling CAM row 110(5) for a compare operation if there is a match in CAM row 110(4) in a previous compare operation. The alternation symbol "|" is implemented by connecting the OML line of CAM row 110(1) to the IMS lines of CAM rows 110(2) and 110(4) so that a match between an input character and "a" of $R_A$ in a compare operation will concurrently trigger (e.g., enable) searches for the strings "bc" and "de" in next compare operations.

The quantifier {50} is implemented by storing N=50 in counter circuit 410, by connecting the OML lines of CAM rows 110(3) and 110(5) to the ACT and INC inputs of counter circuit 410, and by connecting the OUT1=0<CNT<N line of counter circuit 410 to the IMS lines of CAM rows 110(2) and 110(4). In addition, the OUT2=CNTN line of counter circuit 410 is connected to the IMS line of CAM row 110(6). In this manner, each time a match is detected between the input string and either the strings "bc" or "de" of $R_A$, assertion of the corresponding match signal is routed as asserted ACT and INC signals to counter circuit 410, which in response thereto increments CNT by one. So long as 0<CNT<N, counter circuit 410 asserts OUT1, which in turn enables CAM rows 110(2) and 110(4) for the next compare operation. Also note that the OML of CAM rows 110(2) and 1104) are connected to the ACT input of counter circuit 410. This ensures that the ACT signal remains high upon matches between the input string and either the "b" stored in CAM row 110(2) or the "d" stored in CAM row 110(4) (e.g., if ACT is de-asserted, counter circuit 410 resets CNT=0). Thereafter, when CNT becomes equal to N, which indicates that an input string contains the prefix "a" followed by 50 instances of "bc" of "de," counter circuit 410 de-asserts OUT1 and asserts OUT2. The de-assertion of OUT1 disables CAM rows 110(2) and 110(4) for the next compare operation, and the assertion of OUT2 enables CAM row 110(6) for the next compare operation. Then, if the next input character is an "f," CAM row 110(6) asserts the match signal on its OML, which is routed as a regular expression match signal on state signal line S5 (which is circled in FIG. 6A to indicate that it carries the regular expression match signal).

Figure 6B:
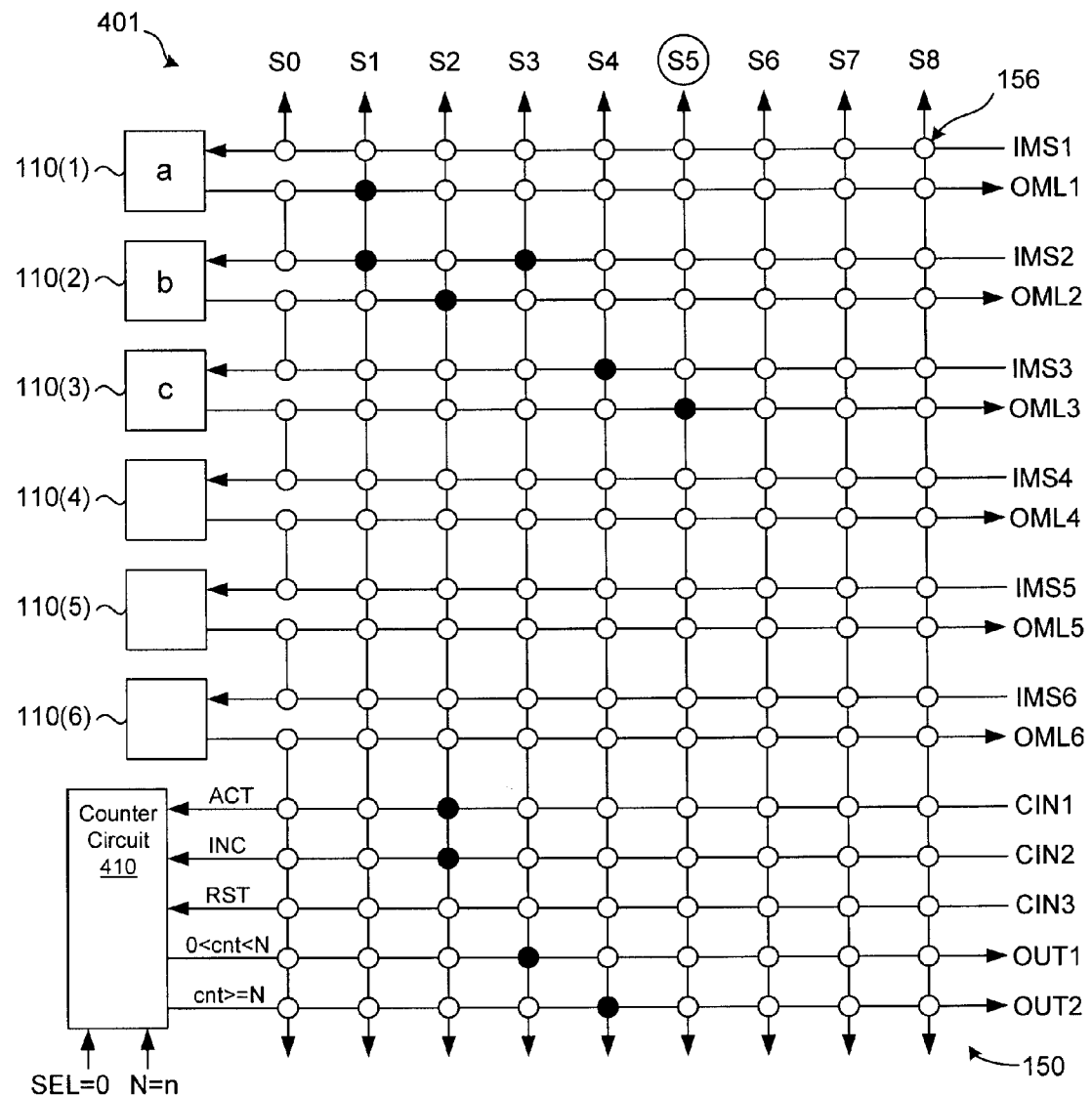
FIG. 6B shows an embodiment of the CAM array of FIG. 4B configured to implement search operations for the regular expression $R_B$=ab{n}c.

FIG. 6B shows an embodiment of CAM array 401 configured to implement search operations for the regular expression $R_B$=ab{n}c. For $R_B$, the characters a-c are stored in CAM rows 110(1)-110(3), respectively, of CAM array 401. The OML of CAM row 110(1) is connected to the IMS line of CAM row 110(2) to form the string "ab" by enabling CAM row 110(2) for a compare operation only if there is a match in CAM row 110(1) in a previous compare operation. The quantifier {n} is implemented by storing N=n in counter circuit 410, by connecting the OML line of CAM row 110(2) to the ACT and INC inputs of counter circuit 410, and by connecting the OUT1=0<CNT<N line of counter circuit 410 to the IMS line of CAM row 110(2). In addition, the OUT2=CNT≧N line of counter circuit 410 is connected to the IMS line of CAM row 110(3). In this manner, each time a match is detected between the input string and the character "b" of $R_B$, assertion of the corresponding match signal on OML2 is routed as asserted ACT and INC signals to counter circuit 410, which in response thereto increments CNT by one. So long as 0<CNT<n, counter circuit 410 asserts OUT1, which in turn enables CAM row 110(2) for the next compare operation. When CNT becomes equal to n, which indicates that an input string contains the prefix "a" followed by n instances of "b," counter circuit 410 de-asserts OUT1 and asserts OUT2. The de-assertion of OUT1 disables CAM row 110(2) for the next compare operation, and the assertion of OUT2 enables CAM row 110(3) for the next compare operation. Then, if the next input character is a "c," CAM row 110(3) asserts the match signal on its OML, which is routed as a regular expression match signal on state signal line S5.

Figure 6C:
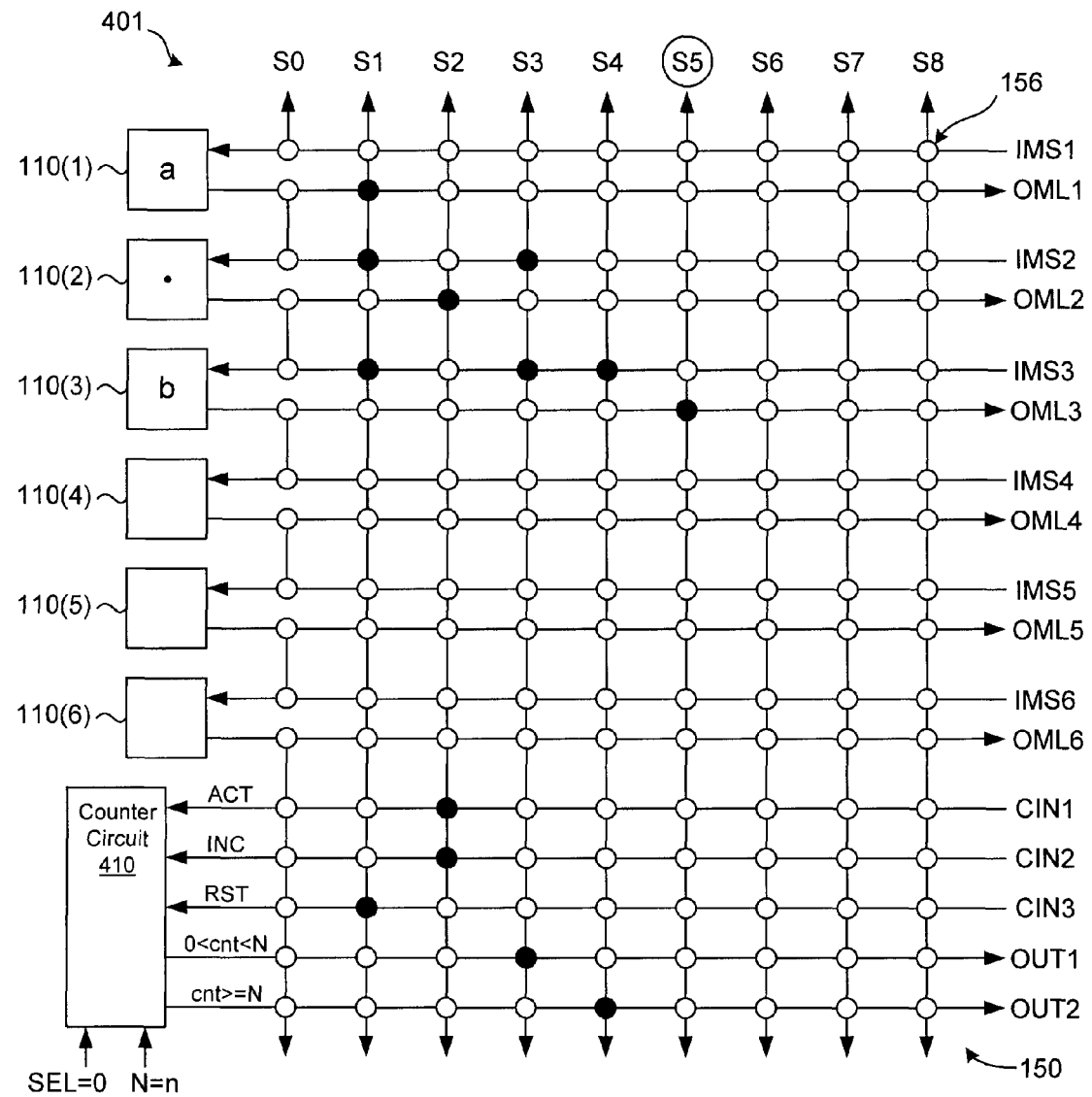
FIG. 6C shows an embodiment of the CAM array of FIG. 4B configured to implement search operations for the regular expression $R_C$=a.{0,n}b.

FIG. 6C shows an embodiment of CAM array 401 configured to implement search operations for the regular expression $R_C$=a.{0,n}b, which requires an input string to include the prefix "a" followed by zero or more instances of any character followed by the suffix "b." For $R_C$, the character "a" is stored in CAM row 110(1), the wildcard "." is stored in CAM row 110(2), and the character "b" is stored in CAM row 110(3). The wildcard character can be stored as a don't care in the TCAM cells of row 110(2). The OML of CAM row 110(1) is connected to the IMS lines of CAM rows 110(2) and 110(3), thereby enabling CAM rows 110(2) and 110(3) for a compare operation if there is a match in CAM row 110(1) in a previous compare operation. The quantifier {0,n} is implemented by storing N=n in counter circuit 410, by connecting the OML line of CAM row 110(1) to the RST input of counter circuit 410, by connecting the OML line of CAM row 110(2) to the ACT and INC inputs of counter circuit 410, by connecting the OUT1=0<CNT<N line of counter circuit 410 to the IMS lines of CAM rows 110(2) and 110(3), and by connecting the OUT2=CNT≧N line of counter circuit 410 to the IMS line of CAM row 110(3). In this manner, upon detection of an "a" in the input string, CAM rows 110(2) and 110(3) are enabled for the next compare operation. Thereafter, each subsequent character in the input string that matches the wildcard "." causes CAM row 110(2) to assert the ACT and INC input signals to counter circuit 410, which in response thereto increments CNT by one. If any of these subsequent characters is a "b," CAM row 110(3) asserts the match signal on its OML, which is routed as a regular expression match signal on state signal line S5. So long as 0<CNT<n, counter circuit 410 asserts OUT1, which in turn enables CAM rows 110(2) and 110(3) for the next compare operation. When CNT becomes equal to N=n, which indicates that an input string contains the prefix "a" followed by n additional characters, counter circuit 410 de-asserts OUT1 and asserts OUT2. The de-assertion of OUT1 disables CAM row 110(2) for the next compare operation, and the assertion of OUT2 enables CAM row 110(3) for the next compare operation. Then, if the next input character is a "b," CAM row 110(3) asserts the match signal on its OML, which is routed as a regular expression match signal on state signal line S5.

The regular expression $R_C$ is complex because multiple overlapping portions of an input string can concurrently match $R_C$. For example, consider a search operation between the input string IN1="axxaxxbxb" and $R_C$=a.{0,5}b. The first input character "a" matches CAM row 110(1), which asserts the match signal on OML1 to enable CAM rows 110(2) and 110(3) for the next compare operation. The asserted match signal on OML1 is also routed as RST to counter circuit 410, which in response thereto resets CNT=0. The second character "x" matches CAM row 110(2), which asserts ACT and INC to cause counter circuit 410 to increment the count value to CNT=1. Because 0<CNT<5, counter circuit 410 asserts OUT1 to enable CAM rows 110(2) and 110(3) for the next compare operation, and de-asserts OUT2. The third character "x" matches CAM row 110(2), which asserts ACT and INC to cause counter circuit 410 to increment the count value to CNT=2. Because 0<CNT<5, counter circuit 410 asserts OUT1 to enable CAM rows 110(2) and 110(3) for the next compare operation. The fourth character "a" matches CAM rows 110(1) and 110(2), which both assert their OML. The asserted match signal on OML1 drives RST to logic high, thereby causing counter circuit 410 to reset CNT=0 and to ignore the asserted ACT and INC signals routed from CAM row 110(2), as indicated in Table 3. Because 0<CNT<5, counter circuit 410 asserts OUT1 to enable CAM rows 110(2) and 110(3) for the next compare operation. The fifth character "x" matches CAM row 110(2), which asserts ACT and INC to cause counter circuit 410 to increment the count value to CNT=1. Because 0<CNT<5, counter circuit 410 asserts OUT1 to enable CAM rows 110(2) and 110(3) for the next compare operation. The sixth character "x" matches CAM row 110(2), which asserts ACT and INC to cause counter circuit 410 to increment the count value to CNT=2. Because 0<CNT<5, counter circuit 410 asserts OUT1 to enable CAM rows 110(2) and 110(3) for the next compare operation. The seventh character "b" matches CAM rows 110(2) and 110(3), which both assert their match signals. The match signal from CAM row 110(2) asserts ACT and INC to cause counter circuit 410 to increment the count value to CNT=3, and because 0<CNT<5, counter circuit 410 asserts OUT1 to enable CAM rows 110(2) and 110(3) for the next compare operation. The match signal from CAM row 110(3) is routed to S5 to indicate a first substring match (e.g., "axxaxxb").

Then, the eighth character "x" matches CAM row 110(2), which asserts ACT and INC to cause counter circuit 410 to increment the count value to CNT=4. Because 0<CNT<5, counter circuit 410 asserts OUT1 to enable CAM rows 110(2) and 110(3) for the next compare operation. The ninth character "b" matches CAM rows 110(2) and 110(3), which both assert their match signals. The match signal from CAM row 110(2) on OML2 asserts ACT and INC to cause counter circuit 410 to increment the count value to CNT=5. Because CNT÷5, counter circuit 410 de-asserts OUT1 and asserts OUT2. The de-asserted OUT1 signal disables CAM row 110 (2), and the asserted OUT2 signal enables CAM row 110(3) for the next compare operation. The match signal from CAM row 110(3) is routed to S5 to indicate a second substring match (e.g., "axxbxb"). If a next input character is a "b," CAM row 110(3) would assert its match signal on OML3 to indicate another match. The disabled CAM row 110(2) does not assert its match signal, and the resulting de-asserted state of ACT causes counter circuit 410 to reset CNT=0, thereby leading to the de-assertion of OUT2 and thus the disabling of CAM row 110(3).

By resetting the count value CNT=0 in response to the first character in each potentially matching substring (e.g., using the RST signal) and asserting OUT1 to continue enabling the quantified character matches (e.g., in CAM row 110(2)), counter circuit 410 can be used to detect the occurrence of multiple overlapping matching portions of an input string using only a binary counter and associated control logic. In this manner, counter circuit 410 can be used for implementing quantified character searches for regular expressions without using multiple counters and without using a shift register or FIFO element to store multiple count values corresponding to multiple overlapping matching portions of the input string. Note that the quantified sub-pattern ".{0,n}" is greedy because it will match as many times as is possible while still allowing the rest of the pattern to match.

Figure 6D:
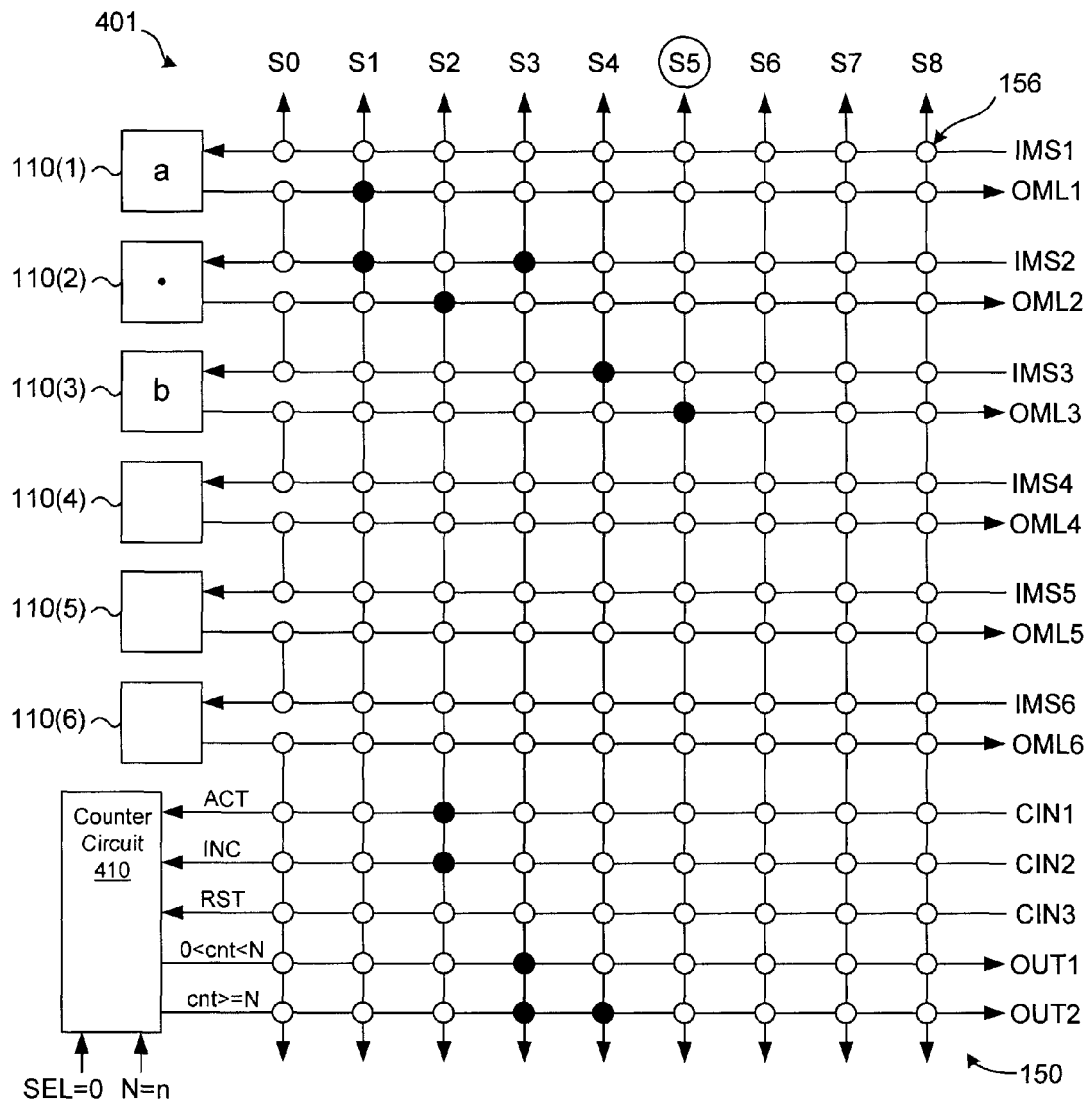
FIG. 6D shows an embodiment of the CAM array of FIG. 4B configured to implement search operations for the regular expression $R_D$=a.{n,}b.

FIG. 6D shows an embodiment of CAM array 401 configured to implement search operations for the regular expression $R_D$=a.{n,}b, which requires an input string to include the prefix "a" followed by n or more instances of any character followed by the suffix "b." For $R_D$, the character "a" is stored in CAM row 110(1), the wildcard "." is stored in CAM row 110(2), and the character "b" is stored in CAM row 110(3). The OML of CAM row 110(1) is connected to the IMS line of CAM row 110(2), thereby enabling CAM row 110(2) for a compare operation if there is a match in CAM row 110(2) in a previous compare operation. The quantifier {n,} is implemented by storing N=n in counter circuit 410, by connecting the OML line of CAM row 110(2) to the ACT and INC inputs of counter circuit 410, by connecting the OUT1 and OUT2 lines of counter circuit 410 to the IMS line of CAM row 110(2), and by connecting the OUT2 line of counter circuit 410 to the IMS line of CAM row 110(3). In this manner, upon detection of an "a" in the input string, CAM row 110(2) is enabled for the next compare operation. Thereafter, each subsequent character in the input string that matches the wildcard "." causes CAM row 110(2) to assert the ACT and INC input signals to counter circuit 410, which in response thereto increments CNT by one. So long as 0<CNT<n, counter circuit 410 asserts OUT1, which in turn enables CAM row 110(2) for the next compare operation. When CNT becomes equal to N=n, which indicates that an input string contains the prefix "a" followed by n additional characters, counter circuit 410 de-asserts OUT1 and asserts OUT2. The assertion of OUT2 enables CAM rows 110(2) and 110(3) for the next compare operation. Then, if the next input character is a "b," CAM row 110(3) asserts the match signal on its OML, which is routed as a regular expression match signal on state signal line S5.

Note that because $R_C$=a.{n,}b requires a matching substring to have at least n characters appearing after the initial "a," the match signal from CAM row 110(1) does not enable CAM row 110(3) and does not serve as the RST signal for counter circuit 410, as in the case for $R_C$=a.{0,n}b depicted in FIG. 6C. Also, in contrast to FIG. 6C, the OUT2 line of counter circuit 410 in FIG. 6D is routed as an enable signal to CAM row 110(2) so that CAM row 110(2) remains active and asserts ACT and INC (e.g., to increment CNT) upon each subsequent character match with the wildcard stored therein.

Figure 6E:
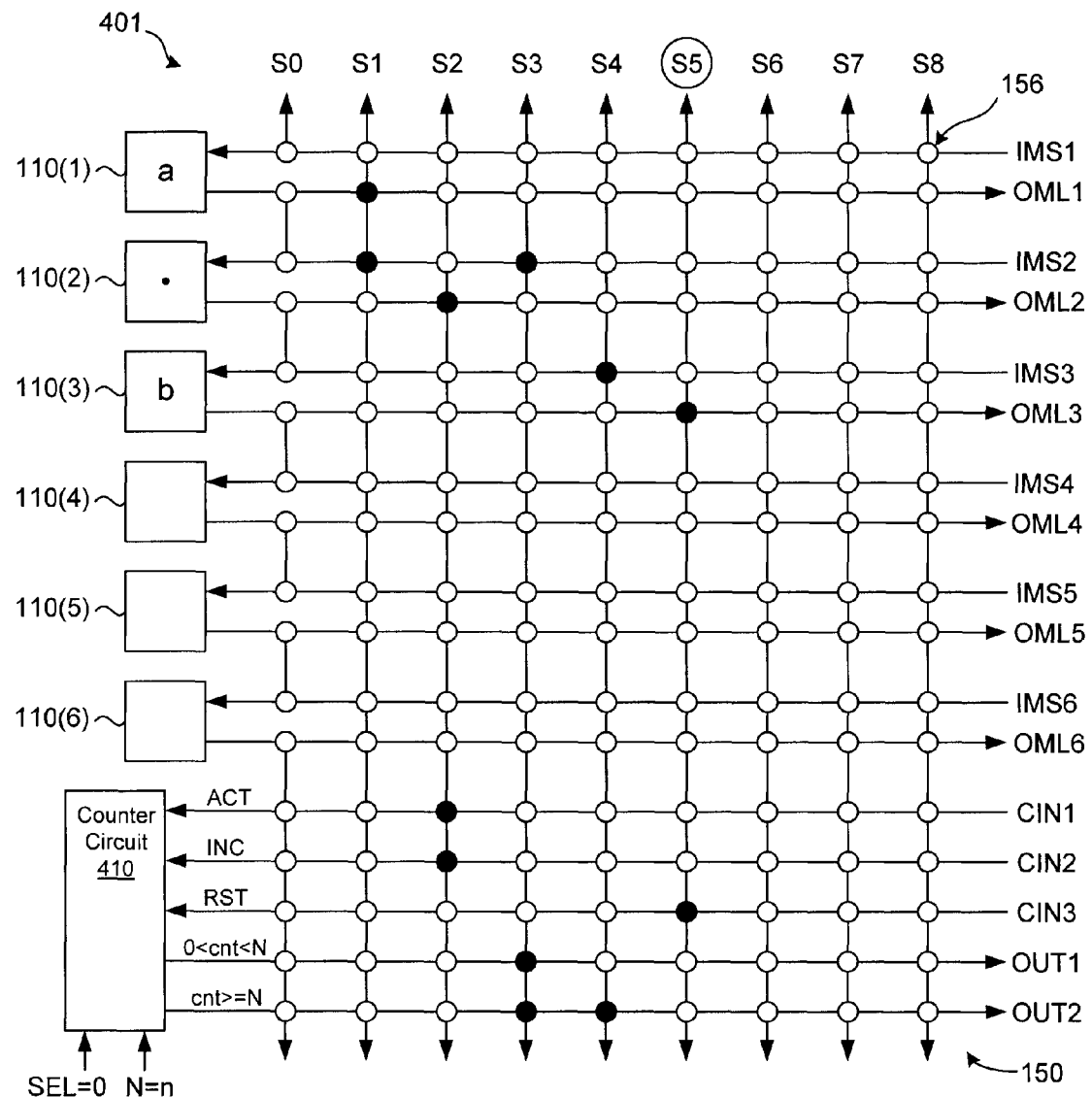
FIG. 6E shows an embodiment of the CAM array of FIG. 4B configured to implement search operations for the regular expression $R_E$=a.{n,}?b.

FIG. 6E shows an embodiment of CAM array 401 configured to implement search operations for the regular expression $R_E$=a.{n,}?b. The symbol "?" causes the quantifier "{n,}" to be non-greedy, which means that it will match the minimum number of times possible (e.g., the shortest possible matching substring is detected, and the search operation is terminated). The storage of characters in CAM rows 110 (1)-110(3) and the configuration of the PRS 150 for FIG. 6E is the same as for FIG. 6D, except that the match signal from CAM row 110(3) is routed as RST to counter circuit 410. In this manner, when a match is detected between an input string and $R_E$=a.{n,}?b, as indicated by a match condition in CAM row 110(3), assertion of the match signal on OML3 causes counter circuit 410 to reset CNT=0, which in turn results in the de-assertion of OUT1 and OUT2 and thus the disabling of CAM rows 110(2) and 110(3).

Figure 6F:
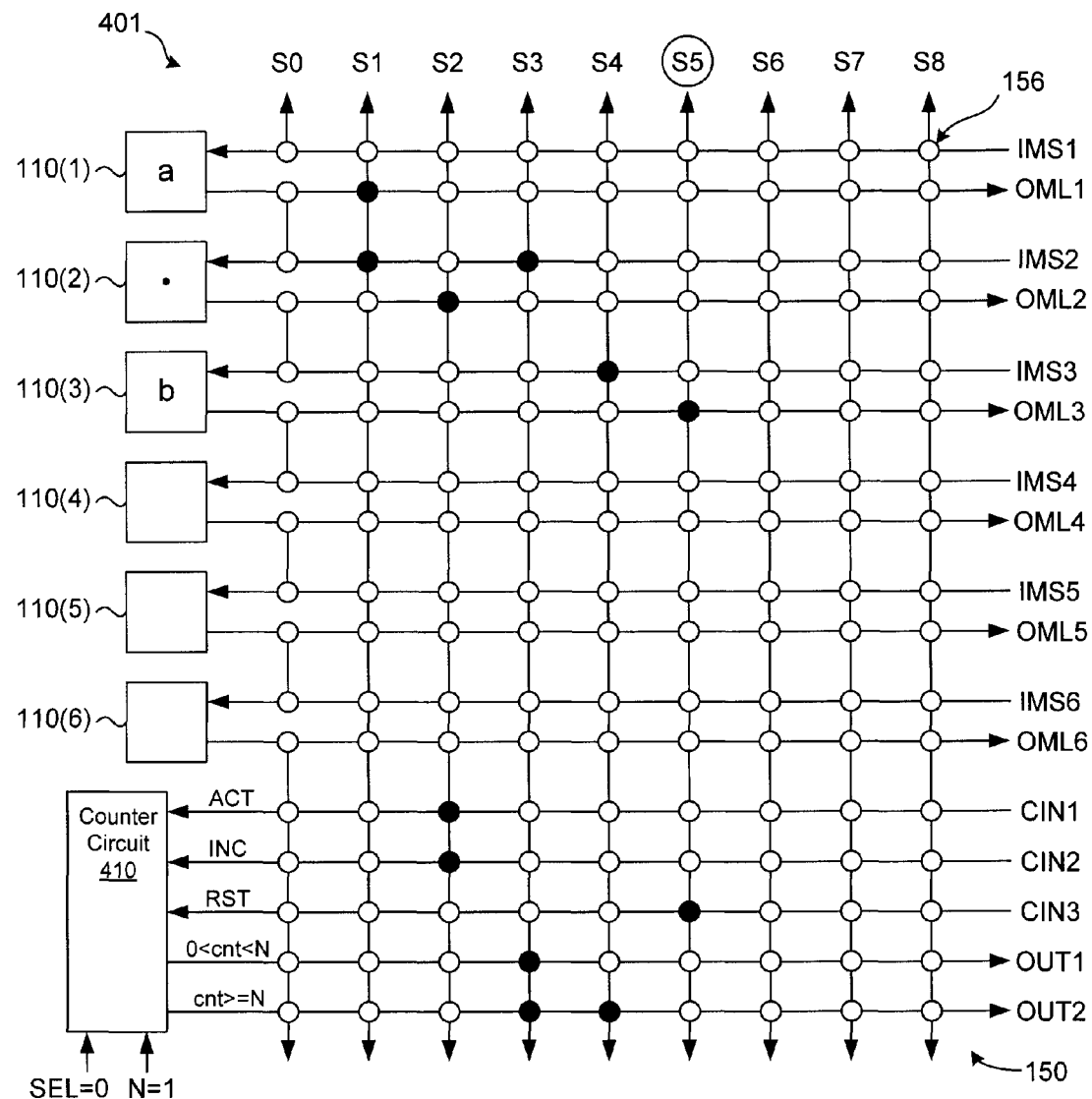
FIG. 6F shows an embodiment of the CAM array of FIG. 4B configured to implement search operations for the regular expression $R_F$=a.+?b.

FIG. 6F shows an embodiment of CAM array 401 configured to implement search operations for the regular expression $R_F$=a.+?b. The storage of characters in CAM rows 110 (1)-110(3) and the configuration of the PRS 150 for FIG. 6F is the same as for FIG. 6E, except that the target value N=1 is stored in counter circuit 410. Note that the connection of the match signal from CAM row 110(3) to the RST input of counter circuit 410 makes the quantifier+non-greedy.

Figure 6G:
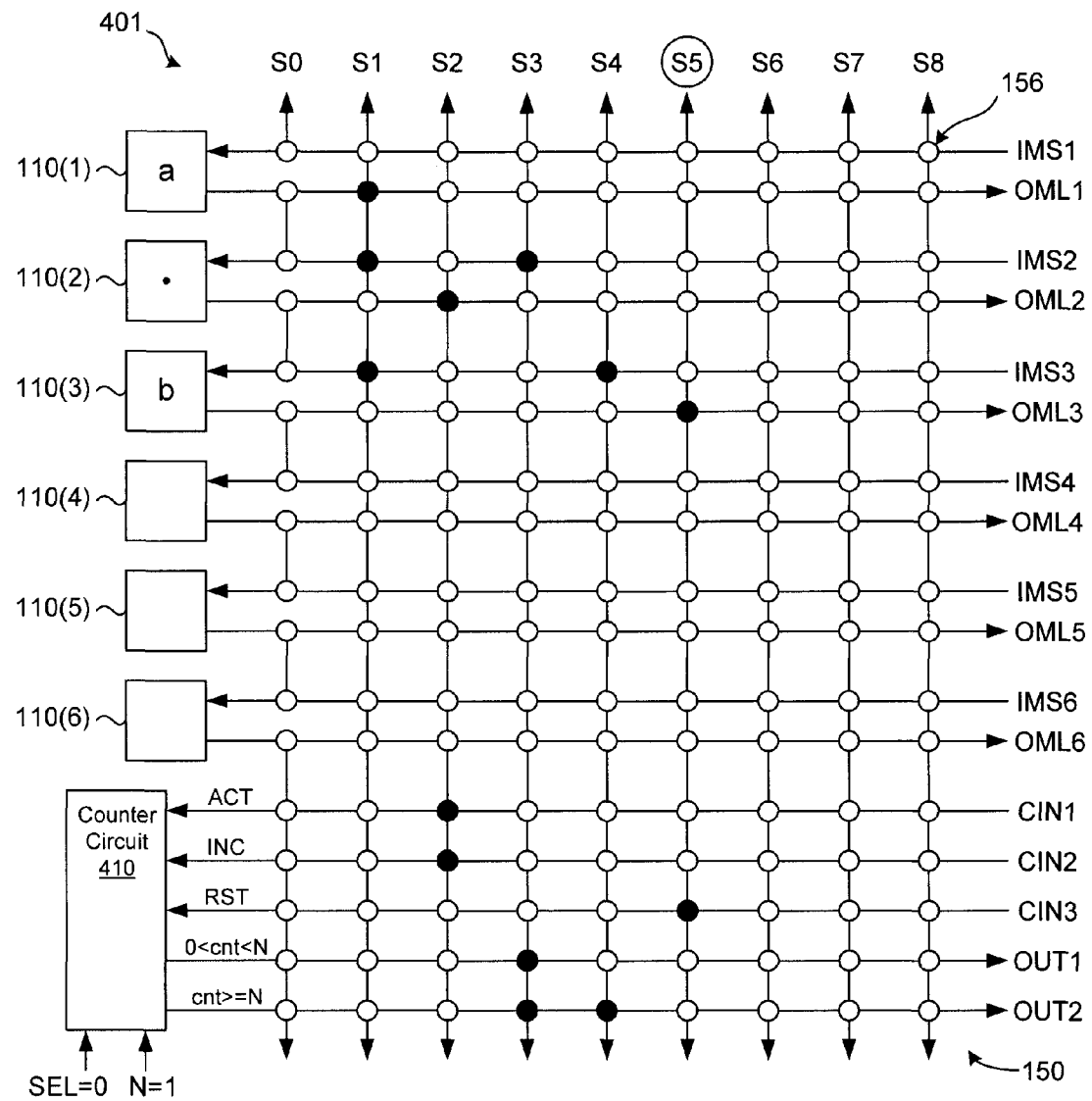
FIG. 6G shows an embodiment of the CAM array of FIG. 4B configured to implement search operations for the regular expression $R_G$=a.*?b.

FIG. 6G shows an embodiment of CAM array 401 configured to implement search operations for the regular expression $R_G$=a.*?b. The storage of characters in CAM rows 110 (1)-110(3) and the configuration of the PRS 150 for FIG. 6G is the same as for FIG. 6F, except that the match signal from CAM row 1110(1) is also routed to the IML3 line of CAM row 110(3). In this manner, a match between an "a" in the input string and the "a" stored in CAM row 110(1) concurrently enables CAM rows 110(2) and 110(3), thereby allowing an input string with 0 or more instances of any characters between the prefix "a" and suffix "b" to match $R_G$=a.*?b. Note that the connection of the match signal output from CAM row 110(3) to the RST input of counter circuit 410 makes the quantifier * non-greedy.

Figure 6H:
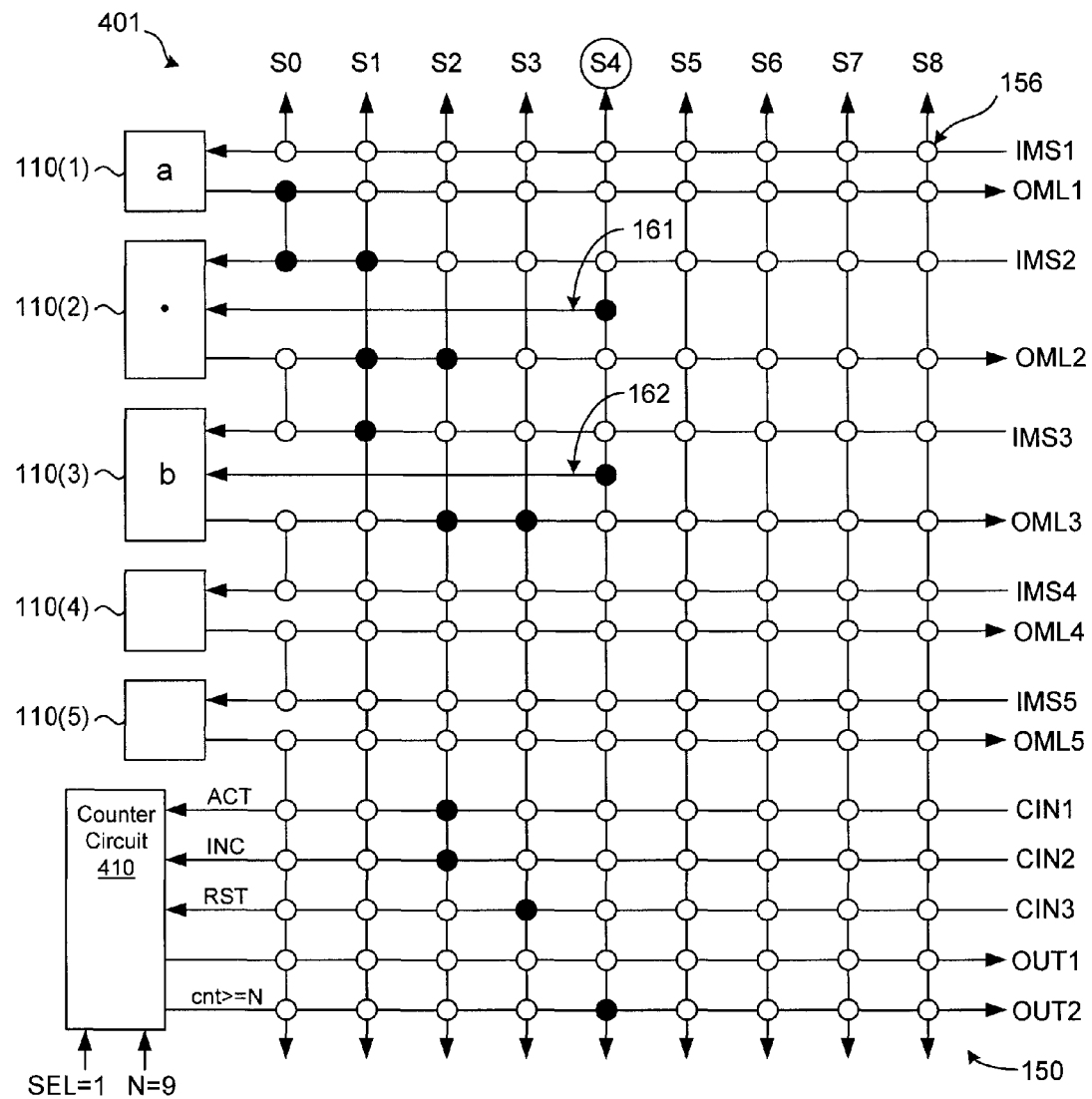
FIG. 6H shows an embodiment of the CAM array of FIG. 4B configured to implement search operations for the regular expression $R_H$=a.+b with a minimum match length value of MML=10.

FIG. 6H shows an embodiment of CAM array of 401 configured to implement search operations for the regular expression $R_H$=a.+b with a minimum match length value of MML=10. The storage of characters in CAM rows 110(1)-110(3) is the same as for FIG. 6F. The OML of CAM row 110(1) is connected to the IML of CAM row 110(2) so that a match with "a" enable the wildcard CAM row 110(2) for the next compare operation. The OML of CAM row 110(2) is connected to the IML of CAM rows 110(2) and 110(3) so that a match with the wildcard in CAM row 110(2) enables both CAM rows 110(2) 110(3) for the next compare operation. The OMLs of CAM rows 110(2) and 110(3) are connected to the ACT and INC inputs of counter circuit 410 so that a match with either the wildcard stored in CAM row 110(2) or the "b" stored in CAM row 110(3) causes counter circuit 410 to increment CNT by one. The OML of CAM row 110(3) is also connected to the RST input of counter circuit 410 so that a match with the "b" stored in CAM row 110(3) causes counter circuit 410 to output the OUT2=CNT÷N signal to the PRS 150. Further, the mode select signal SEL is set to SEL=1, and the target N=9 is stored in counter circuit 410 so that the CAM array is configured to determine whether an input string of least 10 characters matches the regular expression $R_H$=a.+b. To implement the minimum match length, the search operation should terminate after a matching input string of the specified minimum length is detected.

More specifically, to terminate the search operation upon the match detection, the OUT2 of counter circuit 410 is coupled to CAM row 110(2) via a first "killer" line 161 and to CAM row 110(3) via a second killer line 161. When counter circuit 410 asserts OUT2 to indicate a match between a 10-character input string and the regular expression $R_H$, the asserted OUT2 signals is routed to disable inputs of CAM rows 110(2) and 110(3) via killer lines 161 and 162, respectively. In response thereto, CAM rows 110(2) and 110(3) are disabled, irrespective of the state of the input signals on their IMS lines. In this manner, when an input string having the specified minimum match length is detected, assertion of OUT2 by counter circuit 410 disables the CAM rows 110 and thereby terminates the search operation. For some embodiments, each CAM row can include a kill logic circuit (not shown for simplicity) having a first input to receive the input match signal from the row's IMS line, a second input to receive the kill signal from the row's killer line, and an output to provide the row enable signal to the row's match line pre-charge circuit (see also FIG. 3A). Thus, for some embodiments, the kill logic circuit passes the input match signal to the match line pre-charge circuit 302 if the kill signal is not asserted and forces row enable signal to logic low (e.g., to disable the CAM row) if the kill signal is asserted.

Figure 8A:
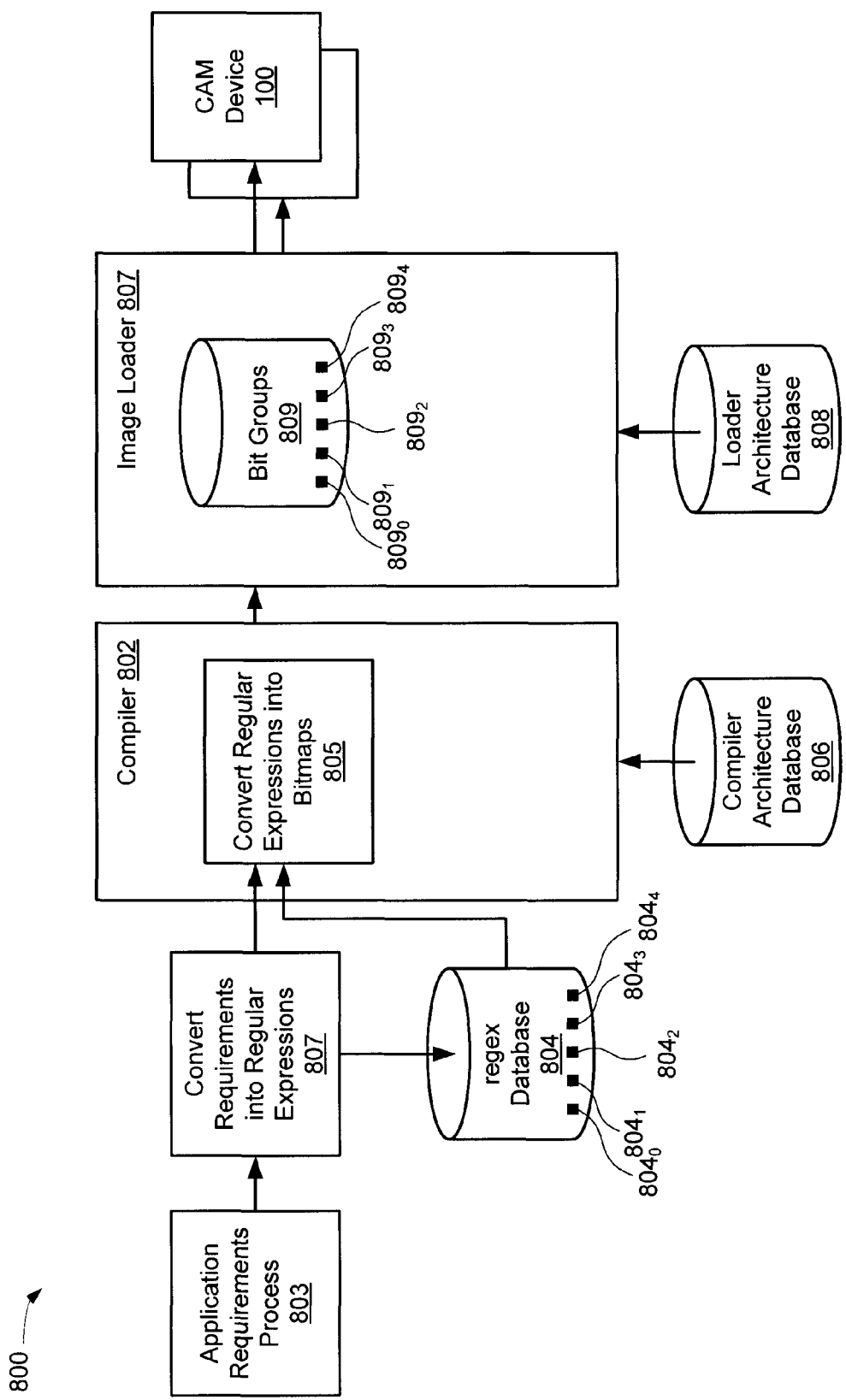
FIG. 8A depicts an environment for compiling a regular expression into bit groups for controlling a programmable TCAM device.

FIG. 8A depicts an environment 800 for compiling a regular expression into bit groups that can be used to program a programmable TCAM device such as CAM device 100 of FIG. 1. In the environment shown, steps for programming the TCAM device using a compiler can commence as soon as there is at least one application requirement accessible from an application requirements process 803. Such applications can include, for example, intrusion detection systems (IDS) and/or virus protection systems, and the requirements can include specific policy-based routing functions, internet and text search operations, document comparisons, and so on. An application requirements process can be codified as human-readable descriptions, such as "mark all messages containing the string "ci/-\lis" as spam", or "discard any network packets from IP address='127.192.148.XXX'". When application requirements can be codified into one or more regular expressions, a module 807 to convert requirements into regular expressions can employed for storing regular expressions into a regular expression database 804. For some embodiments, the module 807 can be computer-aided, relying in whole or in part on manual steps. For other embodiments, the module 807 can be fully automatic in the conversion of application requirements into one or more representations (e.g., optimized regular expressions) suitable for storing regular expressions into regex database 804 for subsequent use.

For other embodiments, regular expressions (e.g., rules associated with one or more ACLs provided by a network administrator) can be stored directly into the regex database 804.

A compiler 802 can be employed for compiling such representations into architecture-dependent bit groups 809 that control operations of programmable TCAM devices. For some embodiments, the bit groups can be provided to an image loader 807 that controls programming of one or more associated CAM devices 100. The compiler 802 can be embodied as a compiler or as a compiler-compiler. In either case, compiler 802 can invoke various modules, including a module to convert a regular expression into a bit map 805. Any constituent module of compiler 802, or any constituent module within the environment as shown, can selectively access a compiler architecture database 806. Also, image loader 807 can selectively access a loader architecture database 808. In some embodiments, the compiler architecture database 806 and the loader architecture database 808 are the same database.

Image loader 807 communicates with CAM device 100 over a link (as shown) to load architecture-dependent bit groups therein to program the CAM device 100 to implement search operations for a number of regular expressions. In some embodiments, the image loader 807 communicates with the CAM device 100 over a link capable of transmitting a memory load module in a file format. Envisioned file formats include formatting bit groups in blocks that are described to include a record type (e.g., a bit group destined for CAM cells within the CAM device's array, a bit group destined for a PRS, or a bit group destined for sequencing logic circuit and/or counter circuit), an initial load address (e.g., a bit position, or an array address, etc), a character string (e.g., a string of hex-formatted numbers, a string of octal-formatted numbers, a string of ones and zeroes, etc), and a checksum value. Other formats using ASCII characters, Unicode characters, and even binary representations are possible and envisioned.

More specifically, for some embodiments, the compiler 802 is configured to convert the regular expression into a number of first bit groups, a number of second bit groups, and a number of third bit groups, where the first bit groups embody a number of characters of the regular expression, the second bit groups embody a number of metacharacters of the regular expression, and the third bit groups embody a number of quantifiers of the regular expression. Then, referring also to FIGS. 1-2, 3A-3C, 4A and 5A, the image loader 807 can be configured to load the first bit groups into the CAM cells 112, to load the second bit groups into a number of memory elements 352 that control configuration of the PRS 150, and to load the third bit groups into the counter circuits 405 and/or 410. For example, for the exemplary regular expression $R_A$="a(bc|de){50}f" described above with respect to FIG. 6A, the compiler 802 generates a number of first bit groups that embody the characters "a", "b", "c", "d", "e", and "f", generates a number of second bit groups that embody the metacharacter "|", and generates a number of third bit groups that embody the quantifier {50}. Then, referring also to FIG. 6A, the image loader 807 loads the first bit groups embodying the characters "a", "b", "c", "d", "e", and "f" into the CAM cells 112 of corresponding CAM rows 110(1)-110(6), loads the second bit groups embodying the metacharacter "|" to configure the PRS 150 to implement the logical OR function, and loads the third bit groups embodying the quantifier {50} into the counter circuit 410.

As earlier mentioned, compiler 802 can be embodied as a compiler or as a compiler-compiler, in which latter case compiler 802 can include a parser or interpreter to generate compiler code (e.g., semantic action routines) from some form of formal description (e.g., a BNF description). Also, compiler 802 can employ data structures used in the compiler arts, such as representing the compiler mapping problem as a multi-commodity network flow (MCNF) problem, or representing the compiler mapping problem in a control data flow graph (CDFG). In addition, compiler 802 can employ techniques for register allocation, techniques for managing asynchronous events, techniques for enumerating and evaluating feasible solutions, and techniques for optimizations, possibly including Lagrangian relaxation of constraints.

Figure 8B:
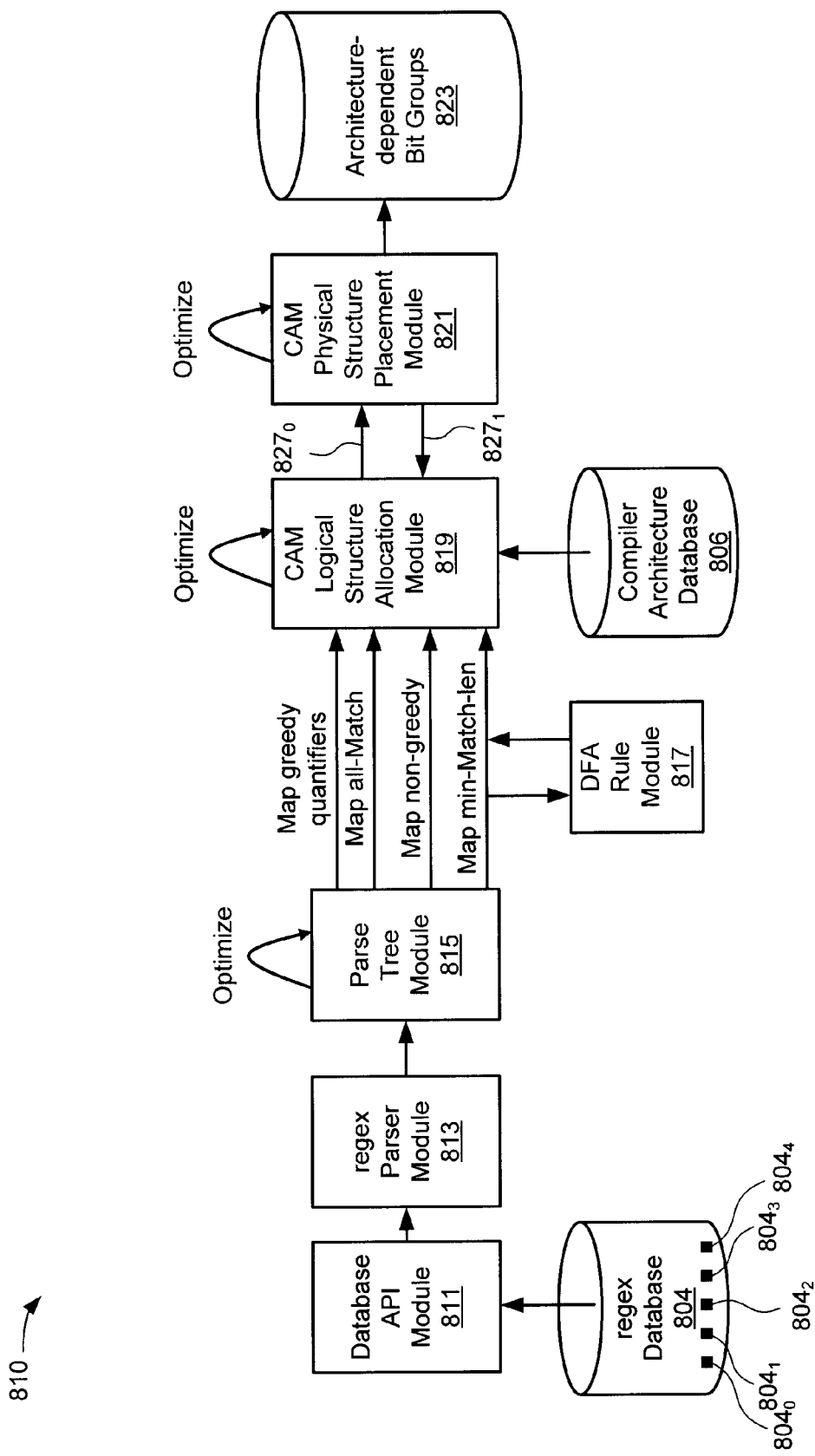
FIG. 8B depicts a flow through various modules of a compiler in accordance with some embodiments.

FIG. 8B depicts a flow 810 through various modules constituent to compiler 802. As shown, a database API module 811 reads original or source regular expressions from regex database 804 for passing to a regex parser module 813. For some embodiments, the source regular expressions can be provided by a network administrator, for example, as part of an ACL, virus list update, and/or other filtering or routing requirement. The regex database 804 may contain regular expressions of various exemplary complexity levels or types, for example, a type-I regular expression $804_1$, a type-II regular expression $804_2$, a type-III regular expression $804_3$, a type-IV regular expression $804_4$, and/or a regular expression $804_0$ that has not been explicitly classified. The various exemplary complexity types or levels of regular expressions, as used herein, are described in more detail below with respect to FIGS. 10A-10B.

The regex parser module 813 can store and analyze a parse tree, for example, using a parse tree module 815. As is generally known in the art, such parsers accept representations in a formally-defined syntax (e.g., in the formally-defined syntax of a regular expression) and produce representations that embody semantics. In the example as shown, the regex parser module 813 cooperates with the parse tree module 815 to map (i.e. extracts semantics) a regular expression into, for example, "greedy quantifier" expression constituents, "all-match" expression constituents, "non-greedy quantifier" expression constituents, and "minimum-match-length" expression constituents. In some cases, parse tree module 815 can map a regular expression (or portion of a regular expression) into a state machine representation (e.g., a deterministic finite automaton, DFA) using a DFA rule module 817. In other cases, parse tree module 815 can map a regular expression (or portion of a regular expression) a particular PRS configuration and to one or more counter circuits within the associated CAM-based search engine.

Then, a further mapping to programmable structures within CAM device 100 can take place in a process such as is represented by the CAM logical structure allocation module 819. Such a process maps the semantics of the regular expression into various logical and/or programmable structures available in CAM device 100 as identified by the compiler architecture database 806. Because there may be multiple possible mappings, CAM logical structure allocation module 819 can be configured to optimize the mappings to find one or more optimal solutions from among the multiple possible mappings to logical structures, and can be further configured to a cost function to evaluate the optimality of each mapping.

Next, a selected (possibly optimal) allocation of logical structures is then mapped to available physical structures within the CAM device 100. That is, even though parse tree module 815 can map a regular expression (or portion of a regular expression) into a state machine representation using one or more counters and one or more particular PRS configurations, it remains to map the logical structures (e.g., counters, PRS configurations, and CAM cells) to available physical structures. For some embodiments, the availability of physical structures within the CAM device 100 can be managed by a CAM physical structure placement module 821. More specifically, CAM physical structure placement module 821 can be configured to optimize the mappings to find one or more optimal solutions from among the multiple possible mappings to logical structures, and can be further configured to employ a cost function to evaluate the optimality of each mapping. In some cases, CAM logical structure allocation module 819 can be configured to optimize in cooperation with a CAM physical structure placement module 821, communicating over path $827_1$ (and/or path $827_0$), to optimize solutions under constraints of physically feasible solutions.

One or more (possibly optimal) mappings can be stored as a binary image 823 of architecture-dependent bit groups 809 that can be loaded (e.g., using image loader 807) into one or more CAM devices 100, for example, in the manner described above with respect to FIG. 8A. Thus, the bit groups 809 can contain various binary representations of characters and/or symbols to be loaded into various programmable structures (e.g., CAM cells, counter circuits, the PRS) associated with CAM device 100 of FIG. 1. For example, the bit groups 809 can contain bit groups including literals $809_0$, bit groups including non-greedy quantifiers $809_1$, bit groups containing intervals $809_2$, bit groups including a greedy quantifier $809_3$, bit groups containing an instruction $809_4$, and/or any other representations of semantics of a regular expression.

In addition to the aforementioned programmable structures, programmable structures may include circuits specifically dedicated to handling configuration of configurable logic circuits within a CAM array, for example, using row configuration data (RCFG as shown in FIG. 1), and/or routing control signals (RCTR as shown in FIG. 1), or any other bit groups intended for any other programmable structures within the associated CAM device 100. In some embodiments, a configuration circuit (further discussed below) is specifically provided for receiving bit groups via a regular expression bus (RBUS as shown in FIG. 1), and used to load bit groups into the CAM device's programmable structures. In other embodiments, sequential element chains (e.g., JTAG scan chains) may be used for loading bit groups into the CAM device's programmable structures.

Accordingly, the compiler 802 can be used to embody one or more regular expressions as bit groups that can be loaded into programmable structures (e.g., the PRS 150, counter circuits 410 and/or 710, and the CAM cells 112) identified in the associated CAM device or other search engine. In particular, using the facilities of a compiler 802, the user can easily add, delete, and/or modify the regular expressions stored in and searched by CAM devices.

Following the aforementioned flow, the structure and operations in the environment 800 of FIG. 8A compile a source regular expression (e.g., from regex database 804) into bit groups (e.g., bit groups 809) for controlling programmable structures within CAM device 100. As shown and discussed in the description of FIG. 8A and FIG. 8B, the embodiment of compiler 802 includes modules for parsing the source regular expression (e.g., regex parser module 813), compiling the source regular expression into an architecture-dependent regular expression (e.g., using CAM logical structure allocation module 819 and CAM physical structure placement module 821), and converting the architecture-dependent regular expression into a plurality of bit groups, where for some embodiments at least a portion of the bit groups includes representation of at least one greedy quantifier (e.g., greedy quantifier $809_3$).

Figure 11:
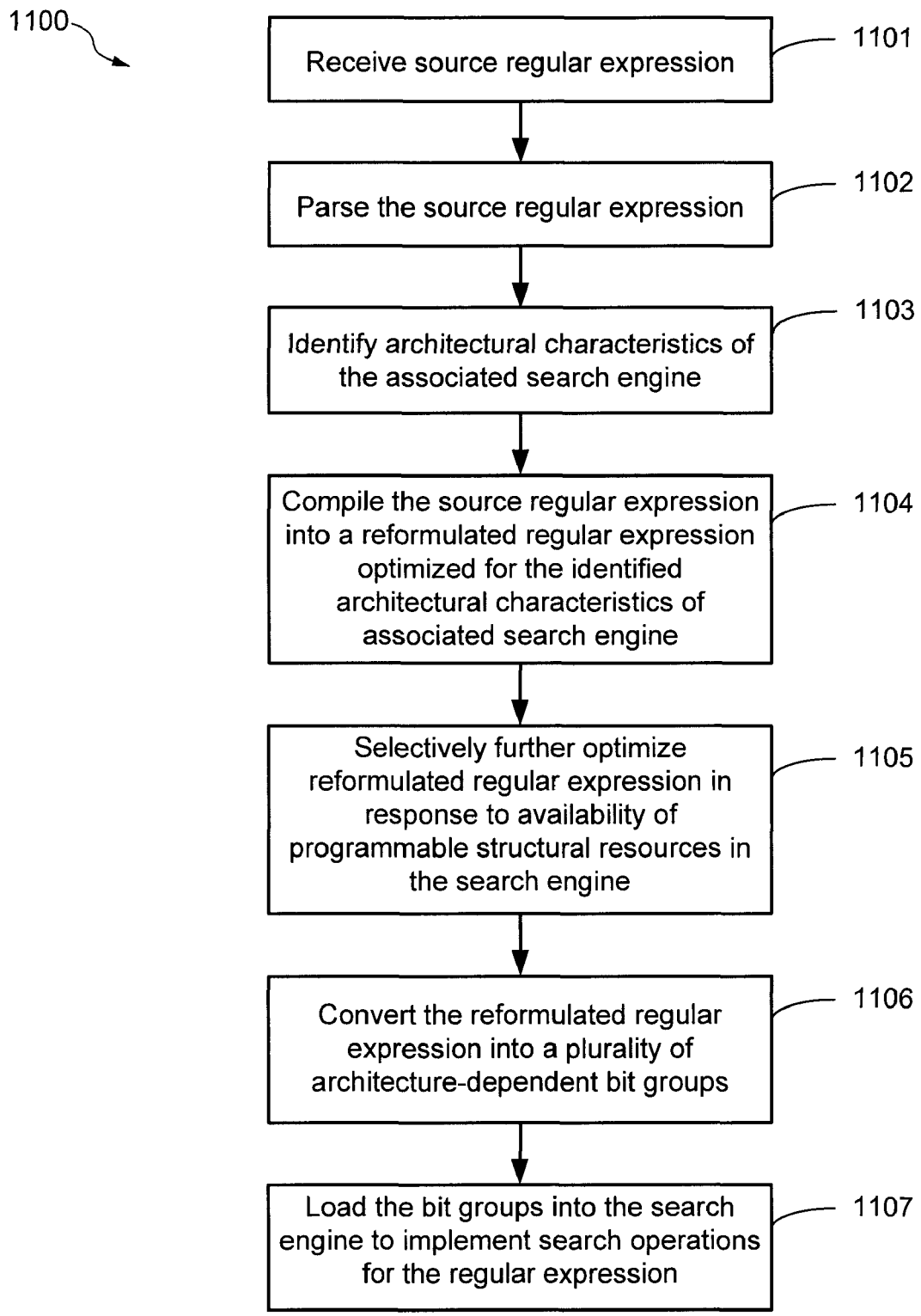
FIG. 11 shows an illustrative flow chart 1100 depicting an exemplary operation of programming a regular expression into an associated search engine in accordance with some present embodiments.

FIG. 11 shows an illustrative flow chart 1100 depicting an exemplary operation of programming a regular expression into an associated search engine in accordance with some present embodiments. First, the source regular expression is received, for example, from a network administrator (1101). Then, the source regular expression is parsed (e.g., using parser module 813) to map the regular expression into various constituents (1102). Next, the architectural characteristics of the associated search engine are identified, for example, by extracting data from the compiler architectural database (1103). Recall that the architectural characteristics of the associated search engine include the configuration, arrangement, and numbers of various programmable structures of the search engine that are used to store and implement search operations for the regular expressions. For example, if the associated search engine is CAM device 100 having CAM array 401 of FIG. 5A, the programmable structures can include elements such as the PRS 150, the counter circuits 410, and the CAM cells, and the associated architectural characteristics can include the arrangement and numbers of such programmable structures.

Next, the source regular expression is compiled (e.g., using compiler 802) into a reformulated (and equivalent) regular expression that is optimized for the identified architectural characteristics of the associated search engine (1104). For some embodiments, the reformulated regular expression can be further optimized in response to the availability of the programmable structures within the search engine (1105). Then, the reformulated regular expression is converted into a plurality of architecture-dependent bit groups (1106), which are then loaded into memory locations that control the configuration and operations of various programmable structures (e.g., CAM cells, the PRS, and/or embedded counter circuits) within the associated search engine (1107).

As described above, the image loader 807 can download into CAM device 100 bit groups that embody compiler-produced representations of the regular expressions. For the exemplary embodiment of FIG. 8A, the CAM device 100 includes circuits for receiving regular expressions (e.g., formatted as a plurality of compiled architecture-dependent bit groups), and the programmable structures of the CAM device 100 include a plurality of programmable bit locations for storing the bit groups. For some embodiments, a portion of the bit groups includes greedy quantifiers $809_3$. For example, referring also to FIGS. 1-3, bit groups 809 can include instructions $809_4$ that are provided on the instruction bus (IBUS) to commence various operations (e.g., read, write, configuration, and compare operations) of CAM device 100. For configuration operations, the PRS 150 can be selectively configured by compiler-generated instructions or other compiler-generated bit groups to route the match signals from any CAM row 110 as an input match signal to any number of other arbitrarily selected or located CAM rows 110 at the same time, regardless of whether the other selected CAM rows are contiguous with one another, in the manner described above to implement search operations for regular expressions embodied within the CAM device 100.

For example, referring again to the example depicted in FIG. 7B, the dynamic configurability of PRS 150 using compiler-generated bit groups for storing into memory elements associated with the PRS 150 allows the CAM device 100 to store REG1="ab(c|d)" in its rolled format using only four CAM rows because the common portion "ab" of the two possible matching strings "abc" and "abd" can be stored in only one group of CAM rows and their match signals can be simultaneously routed to other CAM rows that store "c" and "d". Thus, the characters "a", "b", "c", and "d" can be stored in CAM rows 1-4, respectively, of CAM device 100, and the match signal of the common data word chain "ab" ending at row 2 can be simultaneously routed as input match signals to both CAM rows 3 and 4 so that CAM row 3 can detect a match with "abc" concurrently and independently of CAM row 4 detecting a match with "abd". Compiler operations such as operations related to the aforementioned 'unrolling' may be performed by compiler 802 of FIGS. 8A-8B using rules, predicate logic, heuristics, or any other suitable compiler techniques.

As mentioned above, as the number of possible matching strings of a regular expression increases, the reduction in memory area (e.g., the number of CAM rows) achieved by the present embodiments also increases (e.g., as compared to the '789 patent). Thus, compilers configured in accordance with present embodiments can perform one or more optimizing passes to optimize for a given cost function (e.g., an area cost function). For example, as described above with respect to FIG. 7C, the CAM device of the '789 Patent requires 18 CAM rows to store the regular expression REG2="ab(cd|ef|gh)uv" because REG2 needs to be unrolled to generate all possible matching strings (i.e., S1="abcduv", S2="abefuv", and S3="abghuv"), which are then stored separately in three groups of six contiguous and sequentially connected CAM rows. However, because embodiments of CAM device 100 can selectively, simultaneously, and independently route the match signals from any CAM row to any number of other arbitrarily located CAM rows, REG2 does not need to be unrolled for storage in CAM device 100. Rather, each common portion of the possible matching strings of REG2 can be stored in a single location in the CAM array 102, and the PRS 150 can be programmed with compiler-generated bit groups to route the match signals of the common portion to the other non-common portions at the same time according to the logical operators specified in REG2. In other words, the strings appearing between logical operators as expressed using the unrolled form of the regular expression can be stored in corresponding groups of CAM rows of the CAM device, and the PRS can be programmed to logically connect the groups of CAM rows according to the logical operators. In this manner, embodiments of CAM device 100 require only 10 CAM rows to store REG2="ab(cd|ef|gh)uv", as depicted in FIG. 7C.

Conversely, the compiler 802 (together with conversion module 805 and compiler architecture database 806) can convert the regular expression REG2="ab(cd|ef|gh)uv" into an unrolled form for storage in CAM devices of the type disclosed in the '789 Patent (e.g., CAM devices without a PRS). The determination to use a rolled form or an unrolled form depends, at least in part, on the characteristics of the data found in compiler architecture database 806. For example, Table 5 shows several possible characteristics of data found in compiler architecture database 806.

TABLE 5

| RegEx | Characteristic Found in Compiler Architecture Database | Compiler Operation Candidate |
|---|---|---|
| ab(cd|ef|gh)uv | target_device_has_PRS = NO | use unrolled forms abcduv (6 rows) abefuv (6 rows) abghuv (6 rows) |

TABLE 5-continued

| RegEx | Characteristic Found in Compiler Architecture Database | Compiler Operation Candidate |
| --- | --- | --- |
| ab(cd\|ef\|gh)uv | target_device_has_PRS = YES | use rolled forms abcduv (6 rows) abefuv (2 more rows) abghuv (2 more rows) |

Figure 8C:
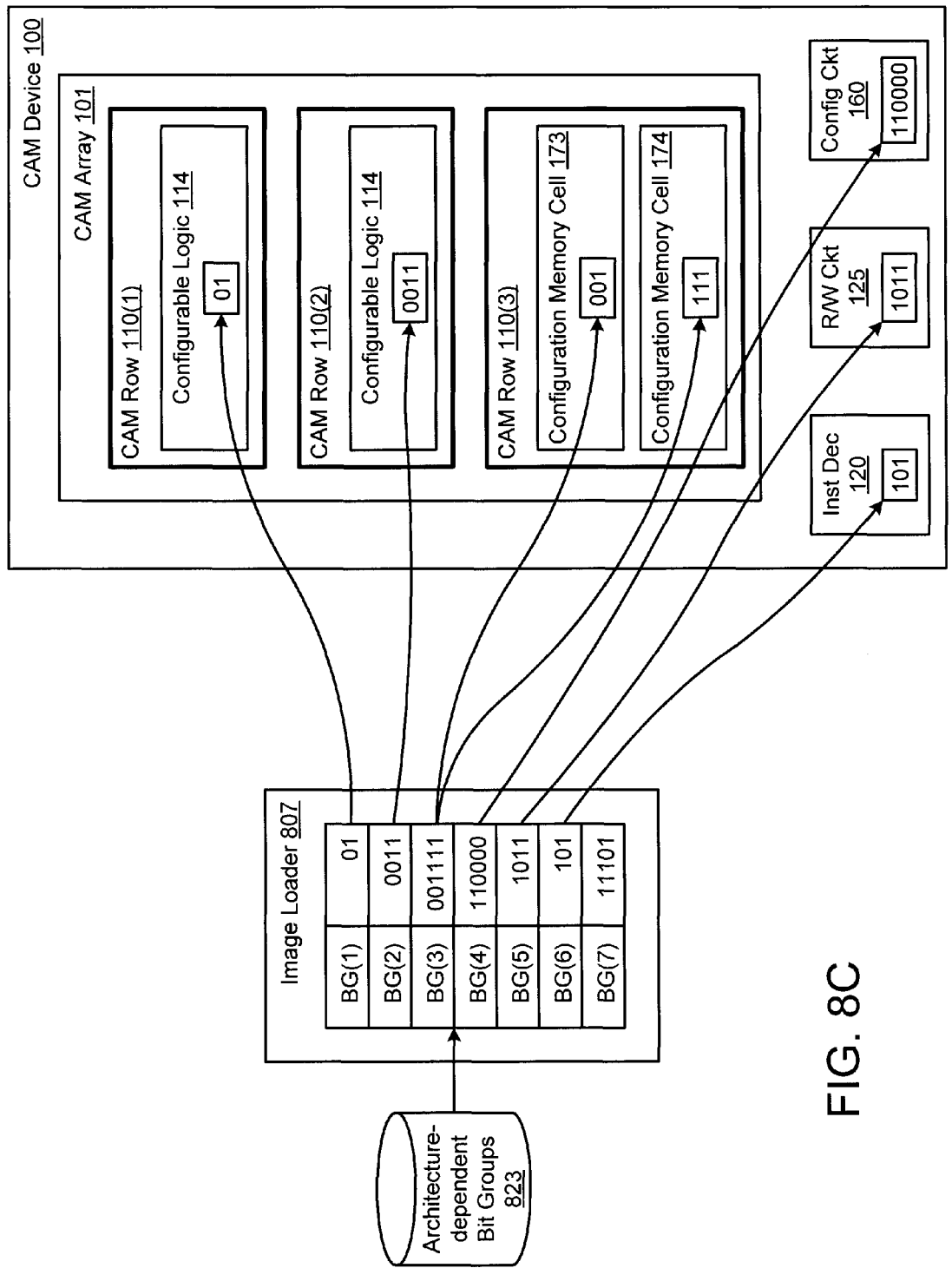
FIG. 8C is a schematic depiction of the flow of bit groups from a compiler-generated binary image of architecture-dependent bit groups to and through an image loader, and into configurable memory locations within a programmable TCAM device.

FIG. 8C is a schematic depiction of the flow of bit groups from a compiler-generated binary image 823 of architecture-dependent bit groups 809 to memory locations that control configuration of various programmable structures within embodiment of CAM array 101 using the image loader 807. More specifically, as depicted in FIG. 8C, the image loader 807 maps bit groups to specific memory locations within a CAM device 100, and uses one or more techniques for communicating the bit groups to the intended locations. For the exemplary embodiment shown, loading memory cells within an addressable array encompasses loading values into CAM array 101 (see also FIG. 1). Another technique involves loading one or more bit groups into read/write circuit 125 or into configuration circuit 160 of CAM device 100. Yet another technique involves loading one or more bit groups containing instructions into instruction decoder 120 of CAM device 100. For some embodiments, instruction decoder 120 can interpret bit groups as instructions, and can then further interpret a specific bit groups as an instruction, and still further, might consume any other bit groups, interpreting the subsequent bit groups as next instructions, or as data (e.g., corresponding to data operands).

For example, referring also to FIGS. 3B-3C, the compiler 802 can form bit groups to be stored in locations 881 of memory cells 352 for controlling the configuration of PRS 320 in a manner that allows embodiments of CAM array 101 (e.g., CAM array 400 or CAM array 401) to implement search operations for the desired regular expression. As mentioned above, for some embodiments, the memory cells 352 can be formed as a configuration memory array that can be loaded during configuration of embodiments of CAM device 100. Thus, such a configuration memory array can receive a regular expression as a plurality of compiled architecture-dependent bit groups (i.e., into the plurality of programmable bit locations 881 in the configuration memory array).

More specifically, as mentioned above, the compiler 802 can convert the regular expression into a number of first bit groups, a number of second bit groups, and a number of third bit groups, where the first bit groups embody a number of characters of the regular expression, the second bit groups embody a number of metacharacters of the regular expression, and the third bit groups embody a number of quantifiers of the regular expression. Then, the image loader 807 can be configured to load the first bit groups into the CAM cells 112 of CAM rows 110 (e.g., via instruction decoder 120, read/write circuit 125, and/or configuration circuit 160), to load the second bit groups into a number of memory elements 352 that control configuration of the PRS 150 (e.g., via instruction decoder 120 or configuration circuit 160), and to load the third bit groups into the counter circuits 405 and/or 410 (e.g., via instruction decoder 120 or configuration circuit 160).

Figure 7E:
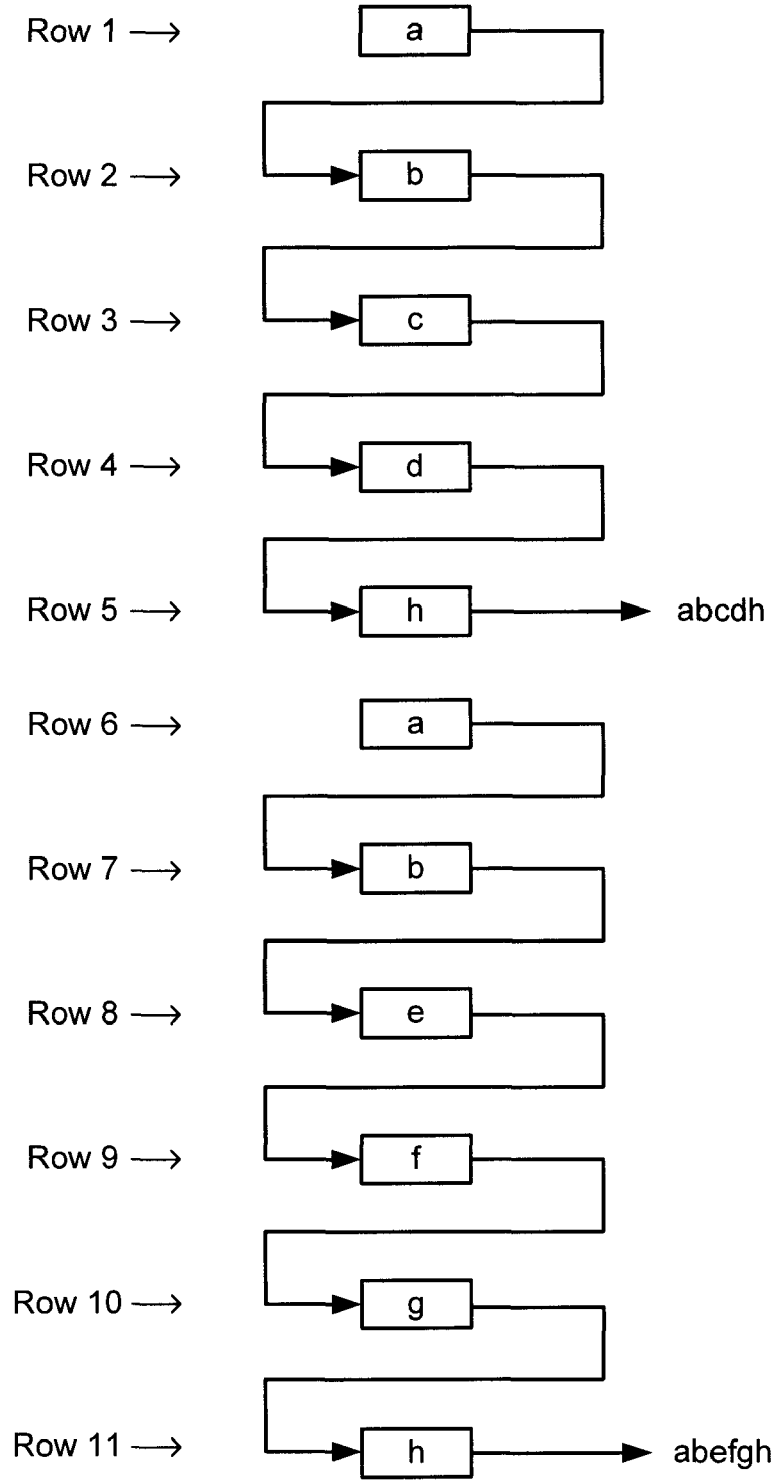
FIG. 7E depicts a prior art CAM device storing the regular expression R10'="abcdh|abefgh" using 11 CAM rows'
Figure 7F:
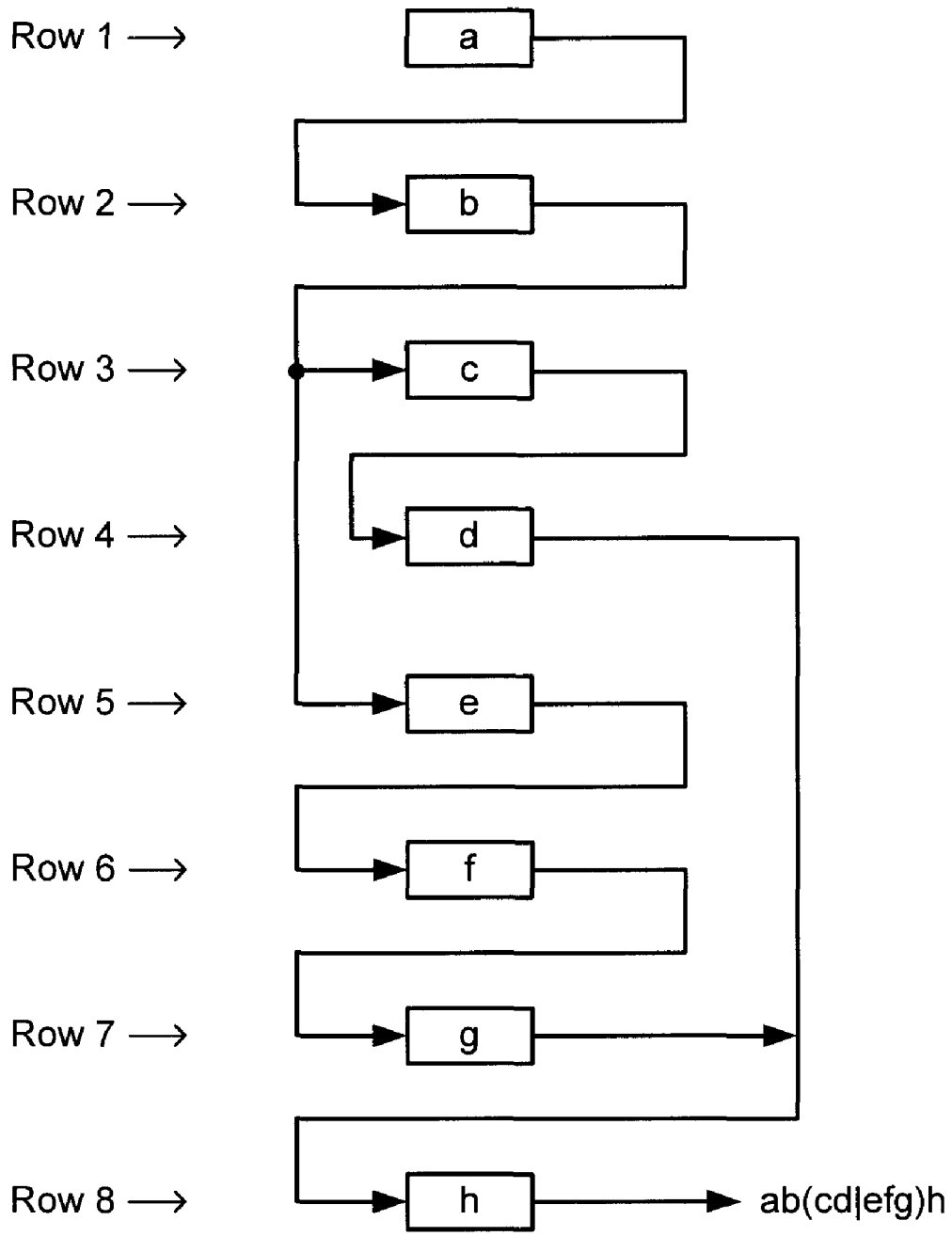
FIG. 7F depicts an exemplary CAM device configured in accordance with present embodiments to store the regular expression REG10="ab(cd|efg)h" using only 8 CAM rows.

FIG. 9A depicts several regular expressions and possible compiler-implemented optimizations. As aforementioned, compiler 802 can include parse tree module 815, CAM logical structure allocation module 819, and CAM physical structure placement module 821, any of which can include one or more optimization passes. For some embodiments of FIG. 9A, one or more parser optimization passes can be used to evaluate regular expressions and consider possible optimizations based upon the arrangement, configuration, and/or availability of the various programmable structures (e.g., CAM rows, counter circuits, and the PRS) of the associated CAM device 100. For one example, compiler 802 can selectively perform a mid-level alternations split optimization operation to reformulate an original regular expression R10="ab(cd|efg)h" to generate an equivalent reformulated regular expression R10'="abcdh|abefgh" for mapping to a CAM device having CAM array that does not include the PRS 150 described above with respect to FIGS. 1-3 which, for example, would require 11 CAM rows of the conventional CAM device of the type disclosed in U.S. Pat. No. 6,252,789, as depicted in FIG. 7E. This in contrast to CAM device 100 having a PRS, which can store the equivalent regular expression R10="ab(cd|efg)h" in only 8 CAM rows 110, as depicted in FIG. 7F. Thus, depending upon the available programmable resources of the associated CAM device (e.g., whether the CAM device includes the PRS 105), the compiler 802 can selectively translate the original regular expression into an equivalent reformulated regular expression that can be mapped to the programmable resources of the associated CAM device.

For another example, the compiler 802 can selectively perform a reroll optimization operation to reformulate an original regular expression R11="abbbbbcd" to generate an equivalent reformulated regular expression R11'="ab{5}cd" for mapping to a CAM device 100 including a CAM array 400 having a PRS and a counter circuit such as counter circuit 410 or counter circuit 710, thereby allowing the character "b" to be stored in a single CAM row and using the counter circuit to detect whether 5 instances of the specified character "b" are sequentially detected in the input string. In contrast, if the associated CAM device does not include a PRS 150 or any counter circuits (e.g., CAM devices of the type disclosed in U.S. Pat. No. 6,252,789), the compiler 802 stores the original regular expression R11="abbbbbcd" in the CAM array (e.g., using 8 CAM rows).

For yet another example, the compiler 802 can selectively perform a simplify quantifiers optimization operation to reformulate an original regular expression of form ( . . . | R?| . . . )* to generate an equivalent reformulated regular expression of the form ( . . . |R| . . . )*. For this example, the compiler 802 removes the ? quantifier (which means 0 or 1 times) and makes the expression "R" appear one time. Because there is a "*" quantifier closure on the parenthesis, the reformulated regular expression calls for "R" to appear 0 or 1 times, thereby rendering the reformulated regular expression equivalent to the original regular expression. More specifically, removing the quantifier "?" from the original regular expression reduces the number of PRS state lines used to implement the regular expression in embodiments of CAM array 401 (see also FIG. 5A). More specifically, for an original regular expression R12="a(b|c?|d)*e", the compiler 802 can reformulate R12 into an equivalent regular expression R12'="a(b|c|d)*e" that, when mapped to the CAM array 401 of FIG. 5A, saves one PRS state line because while mapping R12 to CAM array 401 involves routing the OML of the CAM row storing the character "a" as an input match signal to the CAM row storing the character "e" (to skip the character "c"), the presence of the quantifier "*" involves a PRS state line between the CAM row storing the character "a" and the CAM row storing the character "e", and thus an additional PRS state line between the CAM row storing the character "a" and the CAM row storing the character "e" is unnecessary.

FIG. 9B depicts several compiler-implemented optimizations for regular expression characteristics, including optimizations embodied as compiler passes. For some embodiments of FIG. 9B, one or more allocation optimization passes can be used to evaluate regular expression characteristics and consider possible optimizations for mapping to logical and/or physical structures specific to the associated search engine (e.g., CAM device 100). For example, a graph pass for detecting simple overlap might transform the allocation graph for a given regular expression "abcd{50}" to a graph that allocates a suitable programmable sequential structure (e.g., counter circuit 410 of FIG. 5B or counter circuit 710 of FIG. 4B) for compact representation and fast match execution within a CAM architecture akin to CAM device 100. Such an optimization pass (e.g., a graph pass) can transform the syntax of a given regular expression into a different graph representation without changing the semantics of the given regular expression.

In addition, the compiler-implemented optimizations for regular expression characteristics can include optimization techniques to increase the number of feasible solutions to a mapping. For one example, given a CAM device having a programmable interconnect structure (e.g., CAM device 100), although it is reasonable to map a regular expression such as "(|a|a(a|a(a|a(a|aa))))" into the PRS, it might also be reasonable to map such an expression using one or more counters. That is, a semantically equivalent expression "a{0, 5}" (i.e., semantically equivalent to "|a|a(a|a(a|a(a|aa")))" involving an interval quantifier might be mapped into counter values, effectively increasing the number of degrees of freedom, and possibly also the number of feasible solutions to the allocation optimization problem. In some embodiments, an optimization decision made by the compiler 802 depends on the availability of counters and the state of the allocation optimization processing.

For another example, when the associated search engine includes a CAM array 401 having killer lines (see also FIG. 6H), the compiler 802 can compile an original regular expression having a minimum match length value and/or non-greedy quantifiers into a reformulated regular expression optimized to use the killer lines to terminate search operations upon detection of the first (e.g., the shortest) match.

As described above, regular expressions that can be reformed syntactically in terms of quantifiers in the forms of "{n}", "{n,}", or "{m,n}" can be mapped to a variety of sequencing logic circuits (e.g., counter circuit 410 of FIG. 5A or counter circuit 710 of FIG. 4A). Thus, in accordance with present embodiments, the compiler 802 can generate bit groups 809 embodying the quantifiers, and the resulting bit groups 809 can be subsequently loaded into the programmable bit locations 881 associated with such counters using the image loader 807.

Figure 6I:
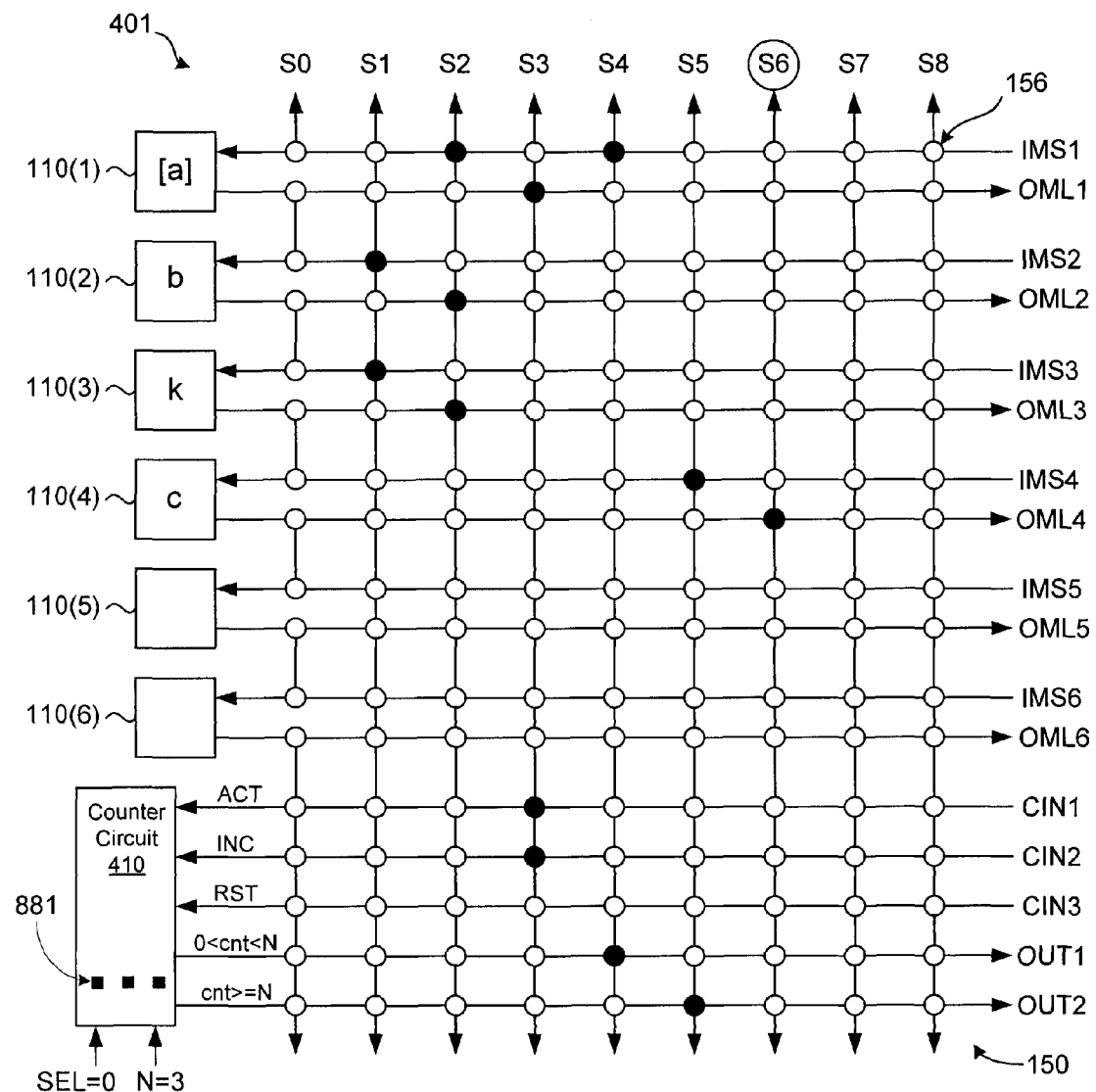
FIG. 6I shows an embodiment of the CAM array of FIG. 4B configured to implement search operations for the regular expression $R_I$=(bake)[a]{3}.

For example, FIG. 6I shows CAM array 401 including CAM rows 110(1)-110(6) and counter circuit 410 that are programmed and selectively interconnected via PRS 150 to store and implement search operations for the $R_f$="(b|k)[a]{3}c". CAM row 110(1) stores the character class [a], and is thus denoted as the character class CAM row. CAM rows 110(2)-110(3) store the characters "b" and "k" of the prefix string R1="b|k", and are thus denoted as the R1 CAM rows. CAM row 110(4) stores the character "c", and is thus denoted as the R2 CAM row. The counter circuit 410 is programmed using a compiler-generated bit group (or portion of a bit group) setting N=3 so that the cnt>=N output is asserted when the character class count value CNT=3. Together, character class CAM row 110(1) and counter circuit 410 store and implement search operations for the intermediate expression R3="[a]{3}". Further, the signal routing lines 152 of PRS 150 are selectively connected to the ML and IMS lines of CAM rows 110(1)-110(4) and to the input and outputs of counter circuit 410, as indicated in FIG. 6I, to logically connect CAM rows 110(1)-110(4) and counter circuit 410 in a chain that embodies the regular expression $R_f$="(b|k)[a]{3}c".

The character class CAM row 110(1) provides a character class match signal (MAT_CC) on its output match line OML1, which is routed to the ACT and INC inputs of counter circuit 410 via PRS line S3. Counter circuit 410, which increments the character class match count CNT by 1 upon each consecutive assertion of MAT_CC by character class CAM row 110(1), asserts output signal 0<CNT<N while CNT<3, and then asserts output signal CNT≧N when CNT=m=3. PRS line S4 provides the row enable signal to character class CAM row 110(1), and PRS line S5 provides the row enable signal to R2 CAM row 110(4). Thus, if CNT<m, counter circuit 410 asserts output signal 0<CNT<N to enable the character class CAM row 110(1) to determine if the next input character matches the character class, and if CNT=m, counter circuit 410 asserts output signal CNT≧N to enable the R2 CAM row 110(4) to determine if the next input character matches the suffix string R2.

In this manner, the prefix string R1="b|k" is logically connected to the intermediate expression R3="[a]{3}" by selectively enabling the character class CAM row 110(1) in response to a match condition in either of R1 CAM rows 110(2) or 110(3), and the intermediate expression R3 is logically connected to the suffix string R2 by selectively enabling R2 CAM row 110(4) in response to the trigger signal TRG generated by counter circuit 410.

As can be seen from the example of FIG. 6I, a bit group 809 can be defined for a CAM row, for example CAM row 110(2), or a bit group can be defined for a group of CAM rows, for example CAM row 110(2) through CAM row 110(4), with each row comprising a programmable interconnection point with an input match line and an output match line. Table 6 shows an exemplary collection of compiler-generated bit groups that can be used to program the selective interconnections between the CAM rows 110 of FIG. 6I and the PRS to implement search operations for the regular expression $R_f$="(b|k)[a]{3}c". Note that the bit locations for PRS state lines S7 and S8 are not shown in Table 6 for simplicity.

TABLE 6

| CAM row | Line | S1 | S2 | S3 | S4 | S5 | S6 | Bit Group |
|---------|------|----|----|----|----|----|----|-----------|
| 110(1) | IMS | No | Yes | No | Yes | No | No | '010100' |
| 110(1) | OMS | No | No | Yes | No | No | No | '001000' |
| 110(2) | IMS | Yes | No | No | No | No | No | '100000' |
| 110(2) | OML | No | Yes | No | No | No | No | '010000' |
| 110(3) | IMS | Yes | No | No | No | No | No | '100000' |
| 110(3) | OML | No | Yes | No | No | No | No | '010000' |
| 110(4) | IMS | No | No | No | No | Yes | No | '000010' |
| 110(4) | OML | No | No | No | No | No | Yes | '000001' |

Referring again to FIGS. 8A-8B, embodiments of compiler 802, particularly embodiments that employ a pipeline of modules (e.g., module 815, module 819, module 821) can be further improved by considering not only local minima (e.g., minimum cost solutions based on local constraints), but also multi-stage and/or global minimal solutions. For example, even though a parse tree module can optimize a given regex to the expression "ab+[a-z]{5000}xy", that expression-level optimization is an example of a local minimum, and does not take into account other feasible solutions that may be more globally optimal. For example, it is reasonable to expect that there may be feasible solutions that are minimal based on an allocation of the regular expression to logical structures, and would be processed by a CAM logical structure allocation module 819. Further, it is reasonable to expect that there may be feasible solutions that are minimal based on an allocation of the regular expression to physical structures, and would be processed by a CAM physical structure placement module 821.

Various algorithms are known in the compiler arts that iterate to more globally optimal solutions based on an iteration delta acceptance strategy. In such embodiments, various functions are defined to represent the cost of resources (e.g., logical units, physical units) and, following such a strategy, the algorithm can produce global minima that are far more optimal than local minima. Such algorithms can deal with diverse architectures present in CAMs such as CAM device 100, and may include architectures with counters, multiple counters, counters-plus-FIFOs, and other complex execution units, possibly including multi-cycle operations, chained operations, pipelined datapaths, and pipelines of execution units. In some compiler implementations, to efficiently represent the architectures, a weighted precedence graph is used, upon which graph the allocation algorithm is based. The examples that follow are but a few of the allocations for search operations resulting from the operations of the compiler 802 upon a given regular expression.

Referring again to FIG. 6A, which shows CAM array 401 configured to store and implement search operations for the regular expression $R_A$=a(bc|de){50}f, the compiler 802 organizes bit groups in a manner such that the match character literals (e.g., characters a-f) are stored in CAM rows 110(1)-110(6), respectively, of CAM array 401, and the quantifier value (e.g., the value 50) is stored in programmable bit locations accessible to counter circuit 410. The compiler 802 also stores N=50 in counter circuit 410, and configures the PRS in the manner depicted in FIG. 6A by loading corresponding bit groups in the programmable switches (e.g., see FIGS. 3B-3C) that control the selective interconnections between the CAM rows 110 and counter circuit 410.

For the example of FIG. 6B, which shows CAM array 401 configured to implement search operations for the regular expression $R_B$=ab{n}c, the compiler 802 organizes bit groups in a manner such that the match character literals (e.g., characters a, b, and c) are stored in CAM rows 110(1)-110(3), respectively, of CAM array 401, and the quantifier value (e.g., the numeric value of "n") is stored in programmable bit locations accessible to counter circuit 410. The compiler 802 also stores N=n in counter circuit 410, and configures the PRS in the manner depicted in FIG. 6B by loading corresponding bit groups in the programmable switches that control the selective interconnections between the CAM rows 110 and counter circuit 410.

For the example of FIG. 6C, which shows CAM array 401 configured to implement search operations for the regular expression $R_C$=a.{0,n}b, the compiler 802 organizes bit groups in a manner such that the match character literals (e.g., characters a and b) are stored in respective CAM rows 110(1) and 110(3), the wildcard "." is stored in CAM row 110(2), and the quantifier value (e.g., the numeric value of "0,n") is stored in programmable bit locations accessible to counter circuit 410. The compiler 802 also stores N=n in counter circuit 410, and configures the PRS in the manner depicted in FIG. 6C by loading corresponding bit groups in the programmable switches that control the selective interconnections between the CAM rows 110 and counter circuit 410.

Of course, given numeric values for n and m in the quantifier "{n,m}", the compiler 802 can optimize the regular expression to literals for similar expressions. For example, the previously-described regular expression $R_C$=a.{0,n}b, a similar regular expression $R_{CA}$=a{0,2}b" can be optimized and re-formulated as the regular expressions $R_{CA1}$="b" (where n=0), $R_{CA2}$="ab" (where n=1), and $R_{CA3}$="aab" (where n=2). This optimization choice can be made by the compiler 802 on the basis of the architecture (e.g., as defined by the compiler architecture database 806 and/or the loader architecture database 808), or on the basis of a cost function.

For the example of FIG. 6D, which shows CAM array 401 configured to implement search operations for the regular expression $R_D$=a.{n,}b, the compiler 802 stores the character "a" in CAM row 110(1), stores the wildcard "." in CAM row 110(2), and stores the character "b" in CAM row 110(3). The complier 802 also stores N=n in counter circuit 410, and configures the PRS in the manner depicted in FIG. 6D by loading corresponding bit groups in the programmable switches that control the selective interconnections between the CAM rows 110 and counter circuit 410.

For the example of FIG. 6E, which shows CAM array 401 configured to implement search operations for the regular expression $R_E$=a.{n,}?b,. The symbol "?" causes the quantifier "{n,}" to be non-greedy, which means that it will match the minimum number of times possible (e.g., the shortest possible matching substring is detected, and the search operation is terminated). The compiler 802 stores the character "a" in CAM row 110(1), stores the wildcard "." in CAM row 110(2), and stores the character "b" in CAM row 110(3). The complier 802 also stores N=n in counter circuit 410, and configures the PRS in the manner depicted in FIG. 6E by loading corresponding bit groups in the programmable switches that control the selective interconnections between the CAM rows 110 and counter circuit 410.

For the example of FIG. 6F, which shows CAM array 401 configured to implement search operations for the regular expression $R_F$=a.+?b, The compiler 802 stores the character "a" in CAM row 110(1), stores the wildcard "." in CAM row 110(2), and stores the character "b" in CAM row 110(3). The complier 802 also stores N=1 in counter circuit 410, and configures the PRS in the manner depicted in FIG. 6F by loading corresponding bit groups in the programmable switches that control the selective interconnections between the CAM rows 110 and counter circuit 410. Note that the connection of the match signal from CAM row 110(3) to the RST input of counter circuit 410 terminates the search operation when the first (e.g., the shortest) match for $R_F$ is detected, thereby causing the quantifier "+" to be non-greedy.

For the example of FIG. 6G, which shows CAM array 401 configured to implement search operations for the regular expression $R_G$=a.*?b, the compiler 802 stores the character "a" in CAM row 110(1), stores the wildcard "." in CAM row 110(2), and stores the character "b" in CAM row 110(3). The complier 802 also stores N=1 in counter circuit 410, and configures the PRS in the manner depicted in FIG. 6G by loading corresponding bit groups in the programmable switches that control the selective interconnections between the CAM rows 110 and counter circuit 410. Note that the connection of the match signal output from CAM row 110(3) to the RST input of counter circuit 410 makes the quantifier * non-greedy.

For the example of FIG. 6H, which shows CAM array 401 configured to implement search operations for the regular expression $R_H$=a.+b with a minimum match length value of MML=10, the compiler 802 stores the character "a" in CAM row 110(1), stores the wildcard "." in CAM row 110(2), and stores the character "b" in CAM row 110(3). The complier 802 also stores N=9 and SEL=1 in counter circuit 410, and configures the PRS in the manner depicted in FIG. 6H by loading corresponding bit groups in the programmable switches that control the selective interconnections between the CAM rows 110 and counter circuit 410. Recall that the mode select signal SEL is set to SEL=1, and the target N=9 is stored in counter circuit 410 so that the CAM array is configured to determine whether an input string of least 10 characters matches the regular expression $R_H$=a.+b. To implement the minimum match length, the search operation should terminate after a matching input string of the specified minimum length is detected.

Thus, for some embodiments, each CAM row can include a kill logic circuit (not shown for simplicity) having a first input to receive the input match signal from the row's IMS line, a second input to receive the kill signal from the row's killer line, and an output to provide the row enable signal to the row's match line pre-charge circuit (see also FIG. 3A). Thus, for some embodiments, the kill logic circuit passes the input match signal to the match line pre-charge circuit 302 if the kill signal is not asserted and forces row enable signal to logic low (e.g., to disable the CAM row) if the kill signal is asserted.

As can be understood from the example of FIG. 6H, a bit group 809 can be defined for a CAM row (e.g., CAM row 110(2)) or for a group of CAM rows (e.g., CAM rows 110(2) through CAM row 110(4)), with each row including a programmable interconnection point with an input match line, a killer line, and an output match line. Table 7 shows an exemplary collection of compiler-generated bit groups that can be used to program the selective interconnections between the CAM rows 110 of FIG. 6H and the PRS to implement search operations for the regular expression $R_H$="a.+b". Note that the bit locations for PRS state lines S7 and S8 are not shown in Table 7 for simplicity.

TABLE 7

| CAM Row | Line | S0 | S1 | S2 | S3 | S4 | S5 | S6 | Bit Group |
|---|---|---|---|---|---|---|---|---|---|
| 110(1) | IMS | No | No | No | No | No | No | No | '0000000' |
| 110(1) | OMS | Yes | No | No | No | No | No | No | '1000000' |
| 110(2) | IMS | Yes | Yes | No | No | No | No | No | '1100000' |
| 110(2) | Killer | No | No | No | No | Yes | No | No | '0000100' |
| 110(2) | OML | No | Yes | Yes | No | No | No | No | '0110000' |
| 110(3) | IMS | No | Yes | No | No | No | No | No | '0100000' |
| 110(3) | Killer | No | No | No | No | Yes | No | No | '0000100' |
| 110(3) | OML | No | No | Yes | Yes | No | No | No | '0011000' |
| 110(4) | IMS | No | No | No | No | No | No | No | '0000000' |
| 110(4) | OML | No | No | No | No | No | No | No | '0000000' |

As described above, there are many types and forms of regular expressions. For purposes of discussion herein, regular expressions are classified into four types or levels according to their complexity. Regular expressions that include only strings and logical operators, and that do not include any quantifiers, are classified as type-I or complexity level-I regular expressions. Regular expressions that include logical operators and specify a greedy quantifier (e.g., "*", "+", or "?"), or a possessive quantifier expression (e.g., "*+", "++", "?+"), or a quantified number {m} of characters of a character class that does not overlap a preceding prefix string are classified as type-II or complexity level-II regular expressions. Regular expressions that include logical operators and specify a quantified number {m} of characters of a character class that overlaps a preceding prefix string are classified as type-III or complexity level-III regular expressions. Regular expressions that include logical operators and specify a quantifier in the form of a quantified range {m,n} of characters of a character class that may overlap a preceding prefix string are classified as type-IV or complexity level-IV regular expressions.

For example, the regular expressions REG1="ab(cd|ef|gh)uv" and REG4="abcde" are complexity level-I regular expressions because REG1 and REG4 include only logical operators (e.g., they do not include quantifier values {m} or {m,n}). The regular expression REG5="(b|k)[a]{3}c" is a complexity level-II regular expression because REG5 includes the quantifier {3} and the quantified character class [a] does not overlap or include the same characters as the preceding prefix string "b|k". The regular expression REG6="ab+([a-z]){4}xy" is a complexity level-III regular expression because REG6 includes the quantifier {4} and the quantified character class [a-z] overlaps the preceding prefix string "ab+". The regular expression REG7="ab+([a-z]){2,4}xy" is a complexity level-IV regular expression because REG7 includes a quantified range {2,4}.

Of course, a regular expression REG8 may be a compound regular expression comprised of multiple constituent regular expressions, each of the same (or different) levels, for example, REG8=REG7+REG6, where REG7 is a level-IV regular expression, and REG6 is a level-III regular expression. In such a case, compiler 802 can deconstruct the compound regular expression and perform optimization operations separately on each multiple constituent regular expressions so as to respect constraints of the target CAM devices 100.

Complexity level-I regular expressions can be stored in and searched for using embodiments of CAM device 100 that include the programmable interconnect structure (PRS) without the use of any of the sequencing logic circuits. Complexity level-II regular expressions can be stored in and searched for using embodiments of CAM device 100 that include counter circuits 710, which as described above can be used to count the number of sequential characters of an input string that match a specified character class. Complexity level-III regular expressions can be stored in and searched for using embodiments of CAM device 100 that include counter circuits capable of simultaneously maintaining multiple counts of the number of sequential characters of an input string that match a specified character class (e.g., counter circuits such as counter circuit 410 of FIG. 5A). Complexity level-IV regular expressions can be stored in and searched for using embodiments of CAM device 100 that include counter circuits capable of determining whether an input string includes a range of sequences of characters that match a specified character class (e.g., shift-register circuit 910 of FIG. 9C).

Thus, in accordance with yet another embodiment, a single integrated circuit device is disclosed that can implement search operations for regular expressions using a plurality of different CAM-based search engines, wherein each CAM-based search engine is dedicated or optimized to store and implement search operations for regular expressions of a corresponding complexity level. In this manner, the resources of each of the search engines can be optimized so that the resources are fully used, rather than idle. For example, because search operations for complexity level-I regular expressions can be performed using embodiments of CAM device 100 that do not include sequencing logic circuits, complexity level-I regular expressions are stored in a search engine implemented using embodiments of CAM arrays 101 that do not include any embodiment of sequencing logic circuits such as counter circuit 410. Thus, although embodiments of the CAM array that include counters can store and implement search operations for complexity level-I regular expressions, the counter circuits would not be used during such search operations, and would therefore result in a less than optimum use of circuit area.

Figure 10A:
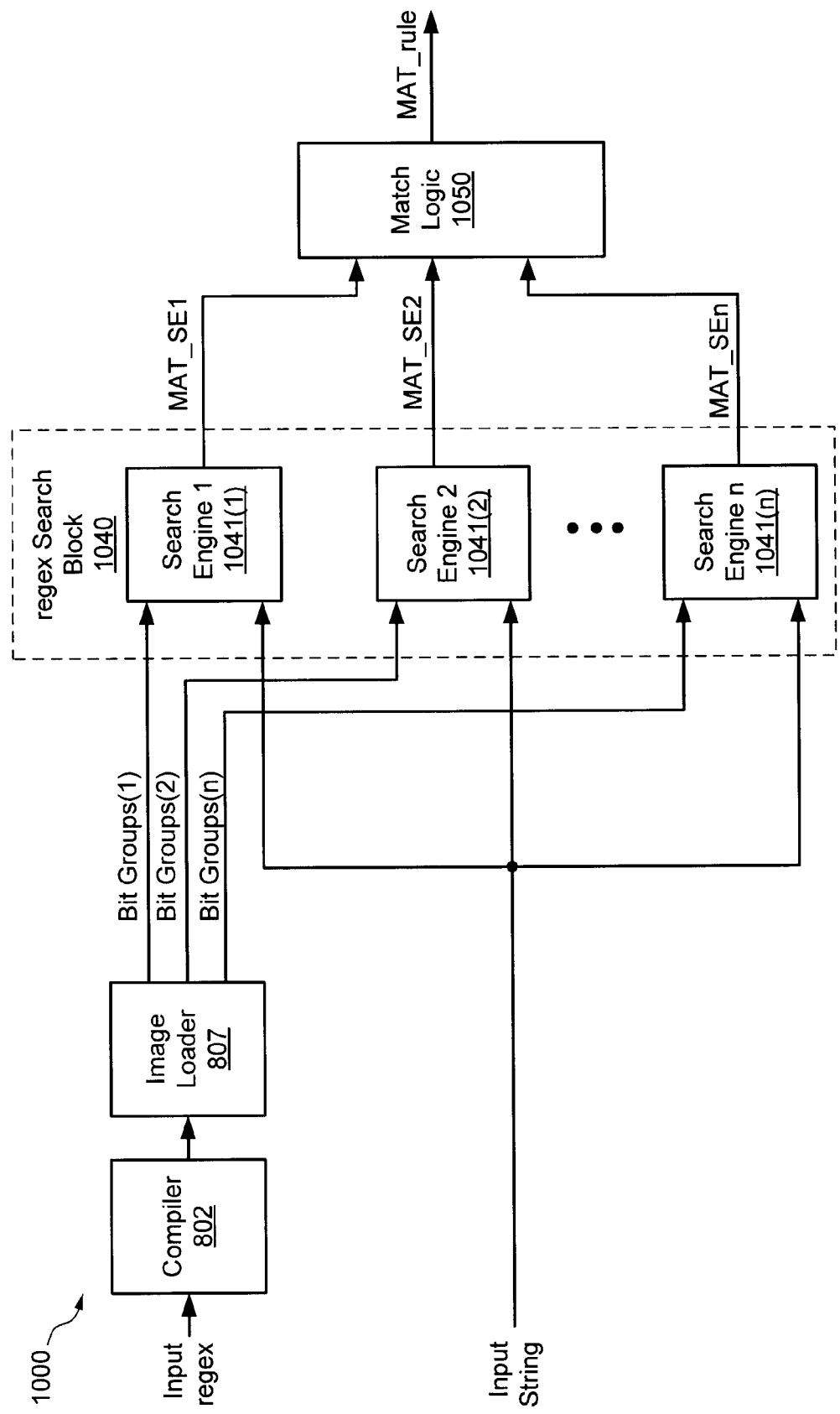
FIG. 10A shows an integrated CAM-based search system that can store and implement search operations for various types or complexity levels of regular expressions in accordance with some embodiments.

For example, FIG. 10A shows an integrated CAM-based search system 1000 that can store and implement search operations for various types or complexity levels of regular expressions. In accordance with some embodiments of the present invention, search system 1000 includes compiler 802, image loader 807, a regular expression search block 1040, and match signal logic 1050.

Regular expression search block 1040 includes a plurality of search engines 1041(1)-1041(n), each of which is configured to store one or more regular expressions of a particular type or complexity level. Each search engine 1041 includes first inputs to receive one or more regular expressions to be stored therein, second inputs to receive input strings to be compared with the regular expressions stored therein, and outputs to generate string search match signals (MAT_SE). For some embodiments, a first search engine 1041(1) is configured to store and implement search operations for complexity level-I regular expressions (e.g., REG1="ab(cd|ef|gh|)uv" and REG2="ab(c|d)"), a second search engine 1041(2) is configured to store and implement search operations for complexity level-II regular expressions (e.g., REG5="(b|k)[a]{3}c"), a third search engine 1041(3) is configured to store and implement search operations for complexity level-III regular expressions (e.g., REG6="ab+([a-z]){4}xy"), and a fourth search engine 1041(4) is configured to store and implement search operations for complexity level-IV regular expressions (e.g., REG7="ab+([a-z]){2,4}xy"). Further, for one embodiment, the search system 1000 can also include a fifth search engine 1041(5) that is configured to perform only exact string matches.

Figure 10B:
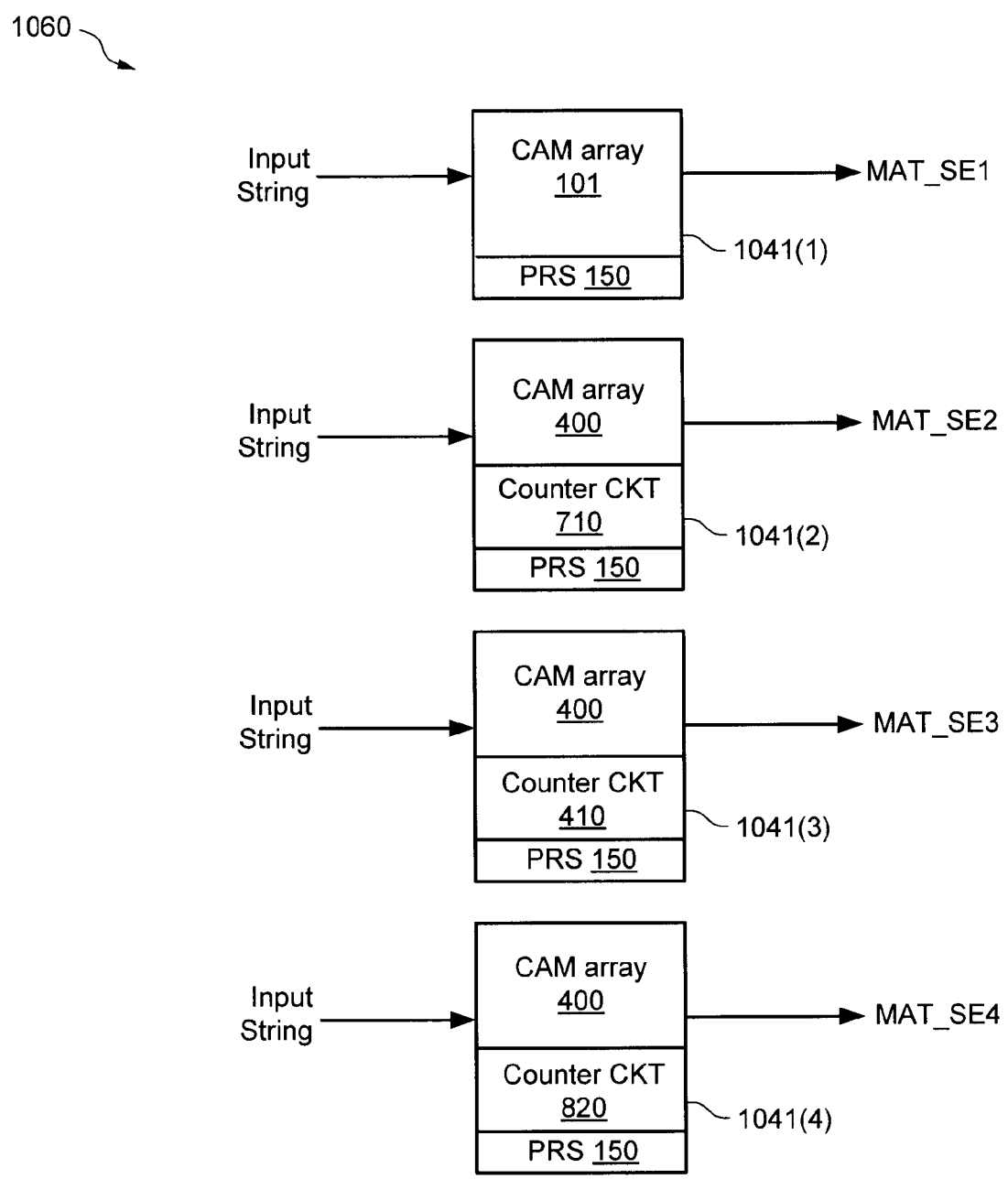
FIG. 10B shows a regular expression search block in accordance with some embodiments.

FIG. 10B shows a regular expression search block 1060 that is one embodiment of search block 1040 of FIG. 10A. For the regular expression search block 1060, the first search engine 1041(1) employs an embodiment of CAM array 101 having the PRS 150 in accordance with present embodiments, and is dedicated to store and implement search operations for complexity level-I regular expressions. The CAM array 101 of search engine 1041(1) does not include any counter circuits or shift registers, and therefore consumes a minimal amount of circuit area and power. Thus, for example, regular expressions such as REG1="ab(cd|ef|gh|)uv" and REG2="ab(c|d)" can be stored and searched in CAM array 101 of search engine 1041(1).

The second search engine 1041(2) employs an embodiment of CAM array 400 having the PRS 150 and counter circuits 710 in accordance with present embodiments, and is dedicated to store and implement search operations for complexity level-II regular expressions. Because CAM array 400 of search engine 1041(2) includes one or more counter circuits 710, search engine 1041(2) can be dedicated to store and implement search operations for complexity level-II regular expressions such as REG5="(b|k)[a]{3}c". Thus, although search engine 1041(2) is larger and more complex than search engine 1041(1), the inclusion of counter circuits 710 within search engine 1041(2) allows search engine 1041(2) to store and implement search operations for complexity level-II regular expressions, which are more complex than complexity level-I regular expressions. Further, although search engine 1041(2) can store and implement search operations for complexity level-I regular expressions, the counter circuit 710 would not be used during such search operations, and therefore would not result in an optimal use of resources.

The third search engine 1041(3) employs an embodiment of CAM array 400 having the PRS 150 and counter circuits 410 in accordance with present embodiments, and is dedicated to store and implement search operations for complexity level-III regular expressions. Because CAM array 400 of search engine 1041(3) includes one or more counter circuits 410, search engine 1041(3) can be dedicated to store and implement search operations for complexity level-III regular expressions such as REG6="ab+([a-z]){4}xy". Thus, although search engine 1041(3) is larger and more complex than search engines 1041(1)-1041(2), the inclusion of counter circuits 410 within search engine 1041(3) allows search engine 1041(3) to store and implement search operations for complexity level-III regular expressions, which are more complex than complexity level-II regular expressions. Note that complexity level-III regular expressions cannot be stored in search engine 1041(1) or 1041(2) because embodiments of counter circuit 410 are required to implement search operations for complexity level-III regular expressions, which have a quantified character class that overlaps the preceding prefix string. Further, although search engine 1041(3) can store and implement search operations for complexity level-II regular expressions, the counter circuit 410 is larger and more complex than counter circuit 710, which is sufficient for searching complexity level-II regular expressions.

The fourth search engine 1041(4) employs an embodiment of CAM array 400 having the PRS 150 and counter circuit 820 disclosed in commonly owned U.S. Pat. No. 7,643,353 in accordance with present embodiments, and is dedicated to store and implement search operations for complexity level-IV regular expressions. Because CAM array 400 of search engine 1041(4) includes one or more counter circuits 820, search engine 1041(4) can be dedicated to store and implement search operations for complexity level-IV regular expressions such as REG7="ab+([a-z]){2,4}xy". Thus, although search engine 1041(4) is larger and more complex than search engines 1041(1)-1041(3), the inclusion of counter circuits 820 within search engine 1041(4) allows search engine 1041(4) to store and implement search operations for complexity level-IV regular expressions, which are more complex than complexity level-III regular expressions, complexity level-II regular expressions, and complexity level-I regular expressions. Note that complexity level-IV regular expressions cannot be stored in search engines 1041(1) or 1041(2) or 1041(3) because embodiments of counter circuit 820 are required to implement search operations for complexity level-IV regular expressions, which have a quantified range {m,n} of characters of a specified character class. Further, although search engine 1041(4) can store and implement search operations for regular expressions of lower complexity levels, its resources would not be fully utilized.

Further, although not shown for simplicity, for some embodiments, the regular expression search block 1060 can also include a fifth search engine 1041(5) that is configured to perform only string matches. For such embodiments, the fifth search engine 1041(5) can employ a conventional CAM device (e.g., that does not include the PRS 150), thereby minimizing circuit area and power consumption.

Referring again to FIG. 10A, compiler 802 includes an input to receive regular expressions to be compiled into bit groups 809 that are then loaded into the search block 1040. As shown, the image loader 807 has dedicated outputs for separating streams of bit groups, where each stream (e.g., bit group(1), bit group(2), etc) is connected to each of the search engines 1041(1)-1041(n). In accordance with present embodiments, compiler 802 and the image loader 807 examine each input regular expression and/or an intermediate representation of an input regular expression to determine the type (e.g., the complexity level) of the regular expression, and determines which of search engines 1041 can most efficiently store and implement search operations for each regular expression, and in response thereto, forwards compiler output to the image loader 807, which in turn loads into the search engine 1041 that is configured (e.g., dedicated) to store and implement search operations for regular expressions of the same type or complexity level. In addition, the image loader 807 has dedicated outputs for separating streams of bit groups, the streams organized to load bit groups into search engines having differing capabilities. For example, for the exemplary embodiment of FIG. 10B, image loader 807 forwards complexity level-I regular expressions (e.g., that include only strings and logical operators) to first search engine 1041(1), forwards complexity level-II regular expressions (e.g., that include only strings, logical operators, and character classes that do not overlap with the prefix string) to second search engine 1041(2), forwards complexity level-III regular expressions (e.g., that include only strings, logical operators, and character classes that overlap with the prefix string) to third search engine 1041(3), and forwards complexity level-IV regular expressions (e.g., that include strings, logical operators, and character classes having any quantifier value or ranges that can overlap with the R1 prefix string) to fourth search engine 1041(4).

During search operations, the input string is provided to the search engines 1041 (e.g., via stored bit groups), and each search engine 1041 searches the input string for the regular expressions stored therein, and outputs the match signals (MAT_SE) to match signal logic 1050. In response thereto, match signal logic 1050 combines the match information provided by the search engines 1041 to generate match results for the corresponding rule (MAT_rule).

Figure 12:
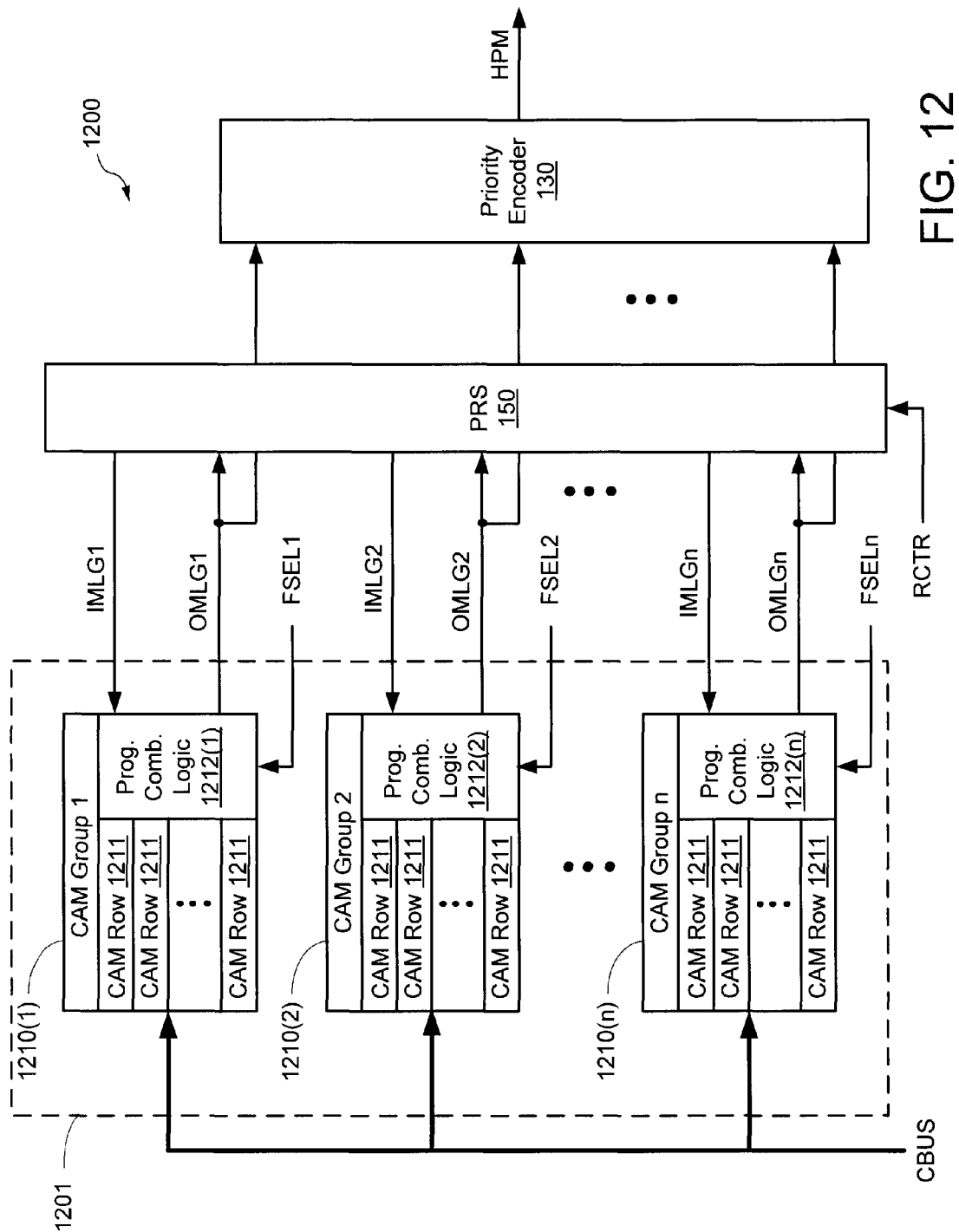
FIG. 12 shows a simplified block diagram of a CAM device having a plurality of independently configurable CAM blocks and the PRS in accordance with other embodiments.

FIG. 12 shows a CAM device 1200 configured to store regular expressions of various complexities. As described above with respect to FIGS. 1-3, 4A-4B, and 5A-5B, each CAM row 110 generates a match signal on ML that can be selectively provided to priority encoder 130 and/or selectively provided as an input match signal to any number of arbitrarily selected CAM rows at the same time via PRS 150. In this manner, the CAM rows 110 can be selectively connected together in a chain having any number of parallel branches and connected to various embodiments of sequencing logic circuit 405 and/or counter circuits 410 via PRS 150 in a manner that allows embodiments of the CAM device described above with to store and implement search operations for regular expressions of various complexities in a more efficient manner (e.g., using fewer numbers of CAM rows) than conventional CAM devices that do not employ a programmable interconnect structure in accordance with present embodiments. However, because the signal routing resources of the PRS 150 are limited (e.g., each signal line of the PRS 150 consumes valuable silicon area and also requires dedicated switching circuitry to connect the signal line to various numbers of CAM rows in the array), relying upon the PRS 150 to interconnect all the CAM rows in the array can undesirably limit the number of possible configurations of the CAM array, and therefore also undesirably limit the number of regular expressions stored therein.

Therefore, CAM device 1200 is shown as including a CAM array 1201 having a plurality of independently configurable CAM groups 1210(1)-1210(n), with each CAM group 1210 including a number of CAM rows 1211 and a programmable combinational logic circuit 1212. The group's CAM rows 1211 can be selectively cascaded to each other using local routing lines and associated cascade enable circuits (not shown in FIG. 12 for simplicity) provided within the group, and the programmable combinational logic circuit 1212 can logically combine the match signals of its associated CAM rows 1211 to generate a group output match signal OMLG according to a selected one of a plurality of logical expressions, where each logical expression can include any combination of logic AND, logic OR, and/or logic NOT functions. Thus, each CAM group 1210 can be configured to store a corresponding one of a plurality of sub-expressions of a regular expression without using the resources of the PRS 150, and the CAM groups 1210 can be selectively interconnected by the PRS 150 in response to routing control signals (RCTR) that embody the logical relationships between the sub-expressions of the regular expression. In this manner, embodiments of CAM device 1200 can store and implement search operations for regular expressions using less resources of the PRS 150 than embodiments described above with respect to FIGS. 1-2. Referring also to FIGS. 8A-8B, compiler 802 can invoke a module to convert regular expressions into bitmaps 805 using compiler architecture database 806, which in turn can include characteristics of the CAM device 1200 depicted in FIG. 12. Moreover, one or more compiler operations can convert a requirement into regular expressions that can be decomposed into multiple sub-expressions for selective storage in various CAM groups 1210.

For example, the regular expression REG9="acid (rain|trip)" can be represented as three sub-expressions SXP1="acid", SXP2="rain", and SXP3="trip", where the result of the logic OR function of "rain" and "trip" is logically combined with "acid" using the logic AND function. Thus, assuming each CAM row 1211 stores a binary encoded representation of a single alphanumeric character (e.g., such as the well-known ASCII-encoded characters), a first CAM group 1210(1) including four locally interconnected CAM rows 1211 can be configured to store SXP1="acid", a second CAM group 1210(2) including four locally interconnected CAM rows 1211 can be configured to store SXP2="rain", a third CAM group 1210(3) including four locally interconnected CAM rows 1211 can be configured to store SXP3="trip", and the PRS 150 can be configured to route the group match signal from the first CAM group 1210(1) as the input match signal to the second and third CAM groups 1210(2)-1210(3) simultaneously so that a prefix match with "acid" in the first CAM group 1210(1) can trigger simultaneous searches for "rain" and "trip" in the second and third CAM groups 1210(2)-1210(3), respectively. In this manner, the regular expression REG9="acid(rain|trip)" can be stored in CAM device 1200 using only one signal routing line of the PRS 150 that provides the match signal of "acid" as a trigger signal to "rain" and "trip". In contrast, to store REG9 in the embodiments described above with respect to FIGS. 1-2, three PRS signal lines are required to interconnect the CAM rows storing the string "acid", three PRS signal lines of the PRS 150 are required to interconnect the CAM rows storing the string "rain", three PRS signal lines of the PRS 150 are required to interconnect the CAM rows storing the string "trip", and one PRS signal line of the PRS 150 is required to connect the match signal of "acid" as the input match signal to the first row storing "rain" and to the first row storing "trip", thereby requiring a total of 3+3+3+1=10 signal routing lines of the PRS 150.

More specifically, CAM device 1200 includes a CAM array 1201, PRS 150, and priority encoder 130. CAM array 1201 includes a plurality of CAM groups 1210(1)-1210(n), each having a data input to receive a search key from the comparand bus CBUS, a match input coupled to the PRS 150 via a group input match line IMLG, a match output coupled to PRS 150 and to priority encoder 130 via a group output match line OMLG, and a control input to receive a corresponding function select signal FSEL. For simplicity, other components of CAM device 1200, such as instruction decoder 120, read/write circuit 125, and configuration circuit 160 described above with respect to FIG. 1 are not shown in FIG. 12.

Each CAM group 1210 includes a plurality of CAM rows 1211 and a programmable combinational logic (PCL) circuit 1212. Each CAM row 1211 includes a plurality of CAM cells (not shown in FIG. 12) for storing a data word (e.g., such as a binary encoded character), and provides a row match signal to PCL circuit 1212 during compare operations between the search key and data stored in the CAM rows. In response to the corresponding function select signal FSEL, PCL circuit 1212 selects one of a plurality of logical expressions to employ to logically combine the row match signals to generate the corresponding group match signal, wherein the plurality of selectable logical expressions can include a combination of logic AND functions, logic OR functions, and/or logic NOT functions performed on the row match signals. In this manner, each CAM block can store virtually any simple sub-expression (e.g., regular expressions including logical operators but no quantified character classes). The group match signals generated locally within the CAM groups 1210(1)-1210(n) are provided on corresponding group output match lines OMLG1-OMLGn, respectively.

The PRS 150 includes inputs to receive the group match signals, and in response to the routing control signal, RCTR selectively routes the group match signal from each CAM group 1210 as an input match signal to any number of other arbitrarily selected CAM groups 1210(1)-1210(n) via group input match lines IMLG1-IMLGn, respectively. The architecture and operation of PRS 150 is described above with respect to the embodiments of FIGS. 1-2, and thus its description is not repeated again. The input match signal provided to each CAM group 1210 can participate in the generation of the group match signal for the CAM group. For some embodiments, the group output match signal generated by one CAM group 1210 in a previous compare operation can be used as the input match signal to selectively enable one or more CAM rows 1211 of other CAM groups 1210 to participate in a next compare operation.

Priority encoder 130 includes inputs to receive the group match signals from CAM groups 1210(1)-1210(n), and in response thereto generates the index of the highest priority matching (HPM) CAM group 1210. Although not shown in FIG. 12 for simplicity, for some embodiments, the PCL circuit 1212 provided within each CAM group 1210 can include gating logic that selectively provides the group match signal to priority encoder 130. For example, if the strings stored in CAM groups 1210(1) and 1210(2) are logically connected together in a cascaded chain by PRS 150 to implement a logic AND function of the two strings, then the PCL circuit 1212(1) of CAM group 1210(1) can prevent its group match signal from being provided to priority encoder 130, while the PCL circuit 1212(2) of CAM group 1210(2) can allow its group match signal to be provided to priority encoder 130 to participate in the generation of the HPM index.

Although not shown in FIG. 12 for simplicity, CAM device 1200 can include any number of the various embodiments of the sequencing logic circuits 405 and/or counter circuits 410 described above, for example, to store quantified character classes, and other quantifiers, including greedy quantifiers.

Figure 13:
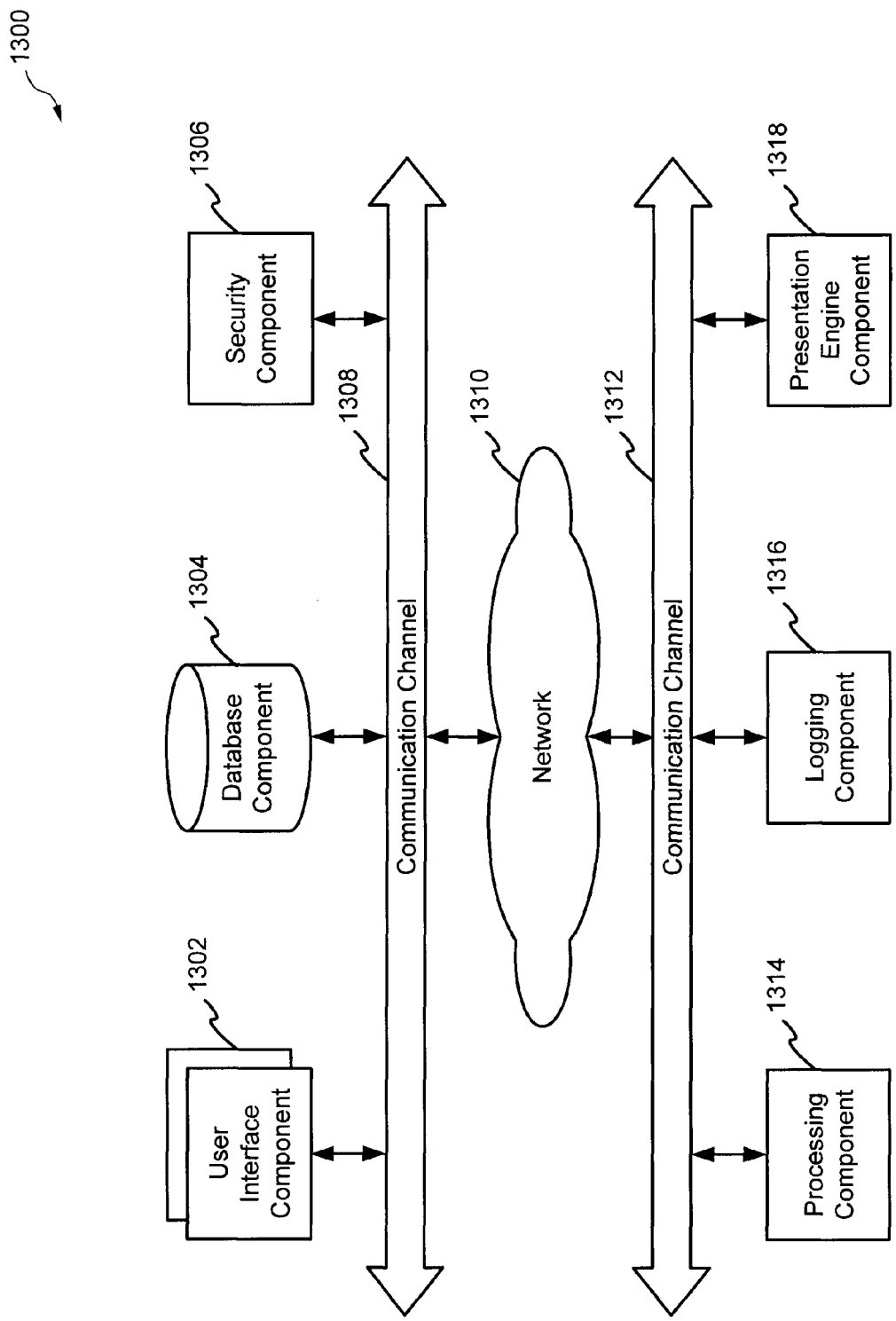
FIG. 13 depicts a possible mapping of a system for compiling a regular expression into bit groups for controlling programmable TCAM structures.

FIG. 13 depicts a system 1300 for compiling a regular expression into bit groups that can be loaded into and used to configure a search engine (e.g., CAM device 100) to implement search operations for the regular expression. System 1300 includes a user interface component 1302, a database component 1304, and a security component 1306, which are in communication with each other another via a first communication channel 1308. System 1300 also includes a processing component 1314, a logging component 1316, and a presentation engine component 1318, which are in communication with each other via a second communication channel 1312. In some embodiments, a network cloud 1310 can provide communications between the first communication channel 1308 and the second communication channel 1312 (e.g., through any number of sub-networks within the cloud. Also, in some embodiments, the first communication channel 1308 may be the same, or otherwise indistinguishable, from the second communication channel 1312. The user interface component 1302 can operate on a computer in communication with any other component via the network. In exemplary embodiments, there may be more than one instance of a user interface component 1302, and in some embodiments, one instance of a user interface component 1302 may share some or no similarities to other numbers of user interface components 1302.

Thus, in one embodiment, modules of system 1300 can be used to compile a source regular expression into bit groups for controlling the programmable structures within search engines such as CAM device 100, and can include a module for parsing the source regular expression (e.g. processing component 1314), a module for compiling the source regular expression into an architecture-dependent regular expression for storing (e.g. into database component 1304), and a module for converting the architecture-dependent regular expression into a plurality of bit groups including representation of at least one greedy quantifier (e.g. processing component 1314).

Figure 14:
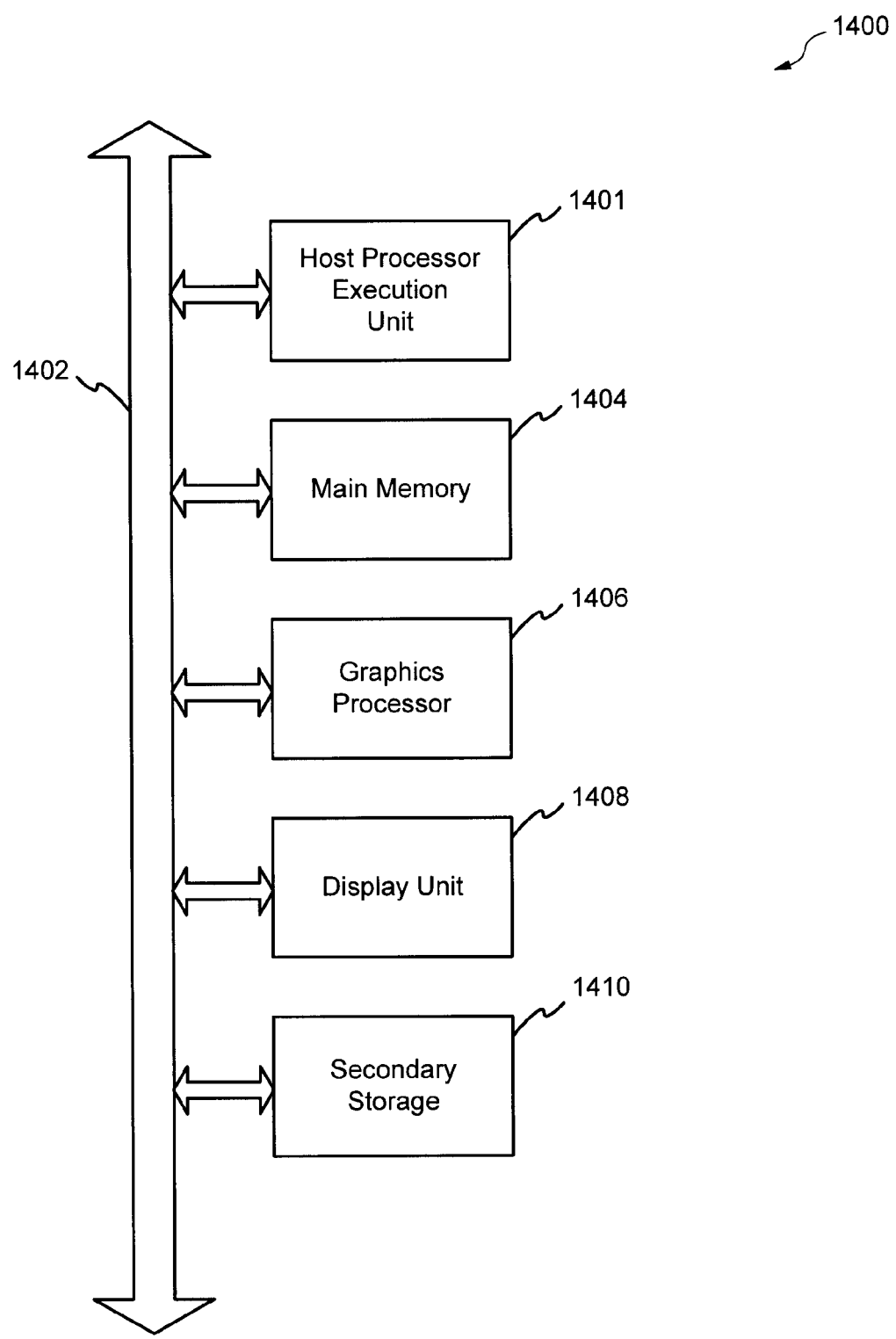
FIG. 14 illustrates an exemplary system in which the architecture and/or functionality of the various previous embodiments may be implemented.

FIG. 14 illustrates an exemplary system 1401 in which the architecture and/or functionality of the various previous embodiments may be implemented. As shown, a system 1401 is provided including at least one host processor execution unit 1401, which is connected to a communication bus 1402. The system 1401 also includes a main memory 1404 wherein control logic (software) and data are stored and which may take the form of random access memory (RAM). The system 1401 also includes a graphics processor 1406 and a display unit 1408 (e.g., a computer monitor). The system 1401 may also include a secondary storage 1410. The secondary storage 1410 includes, for example, a hard disk drive and/or a removable storage drive, representing a floppy disk drive, a magnetic tape drive, a compact disk drive, or other tangible computer-readable medium for storing non-transient computer-readable code.

Computer programs, or computer control logic algorithms, can be stored in the main memory 1404 and/or the secondary storage 1410. Such computer programs, when executed, enable the system 1401 to perform various functions. Memory 1404, storage 1410, and/or any other storage are possible examples of tangible computer-readable media for storing non-transient computer-readable code.

In one embodiment, the architecture and/or functionality of the various previous figures may be implemented in the context of the host processor execution unit 1401, the graphics processor 1406, an integrated circuit (not shown) that is capable of at least a portion of the capabilities of both the host processor execution unit 1401, and the graphics processor 1406.

Further, while not shown, the system 1401 may be coupled to a network (e.g. a telecommunications network, local area network, wireless network, wide area network (WAN) such as the Internet, peer-to-peer network, cable network, etc) for communication purposes.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention. For example, although the PRS 150 is described above as being programmed with configuration data, for other embodiments, the PRS 150 can be fused or hardwired to implement a number of regular expressions, and each rule can be mapped to different portion of the CAM array.

What is claimed is:

1. A content search system comprising:
    a content addressable memory (CAM) device having a plurality of rows of CAM cells and a number of counter circuits selectively interconnected by a programmable interconnect structure (PRS) and configured to implement search operations for a regular expression;
    a compiler having an input to receive the regular expression and configured to selectively convert the regular expression into a number of first bit groups, a number of second bit groups, and a number of third bit groups; and
    an image loader coupled to the compiler and to the CAM device, the image loader configured to load the first bit groups into the CAM cells, to load the second bit groups into a number of memory elements that control configuration of the PRS, and to load the third bit groups into the counter circuits.

2. The search system of claim 1, wherein the first bit groups embody a number of characters of the regular expression, the second bit groups embody a number of metacharacters of the regular expression, and the third bit groups embody a number of quantifiers of the regular expression.

3. The search system of claim 2, wherein a portion of one of the first bit groups configures the PRS to selectively route match results from a first CAM row as an input match signal to any number of other arbitrarily selected CAM rows at the same time.

4. The search system of claim 2, wherein a portion of one of the third bit groups configures the counter circuit to identify only matching portions of an input string that have at least a specified minimum number of characters.

5. The search system of claim 2, wherein a portion of one of the third bit groups configures the counter circuit to identify all matching portions of an input string.

6. The search system of claim 2, wherein a portion of one of the third bit groups configures the counter circuit to count a match length of a matching substring.

7. The search system of claim 2, wherein the metacharacter comprises a logical OR operator.

8. The search system of claim 2, wherein the third bit groups comprise at least one greedy quantifier.

9. The search system of claim 2, wherein one of the quantifiers comprises a Kleene star.

10. The search system of claim 2, wherein one of the quantifiers comprises a '+' operator.

11. The search system of claim 2, wherein one of the quantifiers comprises a character.

12. The search system of claim 2, wherein one of the quantifiers comprises a "{n,}" interval expression.

13. The search system of claim 2, wherein one of the quantifiers comprises a "{n}" interval expression.

14. The search system of claim 2, wherein one of the quantifiers comprises a "{n,m}" interval expression.

15. The search system of claim 1, further comprising:
    a placement module coupled to the compiler and configured to store information indicating which of the counter circuits, CAM rows, and memory elements of the PRS are available for receiving corresponding bit groups.

16. The search system of claim 1, wherein one of the counter circuits includes inputs to receive an active signal, an increment signal, and a reset signal from one or more of the CAM rows, includes a first output to generate a first output signal indicating whether a count value $CNT \geq N$, and includes a second output to generate a second output signal whether $0<CNT<N$, wherein N is a quantifier specified by the regular expression.

17. The search system of claim 16, wherein the active signal, the increment signal, and the reset signal are generated during a first compare operation in the CAM device, and the first and second output signals selectively enable one or more of the CAM rows for a next compare operation.

18. The search system of claim 1, wherein the compiler transforms regular expression into an architecture-dependent regular expression characterized by a determination of the available resources of the CAM device.

19. A method for programming a content addressable memory (CAM) device having a plurality of rows of CAM cells and a number of counter circuits selectively interconnected by a programmable interconnect structure (PRS) to implement search operations for a regular expression, the method comprising:
    compiling the regular expression into a number of first bit groups, a number of second bit groups, and a number of third bit groups;
    loading the first bit groups into the CAM cells using an image loader;
    loading the second bit groups into a number of memory elements that control configuration of the PRS using the image loader; and loading the third bit groups into the counter circuits using the image loader.

20. The method of claim 19, wherein the first bit groups embody a number of characters of the regular expression, the second bit groups embody a number of metacharacters of the regular expression, and the third bit groups embody a number of quantifiers of the regular expression.

21. The method of claim 20, wherein the metacharacter comprises a logical OR operator.

22. The method of claim 20, wherein a portion of one of the first bit groups configures the PRS to selectively route match results from a first CAM row as an input match signal to any number of other arbitrarily selected CAM rows at the same time.

23. The method of claim 20, wherein a portion of one of the third bit groups configures the counter circuit to identify only matching portions of an input string that have at least a specified minimum number of characters.

24. The method of claim 20, wherein a portion of one of the third bit groups configures the counter circuit to identify all matching portions of an input string.

25. The method of claim 20, wherein a portion of one of the third bit groups configures the counter circuit to count a match length of a matching substring.

26. The method of claim 19, further comprising:
    determining which of the counter circuits, CAM rows, and memory elements of the PRS are available for receiving corresponding bit groups.

27. The method of claim 26, further comprising:
    selectively altering the compiling in response to the determining.

28. The method of claim 19, wherein compiling the regular expression comprises a reroll operation.

29. The method of claim 19, wherein compiling the regular expression comprises a mid-level alternation split.

30. The method of claim 19, wherein compiling the regular expression comprises a top-level alternation split.

* * * * *